(12) United States Patent
Yamazaki et al.

(10) Patent No.: US 9,496,376 B2
(45) Date of Patent: Nov. 15, 2016

(54) METHOD FOR MANUFACTURING SEMICONDUCTOR DEVICE

(71) Applicant: Semiconductor Energy Laboratory Co., Ltd., Kanagawa-ken (JP)

(72) Inventors: Shunpei Yamazaki, Tokyo (JP);
Tetsuhiro Tanaka, Kanagawa (JP);
Sachiaki Tezuka, Kanagawa (JP);
Mitsuhiro Ichijo, Kanagawa (JP);
Noriyoshi Suzuki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/854,789

(22) Filed: Sep. 15, 2015

(65) Prior Publication Data

US 2016/0087085 A1   Mar. 24, 2016

(30) Foreign Application Priority Data

Sep. 19, 2014   (JP) .................................. 2014-191293

(51) Int. Cl.
*H01L 29/66* (2006.01)
*H01L 29/786* (2006.01)
(Continued)

(52) U.S. Cl.
CPC ......... *H01L 29/66969* (2013.01); *H01L 21/06* (2013.01); *H01L 21/16* (2013.01); *H01L 29/24* (2013.01); *H01L 29/7869* (2013.01); *H01L 27/1156* (2013.01)

(58) Field of Classification Search
CPC .................... H01L 29/7869; H01L 29/78696; H01L 21/06; H01L 21/16; H01L 21/02554; H01L 27/1225

USPC ........................................... 438/104; 257/43
See application file for complete search history.

(56) References Cited

U.S. PATENT DOCUMENTS 5,528,032 A   6/1996   Uchiyama
5,731,856 A   3/1998   Kim et al.
(Continued)

FOREIGN PATENT DOCUMENTS

EP   1737044 A   12/2006
EP   2226847 A   9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Karen Kusumakar
(74) *Attorney, Agent, or Firm* — Husch Blackwell LLP

(57) ABSTRACT

To provide a semiconductor device with improved reliability. To provide a semiconductor device with stable characteristics. To provide a transistor having a low off-state current. To provide a transistor having a high on-state current. To provide a novel semiconductor device, a novel electronic device, or the like. A method for manufacturing the semiconductor device includes the steps of forming a first semiconductor over a substrate; forming a second semiconductor over and in contact with the first semiconductor; forming a first layer over the second semiconductor; performing oxygen plasma treatment and then removing the first layer to expose at least part of a surface of the second semiconductor; forming a third semiconductor over and in contact with the second semiconductor; forming a first insulator over and in contact with the third semiconductor; and forming a first conductor over the first insulator.

15 Claims, 55 Drawing Sheets

(51) Int. Cl.
  *H01L 21/16* (2006.01)
  *H01L 21/06* (2006.01)
  *H01L 29/24* (2006.01)
  *H01L 27/115* (2006.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0051940 | A1 | 3/2010 | Yamazaki et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0269266 | A1* | 11/2011 | Yamazaki ......... H01L 21/02554 438/104 |
| 2012/0138922 | A1 | 6/2012 | Yamazaki et al. |
| 2013/0140553 | A1 | 6/2013 | Yamazaki et al. |
| 2013/0196468 | A1* | 8/2013 | Yamazaki ......... H01L 29/66742 438/104 |
| 2013/0270549 | A1 | 10/2013 | Okazaki et al. |
| 2014/0154837 | A1 | 6/2014 | Yamazaki |
| 2015/0249157 | A1 | 9/2015 | Yamazaki et al. |
| 2015/0340505 | A1 | 11/2015 | Yamazaki et al. |
| 2015/0372023 | A1 | 12/2015 | Jintyou et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-080947 A | 4/2010 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID

(56) References Cited

OTHER PUBLICATIONS

International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Display", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno,K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Nonaka, Y. et al., "Investigation of Defects in In—Ga—Zn Oxide Thin Film Using Electron Spin Resonance Signals," Journal of Applied Physics, Apr. 1, 2014, vol. 115, pp. 163707-1-163707-5.

* cited by examiner

FIG. 42A1
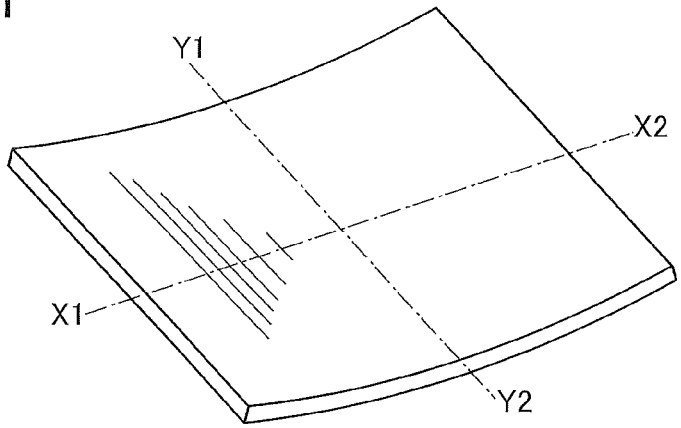
FIG. 42A2
FIG. 42A3
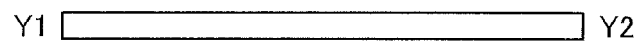
FIG. 42B1
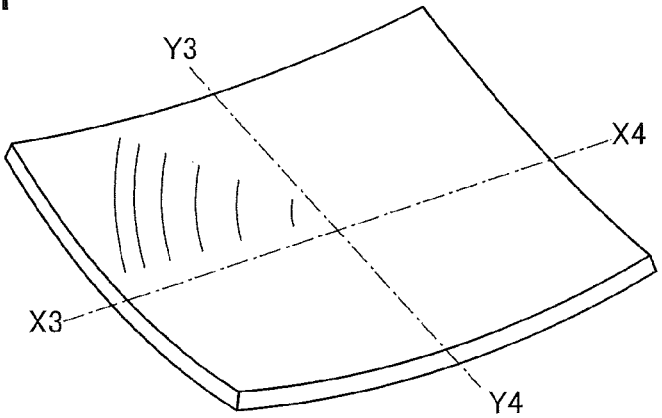
FIG. 42B2
FIG. 42B3

METHOD FOR MANUFACTURING SEMICONDUCTOR DEVICE

BACKGROUND OF THE INVENTION

1. Field of the Invention

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, an imaging device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

In recent years, attention has been drawn to a technique in which, instead of a silicon semiconductor, a metal oxide exhibiting semiconductor characteristics is used in transistors.

In Patent Document 1, a transistor including an oxide semiconductor is described. Patent Document 1 discloses a technical idea in which oxygen is added to an oxide semiconductor or a film in contact with the oxide semiconductor by oxygen plasma or the like, and by supplying oxygen to the oxide semiconductor, transistor characteristics are improved.

Non-Patent Document 1 indicates that a main factor of absorption observed in a region where the g-factor is in the vicinity of 1.93 in an ESR spectrum is carriers generated by trap of hydrogen in oxygen vacancies in an oxide semiconductor.

REFERENCE

Patent Document

[Patent Document 1] Japanese Published Patent Application No. 2010-080947

Non-Patent Document

[Non-Patent Document 1] Yusuke Nonaka et. al., "Investigation of defects in In—Ga—Zn oxide thin film using electron spin resonance signals", *JOURNAL OF APPLIED PHYSICS*, 2014, 115, pp. 163707-1-163707-5

SUMMARY OF THE INVENTION

An object of one embodiment of the present invention is to provide a semiconductor device with high reliability. Another object of one embodiment of the present invention is to provide a semiconductor device with stable characteristics.

Another object of one embodiment of the present invention is to reduce oxygen vacancies in an oxide semiconductor. Another object of one embodiment of the present invention is to reduce the hydrogen concentration in an oxide semiconductor. Another object of one embodiment of the present invention is to provide a transistor including an oxide semiconductor having few oxygen vacancies. Another object of one embodiment of the present invention is to provide a transistor including an oxide semiconductor with low hydrogen concentration. Another object of one embodiment of the present invention is to control change, variation, or decrease in threshold voltage of a transistor. Another object of one embodiment of the present invention is to provide a transistor having a low current in an off state. Another object of one embodiment of the present invention is to provide a transistor having a high current in an on state. Another object of one embodiment of the present invention is to provide a method for manufacturing the transistor.

Another object of one embodiment of the present invention is to provide a method of reducing oxygen vacancies in an oxide semiconductor. Another object of one embodiment of the present invention is to provide a method of reducing the hydrogen concentration in an oxide semiconductor.

Another object of one embodiment of the present invention is to provide a novel semiconductor device, a novel electronic device, or the like. Another object of one embodiment of the present invention is to provide a novel method for manufacturing a semiconductor device.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like. One embodiment of the present invention solves at least one of the aforementioned objects and the other objects.

One embodiment of the present invention is a method for manufacturing a semiconductor device including the steps of forming a first semiconductor over a substrate; forming a second semiconductor over and in contact with the first semiconductor; forming a first layer over the second semiconductor; performing oxygen plasma treatment and removing the first layer to expose at least part of a surface of the second semiconductor; forming a third semiconductor over and in contact with the second semiconductor; forming a first insulator over and in contact with the third semiconductor; and forming a first conductor over the first insulator.

Another embodiment of the present invention is a method for manufacturing a semiconductor device including the steps of forming a first semiconductor over a substrate; forming a second semiconductor over and in contact with the first semiconductor; forming a pair of conductors in contact with a top surface of the second semiconductor; forming a first layer in contact with a top surface of the pair of conductors and the top surface of the second semiconductor; performing oxygen plasma treatment and removing the first layer to expose a surface of the second semiconductor; forming a third semiconductor in contact with the top surface of the pair of conductors and the top surface of the second semiconductor; forming a first insulator over and in contact with the third semiconductor; and forming a first conductor over the first insulator.

Another embodiment of the present invention is a method for manufacturing a semiconductor device including the steps of forming a first semiconductor over a substrate; forming a second semiconductor over and in contact with the first semiconductor; forming a first layer in contact with a top surface of the second semiconductor; performing oxygen plasma treatment and removing the first layer to expose a surface of the second semiconductor; forming a pair of conductors in contact with the top surface of the second semiconductor; forming a third semiconductor in contact with a top surface of the pair of conductors and the top surface of the second semiconductor; forming a first insulator over and in contact with the third semiconductor; and forming a first conductor over the first insulator.

In any of the above structures, the first layer preferably has a higher hydrogen-transmitting property than the first semiconductor or the third semiconductor.

In any of the above structures, the first layer preferably includes an oxide containing boron, carbon, fluorine, magnesium, aluminum, silicon, phosphorus, chlorine, argon, titanium, vanadium, chromium, manganese, cobalt, nickel, copper, zinc, gallium, germanium, yttrium, zirconium, niobium, molybdenum, ruthenium, indium, tin, lanthanum, neodymium, hafnium, tantalum, or tungsten.

In any of the above structures, the second semiconductor preferably includes indium, an element M, and zinc, and the element M is preferably aluminum, gallium, yttrium, tin, boron, silicon, titanium, iron, nickel, germanium, yttrium, zirconium, molybdenum, lanthanum, cerium, neodymium, hafnium, tantalum, or tungsten.

Note that other embodiments of the present invention will be described in the following embodiments with reference to the drawings.

According to one embodiment of the present invention, a highly reliable semiconductor device can be provided. According to one embodiment of the present invention, a semiconductor device having stable characteristics can be provided.

One embodiment of the present invention can reduce oxygen vacancies in an oxide semiconductor. One embodiment of the present invention can reduce hydrogen concentration in an oxide semiconductor. One embodiment of the present invention can provide a transistor including an oxide semiconductor having few oxygen vacancies. One embodiment of the present invention can provide a transistor including an oxide semiconductor with low hydrogen concentration. One embodiment of the present invention can control change, variation, or decrease in threshold voltage of a transistor. One embodiment of the present invention can provide a transistor having a low current in an off state. One embodiment of the present invention can provide a transistor having a high current in an on state. One embodiment of the present invention can provide a method for manufacturing the transistor.

One embodiment of the present invention can provide a method of reducing oxygen vacancies in an oxide semiconductor. One embodiment of the present invention can provide a method of reducing hydrogen concentration in an oxide semiconductor.

One embodiment of the present invention can provide a novel semiconductor device, a novel electronic device, or the like. One embodiment of the present invention can provide a novel method for manufacturing a semiconductor device.

Note that the effects of one embodiment of the present invention are not limited to the above effects. The effects described above do not disturb the existence of other effects. The other effects are not described above and will be described below. The other effects will be apparent from and can be derived from the description of the specification, the drawings, and the like. One embodiment of the present invention has at least one of the aforementioned effects and the other effects. Accordingly, in some cases, one embodiment of the present invention does not have the aforementioned effects.

BRIEF DESCRIPTION OF THE DRAWINGS

In the accompanying drawings:

FIGS. 42A1, 42A2, 42A3, 42B1, 42B2, and 42B3 are perspective views and cross-sectional views which illustrate semiconductor devices of one embodiment of the present invention;

DETAILED DESCRIPTION OF THE INVENTION

Figure 1A:
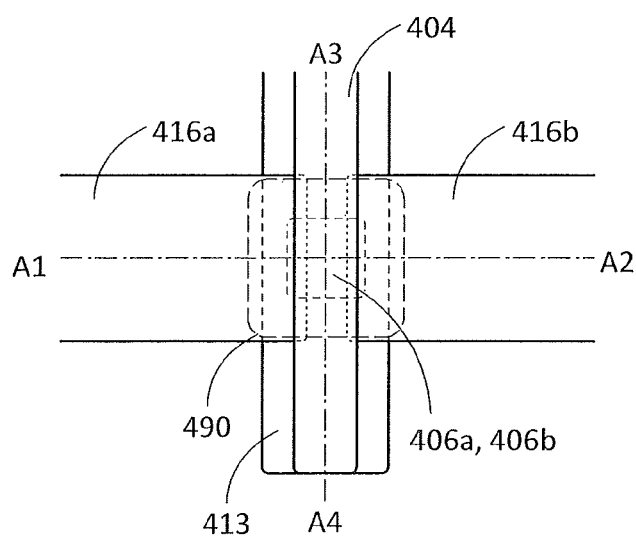
FIGS. 1A and 1B are a top view and a cross-sectional view which illustrate a transistor of one embodiment of the present invention.

Hereinafter, embodiments of the present invention will be described in detail with reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in diagrams may be exaggerated for clarity.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly includes the case where the angle is greater than or equal to $85°$ and less than or equal to $95°$. The term "substantially perpendicular" indicates that the angle formed between two straight lines is greater than or equal to $60°$ and less than or equal to $120°$.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for the sake of convenience and do not denote the order of steps or the stacking order of layers. Therefore, for example, the term "first" can be replaced with the term "second", "third", or the like as appropriate. In addition, the ordinal numbers in this specification and the like are not necessarily the same as the ordinal numbers used to specify one embodiment of the present invention.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. When the semiconductor is an oxide semiconductor, examples of an impurity which changes the characteristics of the semiconductor include Group 1 elements, Group 2 elements, Group 14 elements, Group 15 elements, and transition metals other than the main components; specifically, there are hydrogen (including water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

Note that in the embodiments described below, an insulator may be formed to have, for example, a single-layer structure or a stacked-layer structure including an insulator containing one or more of boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum unless otherwise specified. A resin may be used as the insulator. For example, a resin containing polyimide, polyamide, acrylic, silicone, or the like may be used. The use of a resin does not need planarization treatment performed on a top surface of the insulator in some cases. By using a resin, a thick film can be faulted in a short time; thus, the productivity can be increased. The insulator may be preferably formed to have a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

Furthermore, in the embodiments described below, a conductor may be formed to have, for example, a single-layer structure or a stacked-layer structure including a conductor containing one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten unless otherwise specified. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

Note that the tetras "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, a transistor of one embodiment of the present invention, a semiconductor device including the transistor, and manufacturing methods thereof are described.
<Transistor Structure>

Figure 1B:
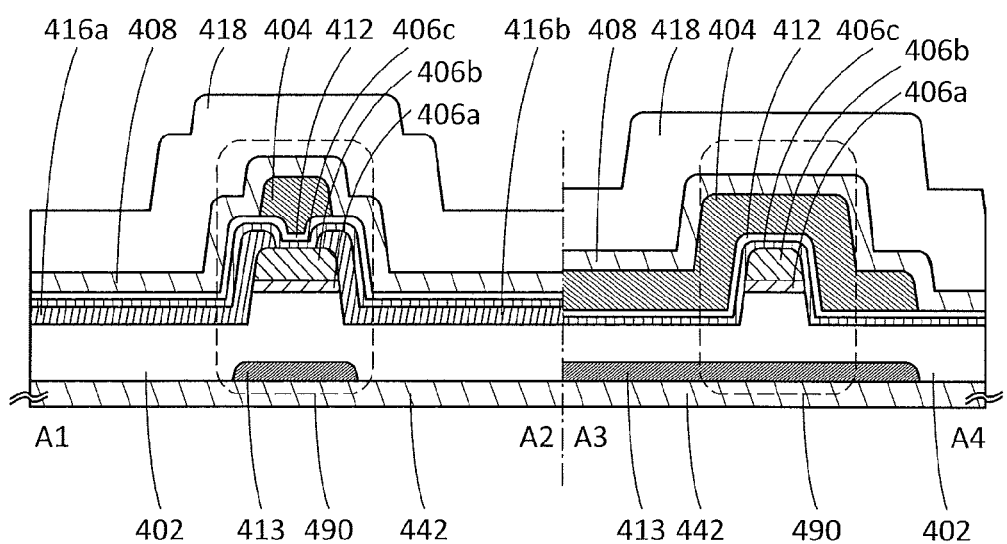

FIG. 1A is an example of a top view of the transistor 490. FIG. 1B is an example of a cross-sectional view taken along dashed-dotted line A1-A2 and dashed-dotted line A3-A4 in FIG. 1A. Note that some components such as an insulator are omitted in FIG. 1A for easy understanding.

The transistor 490 illustrated in FIGS. 1A and 1B includes a conductor 413; an insulator 402 over the conductor 413; a semiconductor 406a over the insulator 402; a semiconductor 406b over the semiconductor 406a; a conductor 416a and a conductor 416b in contact with side surfaces of the semiconductor 406a and a top surface and side surfaces of the semiconductor 406b; a semiconductor 406c in contact with the side surfaces of the semiconductor 406a, the top surface and the side surfaces of the semiconductor 406b, a top surface and side surfaces of the conductor 416a, and a top surface and side surfaces of the conductor 416b; an insulator 412 over the semiconductor 406c; and a conductor 404 over the insulator 412. Although the conductor 413 is part of the transistor 490 here, one embodiment of the present invention is not limited thereto. For example, the conductor 413 may be a component independent of the transistor 490.

Here, the transistor 490 is provided, for example, over a substrate 442 as illustrated in FIGS. 1A and 1B. As the substrate 442, a semiconductor substrate, an SOI substrate, a glass substrate, a quartz substrate, a plastic substrate, a metal substrate, a stainless steel substrate, a substrate containing stainless steel foil, a tungsten substrate, a substrate containing tungsten foil, a flexible substrate, an attachment film, paper containing a fibrous material, a base film, or the like can be used. As the semiconductor substrate, a single-material semiconductor of silicon, germanium, or the like or a compound semiconductor of silicon carbide, silicon germanium, gallium arsenide, gallium nitride, indium phosphide, zinc oxide, gallium oxide, or the like may be used, for example. As the substrate 442, an amorphous semiconductor or a crystalline semiconductor can be used. Examples of the crystalline semiconductor include a single crystal semiconductor, a polycrystalline semiconductor, and a microcrystalline semiconductor.

Here, an insulator may be provided between the substrate 442 and the conductor 413.

Alternatively, the transistor 490 may be stacked over a transistor 491, a transistor 492, or the like over the substrate as described later with reference to FIG. 23 and the like.

The conductor 413 serves as a gate electrode of the transistor 490. The insulator 402 serves as a gate insulator of the transistor 490. The conductor 416a and the conductor 416b serve as a source electrode and a drain electrode of the transistor 490. The insulator 412 serves as a gate insulator of the transistor 490. The conductor 404 serves as a gate electrode of the transistor 490.

Figure 53A:
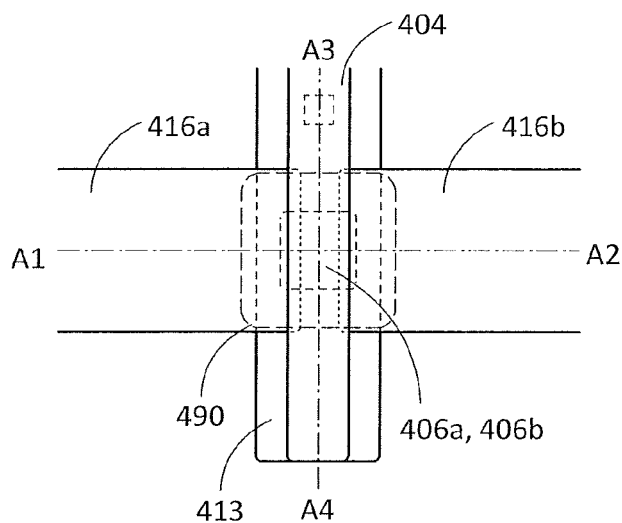
FIGS. 53A and 53B are a top view and a cross-sectional view which illustrate a transistor of one embodiment of the present invention.
Figure 53B:
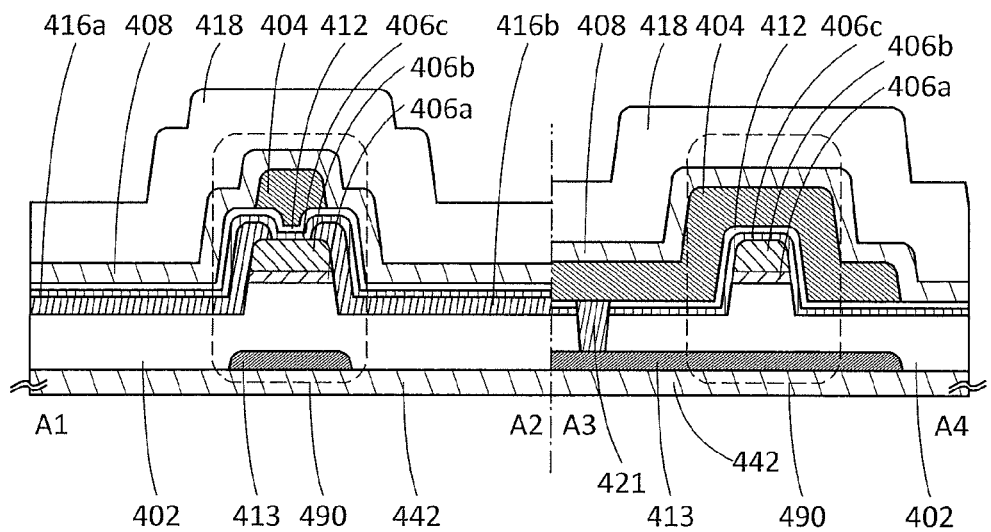

The conductor 413 and the conductor 404 serve as gate electrodes of the transistor 490, and may be supplied with different potentials. For example, by applying a negative or positive gate voltage to the conductor 413, the threshold voltage of the transistor 490 may be controlled. Alternatively, as illustrated in FIGS. 53A and 53B, the conductor 413 and the conductor 404 may be electrically connected to each other through a conductor 421 or the like and thus may be supplied with the same potential. In this case, the on-state current of the transistor 490 can be increased because the effective channel width can be increased. By the conductor 413, an electric field can be supplied to also a region that cannot be easily reached by an electric field in the case of using only the conductor 404; thus, the subthreshold swing value (also referred to as an S value) of the transistor 490 can be small. Accordingly, the off-state current of the transistor 490 can be low. For the conductor 421, description of a conductor 476a and the like, which is made later, can be referred to, for example.

Figure 54A:
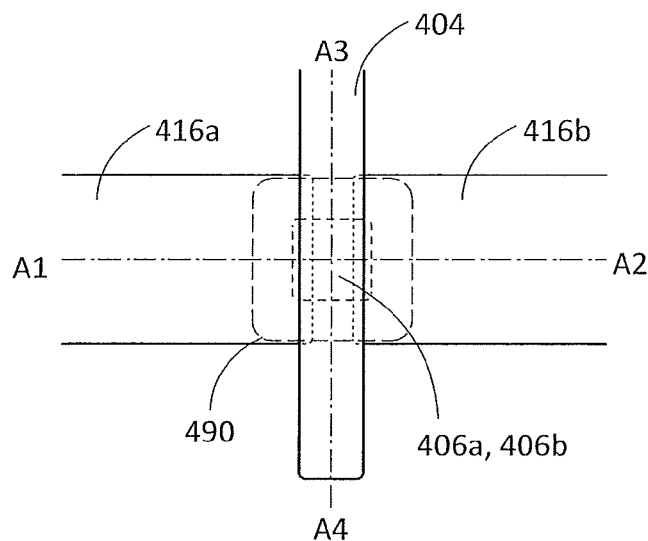
FIGS. 54A and 54B are a top view and a cross-sectional view which illustrate a transistor of one embodiment of the present invention.
Figure 54B:
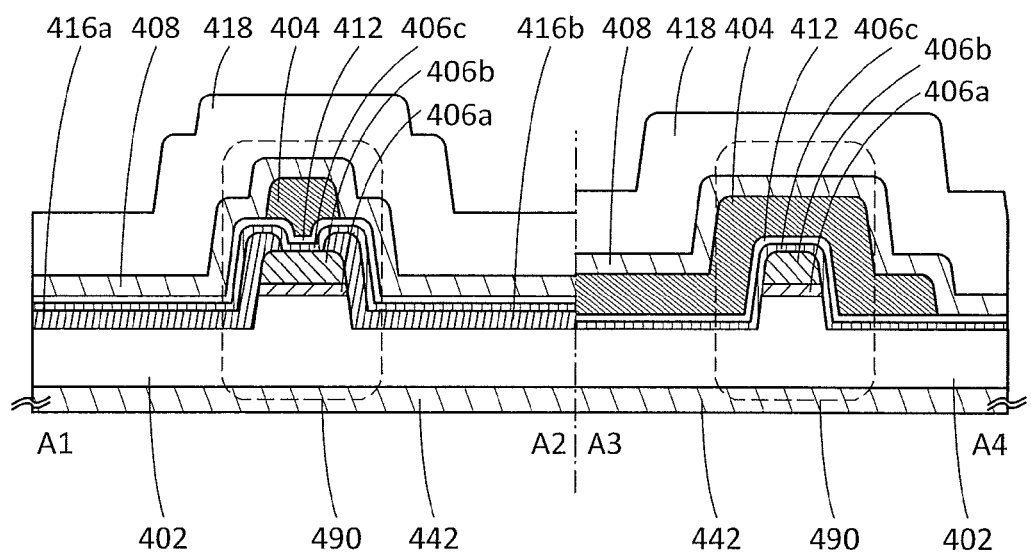

Alternatively, as illustrated in FIGS. 54A and 54B, the transistor 490 does not necessarily include the conductor 413.

The insulator 402 is preferably an insulator containing excess oxygen.

The insulator containing excess oxygen means an insulator from which oxygen is released by heat treatment, for example. The silicon oxide containing excess oxygen means silicon oxide which can release oxygen by heat treatment or the like, for example. Therefore, the insulator 402 is an insulator in which oxygen can be moved. In other words, the insulator 402 may be an insulator having an oxygen-transmitting property. For example, the insulator 402 may be an insulator having a higher oxygen-transmitting property than the semiconductor 406a.

The insulator containing excess oxygen has a function of reducing oxygen vacancies in the semiconductor 406b in some cases. Such oxygen vacancies form DOS in the semiconductor 406b and serve as hole traps or the like. In addition, hydrogen comes into the site of such oxygen vacancies and forms electrons serving as carriers. Therefore, by reducing the oxygen vacancies in the semiconductor 406b, the transistor 490 can have stable electrical characteristics.

Here, an insulator from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in thermal desorption spectroscopy (TDS) analysis in the range of a surface temperature of 100° C. to 700° C. or 100° C. to 500° C.

Here, the method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2}\times S_{O2}\times \alpha$$

The value $N_{H2}$ is obtained by conversion of the number of hydrogen molecules desorbed from the reference sample into densities. The value $S_{H2}$ is the integral value of ion intensity in the case where the reference sample is subjected to the TDS analysis. Here, the reference value of the reference sample is set to $N_{H2}/S_{H2}$. The value $S_{O2}$ is the integral value of ion intensity when the measurement sample is analyzed by TDS. The value α is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W using a silicon substrate containing hydrogen atoms at $1\times10^{16}$ atoms/cm$^2$ as the reference sample.

Furthermore, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the number of the released oxygen atoms can also be estimated through the evaluation of the number of the released oxygen molecules.

Note that $N_{O2}$ is the number of the released oxygen molecules. The number of released oxygen in the case of being converted into oxygen atoms is twice the number of the released oxygen molecules.

Furthermore, the insulator from which oxygen is released by heat treatment may contain a peroxide radical. Specifically, the spin density of a signal attributed to the peroxide radical is greater than or equal to $5\times10^{17}$ spins/cm$^3$. Note that the insulator containing a peroxide radical may have an asymmetric signal with a g factor of approximately 2.01 in ESR.

The insulator containing excess oxygen may be formed using oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

The insulator 412 may be formed to have a single layer or stacked layers using, for example, silicon oxide, silicon oxynitride, silicon nitride oxide, aluminum oxide, hafnium oxide, gallium oxide, Ga—Zn-based metal oxide, silicon nitride, and the like.

The insulator 412 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), or yttrium oxide.

The insulator 412 can be formed using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride, aluminum nitride oxide, or the like, or a film in which any of the above materials are mixed.

As the insulator 412, like the insulator 402, an oxide insulating film that contains oxygen in excess of the stoichiometric composition is preferably used.

When the specific material is used for the gate insulating film, electrons are trapped in the gate insulating film under the specific conditions and the threshold voltage can be increased. For example, like a stacked-layer film of silicon oxide and hafnium oxide, part of the gate insulating film uses a material having a lot of electron trap states, such as hafnium oxide, aluminum oxide, and tantalum oxide, and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the semiconductor layer to the gate electrode, and some of the electrons are trapped by the electron trap states.

In the transistor in which a necessary number of electrons is trapped by the electron trap states in this manner, the threshold voltage is shifted in the positive direction. By controlling the voltage of the gate electrode, the number of electrons to be trapped can be controlled, and thus the threshold voltage can be controlled. Furthermore, the treatment for trapping the electrons may be performed in the manufacturing process of the transistor.

For example, the treatment is preferably performed at any step before factory shipment, such as after the formation of a wire metal connected to the source electrode or the drain electrode of the transistor, after the preceding process (wafer processing), after a wafer-dicing step, or after packaging. In either case, it is preferable that the transistor be not exposed to temperatures of 125° C. or higher for one hour or more after the process for trapping electrons.

Nitrogen oxide ($NO_x$; x is greater than 0 and less than or equal to 2, preferably greater than or equal to 1 and less than or equal to 2), typically $NO_2$ or NO, forms levels in, for example, the insulator 412. The level is positioned in the energy gap of the semiconductor 406b. Therefore, when nitrogen oxide is diffused into the interface between the insulator 412 and the semiconductor 406, an electron is trapped by the level on the insulator 412 side. As a result, the trapped electron remains in the vicinity of the interface between the insulator 412 and the semiconductor 406; thus, the threshold voltage of the transistor is shifted in the positive direction.

By using an oxide insulating film with a low content of nitrogen oxide and a low density of defect states for the insulator 412, a shift in the threshold voltage of the transistor can be reduced, which leads to a smaller change in the electrical characteristics of the transistor.

Note that in an electron spin resonance (ESR) spectrum at 100 K or lower of the insulator 412, by heat treatment in a manufacturing process of the transistor, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are not observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than the detection limit, typically lower than or equal to $1\times10^{17}$ spins/cm$^3$. Note that the ESR measurement temperature is set to 100 K or lower.

In the ESR spectrum, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen dioxide. Accordingly, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is. These three signals are called "signals attributed to NOx" in the following description.

The oxide insulating film with a low content of nitrogen oxide and a low density of defect states has a nitrogen concentration measured by secondary ion mass spectrometry (SIMS) of less than $2\times10^{20}$ atoms/cm$^3$, less than $7\times10^{19}$ atoms/cm$^3$, or less than $2\times10^{19}$ atoms/cm$^3$. The content of nitrogen oxide in the insulator 412 can be reduced as the formation temperature of the insulator 412 rises. The insulator 412 is preferably formed at a temperature higher than or equal to 450° C. and lower than the strain point of the substrate, higher than or equal to 500° C. and lower than the strain point of the substrate, or higher than or equal to 500° C. and lower than or equal to 550° C.

As illustrated in FIGS. 1A and 1B, the side surfaces of the conductors 416a and 416b are in contact with the side surfaces of the semiconductor 406b. The semiconductor 406b can be electrically surrounded by an electric field of the conductor 404 (a structure in which a semiconductor is electrically surrounded by an electric field of a conductor is referred to as a surrounded channel (s-channel) structure). Therefore, a channel is formed in the entire semiconductor 406b (bulk) in some cases. In the s-channel structure, a large amount of current can flow between a source and a drain of a transistor, so that a high current in an on state (on-state current) can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

Next, the semiconductor 406a, the semiconductor 406b, and the semiconductor 406c are described.

The semiconductor 406b is an oxide semiconductor containing indium, for example. The semiconductor 406b has high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example; The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

For example, the semiconductor 406a and the semiconductor 406c include one or more elements, or two or more elements other than oxygen included in the semiconductor 406b. Since the semiconductor 406a and the semiconductor 406c each include one or more elements, or two or more elements other than oxygen included in the semiconductor 406b, an interface state is less likely to be formed at the interface between the semiconductor 406a and the semiconductor 406b and the interface between the semiconductor 406b and the semiconductor 406c.

The semiconductor 406a, the semiconductor 406b, and the semiconductor 406c preferably include at least indium. In the case of using an In-M-Zn oxide as the semiconductor 406a, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the semiconductor 406b, when the summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the semiconductor 406c, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor 406c may be an oxide that is a type the same as that of the semiconductor 406a.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the bottom of the conduction band.

An indium gallium oxide has a small electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, more preferably higher than or equal to 90%.

At this time, when an electric field is applied to a gate electrode, a channel is formed in the semiconductor 406b having the highest electron affinity in the semiconductor 406a, the semiconductor 406b, and the semiconductor 406c.

Figure 55A:
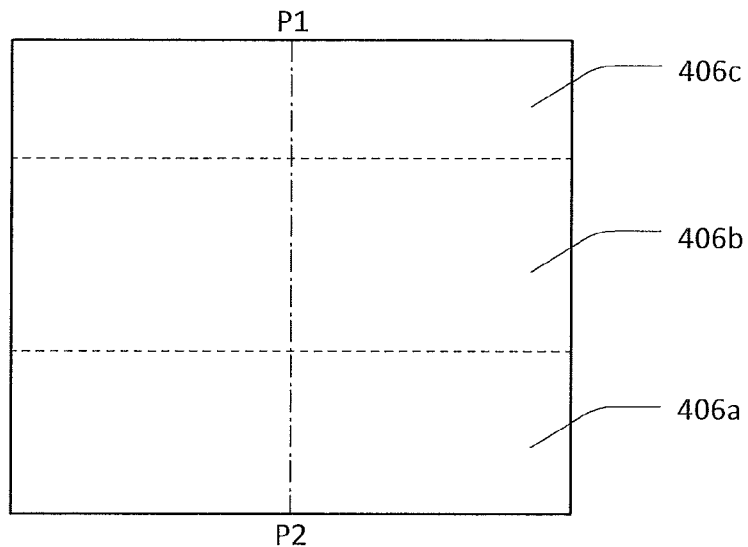
FIGS. 55A to 55C are a cross-sectional view of stacked semiconductor layers and band diagrams thereof.
Figure 55B:
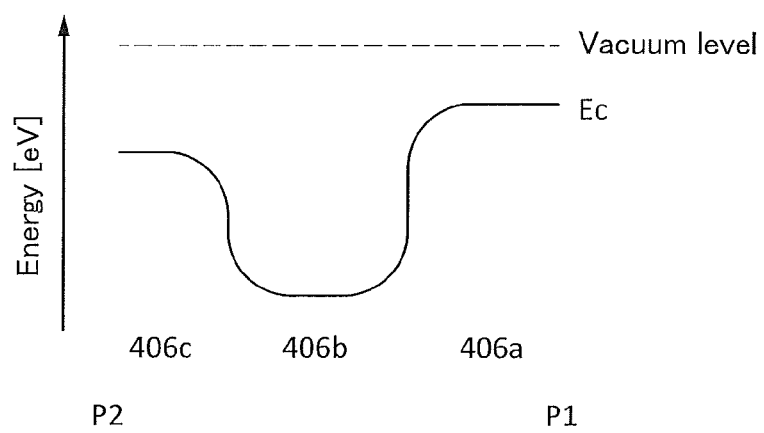
Figure 55C:
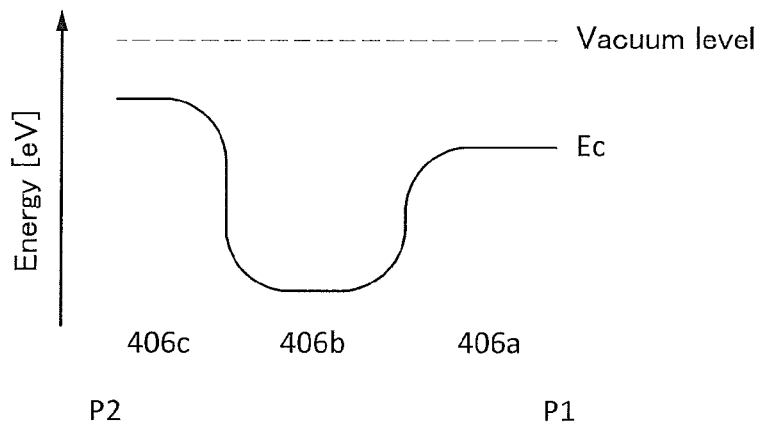

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low interface state density. For that reason, the stack of the semiconductor 406a, the semiconductor 406b, and the semiconductor 406c has a band diagram where energy at each interface and in the vicinity of the interface is changed continuously (continuous junction). Note that FIG. 55A is a cross-sectional view in which the semiconductor 406a, the semiconductor 406b, and the semiconductor 406c are stacked in this order. FIG. 55B shows energy (Ec) of the bottom of the conduction band corresponding to dashed-dotted line P1-P2 in FIG. 55A when the semiconductor 406c has a higher electron affinity than the semiconductor 406a. FIG. 55C shows the case where the semiconductor 406c has a lower electron affinity than the semiconductor 406a.

At this time, electrons move mainly in the semiconductor 406b, not in the semiconductor 406a and the semiconductor 406c. As described above, when the interface state density at the interface between the semiconductor 406a and the semiconductor 406b and the interface state density at the interface between the semiconductor 406b and the semiconductor 406c are decreased, electron movement in the semiconductor 406b is less likely to be inhibited and the on-sate current of the transistor 490 can be increased.

As factors of inhibiting electron movement are decreased, the on-state current of the transistor 490 can be increased. For example, in the case where there is no factor of inhibiting electron movement, electrons are assumed to be efficiently moved. Electron movement is inhibited, for example, in the case where physical unevenness of a channel formation region is large.

Therefore, to increase the on-state current of the transistor 490, for example, root mean square (RMS) roughness with a measurement area of 1 μm×1 μm of a top surface or a bottom surface of the semiconductor 406b (a formation surface; here, the semiconductor 406a) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

Here, as the semiconductors 406a to 406c, an insulator or a conductor may be used. The transistor 490 does not necessarily include either or both of the semiconductors 406a and 406c.

Note that the impurity concentration in the semiconductor 406 can be measured by SIMS.

For example, the case where the semiconductor 406b contains oxygen vacancies is described. Due to entry of hydrogen into the oxygen vacancy, an electron serving as a carrier is generated in some cases. Here, an oxygen vacancy can be referred to as $V_O$. Hydrogen which enters sites of oxygen vacancies is referred to as $V_OH$ in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on. Hydrogen contained in the semiconductor 406b reacts with oxygen bonded to a metal atom to be water, and causes oxygen vacancies in a lattice from which oxygen is released (or a portion from which oxygen is released) in some cases.

Accordingly, it is preferable that hydrogen be reduced as much as possible as well as the oxygen vacancies in the semiconductor 406b. Specifically, the hydrogen concentration of the semiconductor 406b, which is measured by SIMS, is lower than or equal to $5\times10^{19}$ atoms/cm$^3$, lower than or equal to $1\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$. As a result, the transistor 490 has a positive threshold voltage (normally-off characteristics).

When the semiconductor 406b contains silicon or carbon that is a Group 14 element, oxygen vacancies in the semiconductor 406b increase to form n-type regions. Thus, the concentration of silicon or carbon (the concentration is measured by SIMS) of the semiconductor 406b is set to lower than or equal to $2\times10^{18}$ atoms/cm$^3$, preferably lower than or equal to $2\times10^{17}$ atoms/cm$^3$. As a result, the transistor 490 has a positive threshold voltage (normally-off characteristics).

Furthermore, the concentration of alkali metal or alkaline earth metal of the semiconductor 406b, which is measured by SIMS, is set to lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, which may increase the off-state current of the transistor. Thus, it is preferable to reduce the concentration of alkali metal or alkaline earth metal of the semiconductor 406b. As a result, the transistor 490 has a positive threshold voltage (normally-off characteristics).

Furthermore, when containing nitrogen, the semiconductor 406b easily becomes n-type by generation of electrons serving as carriers and an increase of carrier density. Thus, a transistor including an oxide semiconductor film which contains nitrogen is likely to be normally on. For this reason, nitrogen in the oxide semiconductor film is preferably reduced as much as possible; the concentration of nitrogen which is measured by SIMS is preferably set to, for example, lower than or equal to $5\times10^{18}$ atoms/cm$^3$.

When impurities in the semiconductor 406b are reduced, the carrier density of the oxide semiconductor films can be lowered. The semiconductor 406b preferably has a carrier density of $1\times10^{17}$/cm$^3$ or less, further preferably $1\times10^{15}$/cm$^3$ or less, still further preferably $1\times10^{13}$/cm$^3$ or less, yet further preferably $1\times10^{11}$/cm$^3$ or less.

When an oxide semiconductor film with a low impurity concentration and a low density of defect states is used as the semiconductor 406b, the transistor can have more excellent electrical characteristics. Here, the state in which the impurity concentration is low and the density of defect states is low (the number of oxygen vacancies is small) is described as "highly purified intrinsic" or "substantially highly purified intrinsic." A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has a low density of trap states in some cases. Furthermore, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage between a source electrode and a drain electrode (drain voltage) of from 1 V to 10 V. Thus, the transistor whose channel region is formed in the oxide semiconductor film has a small variation in electrical characteristics and high reliability in some cases.

In the case where the transistor 490 has an s-channel structure, a channel is formed in the whole of the semiconductor 406b. Therefore, as the semiconductor 406b has a larger thickness, a channel region becomes larger. In other words, the thicker the semiconductor 406b is, the larger the on-state current of the transistor 490 is. For example, the semiconductor 406b has a region with a thickness of greater than or equal to 10 nm, preferably greater than or equal to 20 nm, further preferably greater than or equal to 40 nm, still further preferably greater than or equal to 60 nm, yet further preferably greater than or equal to 100 nm. Note that the semiconductor 406b has a region with a thickness of, for example, less than or equal to 300 nm, preferably less than or equal to 200 nm, more preferably less than or equal to 150 nm because the productivity of the semiconductor device might be decreased.

Moreover, the thickness of the semiconductor 406c is preferably as small as possible to increase the on-state current of the transistor 490. The semiconductor 406c has a region with a thickness of less than 10 nm, preferably less than or equal to 5 nm, more preferably less than or equal to 3 nm, for example. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. The semiconductor 406c has a region with a thickness of greater than or equal to 0.3 nm, preferably greater than or equal to 1 nm, more preferably greater than or equal to 2 nm, for example. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a has a region with a thickness of, for example, greater than or equal to 10 nm, preferably greater than or equal to 20 nm, more preferably greater than or equal to 40 nm, still more preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a has a region with a thickness of, for example, less than or equal to 200 nm, preferably less than or equal to 120 nm, more preferably less than or equal to 80 nm.

For example, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by secondary ion mass spectrometry (SIMS) is provided between the semiconductor 406b and the semiconductor 406a. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor 406b and the semiconductor 406c.

It is preferable to reduce the concentration of hydrogen in the semiconductor 406a and the semiconductor 406c in order to reduce the concentration of hydrogen in the semiconductor 406b. The semiconductor 406a and the semiconductor 406c each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the semiconductor 406a and the semiconductor 406c in order to reduce the concentration of nitrogen in the semiconductor 406b. The semiconductor 406a and the semiconductor 406c each have a region in which the concentration of nitrogen measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The above three-layer structure is an example. For example, a two-layer structure without the semiconductor 406a or the semiconductor 406c may be employed. A four-layer structure in which any one of the semiconductors described as examples of the semiconductor 406a, the semiconductor 406b, and the semiconductor 406c is provided below or over the semiconductor 406a or below or over the semiconductor 406c may be employed. An n-layer structure (n is an integer of 5 or more) in which any one of the semiconductors described as examples of the semiconductor 406a, the semiconductor 406b, and the semiconductor 406c is provided at two or more of the following positions: over the semiconductor 406a, below the semiconductor 406a, over the semiconductor 406c, and below the semiconductor 406c.

At least part (or all) of the conductor 416a (and/or the conductor 416b) is provided on at least part (or all) of a surface, a side surface, a top surface, and/or a bottom surface of a semiconductor, e.g., the semiconductor 406b.

Alternatively, at least part (or all) of the conductor 416a (and/or the conductor 416b) is in contact with at least part (or all) of a surface, a side surface, a top surface, and/or a bottom surface of a semiconductor, e.g., the semiconductor 406b. Alternatively, at least part (or all) of the conductor 416a (and/or the conductor 416b) is in contact with at least part (or all) of a semiconductor, e.g., the semiconductor 406b.

Alternatively, at least part (or all) of the conductor 416a (and/or the conductor 416b) is electrically connected to at least part (or all) of a surface, a side surface, a top surface, and/or a bottom surface of a semiconductor, e.g., the semiconductor 406b. Alternatively, at least part (or all) of the conductor 416a (and/or the conductor 416b) is electrically connected to at least part (or all) of a semiconductor, e.g., the semiconductor 406b.

Alternatively, at least part (or all) of the conductor 416a (and/or the conductor 416b) is provided near at least part (or all) of a surface, a side surface, a top surface, and/or a bottom surface of a semiconductor, e.g., the semiconductor 406b. Alternatively, at least part (or all) of the conductor 416a (and/or the conductor 416b) is provided near at least part (or all) of a semiconductor, e.g., the semiconductor 406b.

Alternatively, at least part (or all) of the conductor 416a (and/or the conductor 416b) is provided to be adjacent to at least part (or all) of a surface, a side surface, a top surface, and/or a bottom surface of a semiconductor, e.g., the semiconductor 406b. Alternatively, at least part (or all) of the conductor 416a (and/or the conductor 416b) is provided to be adjacent to at least part (or all) of a semiconductor, e.g., the semiconductor 406b.

Alternatively, at least part (or all) of the conductor 416a (and/or the conductor 416b) is provided obliquely above at least part (or all) of a surface, a side surface, a top surface, and/or a bottom surface of a semiconductor, e.g., the semiconductor 406b. Alternatively, at least part (or all) of the conductor 416a (and/or the conductor 416b) is provided obliquely above at least part (or all) of a semiconductor, e.g., the semiconductor 406b.

Alternatively, at least part (or all) of the conductor 416a (and/or the conductor 416b) is provided above at least part (or all) of a surface, a side surface, a top surface, and/or a bottom surface of a semiconductor, e.g., the semiconductor 406b. Alternatively, at least part (or all) of the conductor 416a (and/or the conductor 416b) is provided above at least part (or all) of a semiconductor, e.g., the semiconductor 406b.

Here, an insulator 408 and an insulator 418 may be provided over the transistor 490. The insulator 408 and the insulator 418 will be described in detail when the structure of the semiconductor device is described.

A structure of an oxide semiconductor which can be used for the semiconductors 406a to 406c is described in a later embodiment.

<Modification Example of Transistor Structure>

Figure 2A:
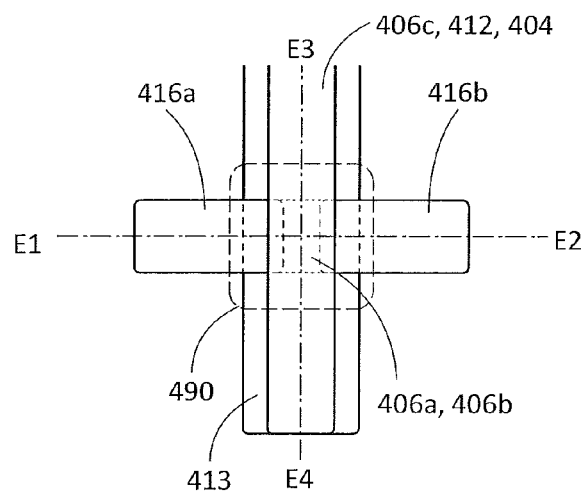
FIGS. 2A and 2B are a top view and a cross-sectional view which illustrate a transistor of one embodiment of the present invention.
Figure 2B:
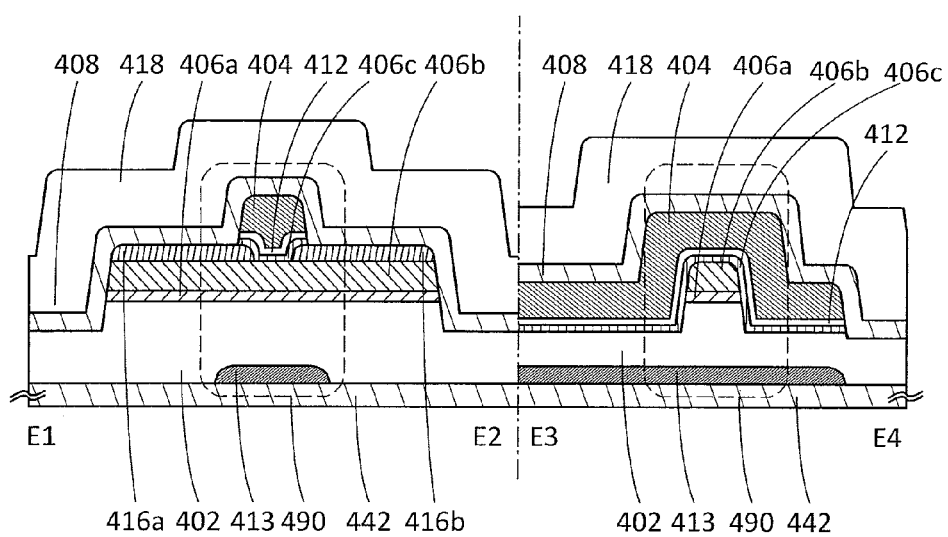

Next, the transistor 490 described in FIGS. 2A and 2B is described as a modification example of the transistor 490 in FIGS. 1A and 1B.

FIG. 2A is an example of the top view of the transistor 490. FIG. 2B is an example of a cross-sectional view taken along dashed-dotted line E1-E2 and dashed-dotted line E3-E4 in FIG. 2A. Note that some components such as an insulator are omitted in FIG. 2A for easy understanding.

Although FIGS. 1A and 1B show an example where the conductor 416a and the conductor 416b which function as a source electrode and a drain electrode are in contact with a top surface and side surfaces of the semiconductor 406b, a top surface of the insulator 402, and the like, a transistor structure of one embodiment of the present invention is not limited thereto. For example, as illustrated in FIGS. 2A and 2B, the conductor 416a and the conductor 416b may be in contact with only the top surface of the semiconductor 406b.

In the transistor illustrated in FIGS. 2A and 2B, the conductor 416a and the conductor 416b are not in contact with side surfaces of the semiconductor 406b. Thus, an electric field applied from the conductor 404 functioning as a gate electrode to the side surfaces of the semiconductor 406b is less likely to be blocked by the conductor 416a and the conductor 416b. The conductor 416a and the conductor 416b are not in contact with a top surface of the insulator 402. Thus, excess oxygen (oxygen) released from the insulator 402 is not consumed to oxidize the conductor 416a and the conductor 416b. Accordingly, excess oxygen (oxygen) released from the insulator 402 can be efficiently used to reduce oxygen vacancies in the semiconductor 406b. In other words, the transistor having the structure illustrated in FIGS. 2A and 2B has excellent electrical characteristics such as a high on-state current, high field-effect mobility, a small subthreshold swing value, and high reliability.

Figure 3A:
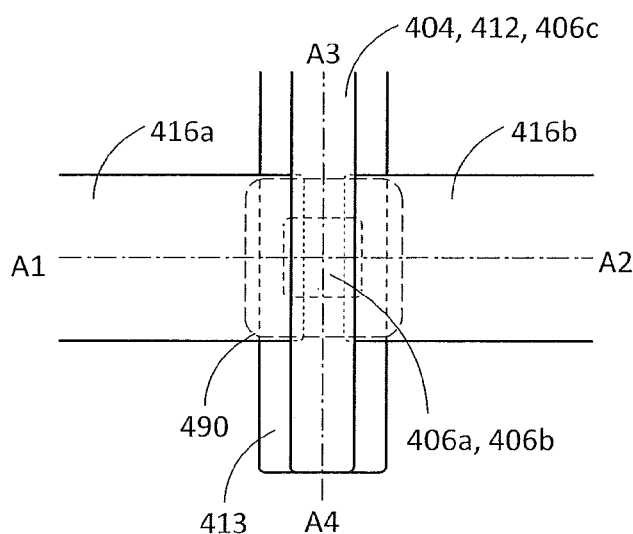
FIGS. 3A and 3B are a top view and a cross-sectional view which illustrate a transistor of one embodiment of the present invention.
Figure 3B:
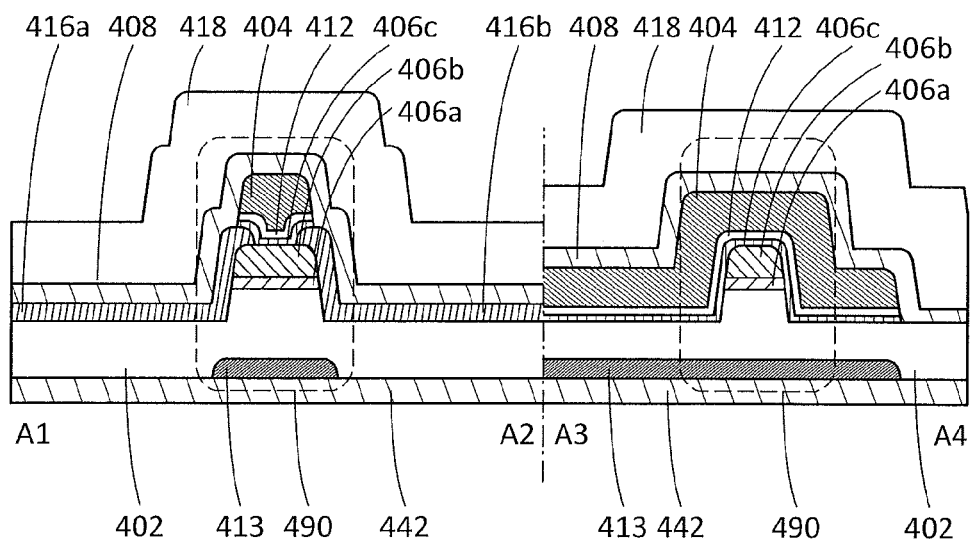

Although FIGS. 1A and 1B show an example where the semiconductor 406c and the insulator 412 are provided over the entire surface in the transistor, any of ends of the semiconductor 406c, the insulator 412, and the conductor 404 does not necessarily project as illustrated in FIGS. 3A and 3B. FIG. 3A is another example of the top view of the transistor 490. FIG. 3B is an example of a cross-sectional view taken along dashed-dotted line A1-A2 and dashed-dotted line A3-A4 in FIG. 3A. Note that some components such as an insulator are omitted in FIG. 3A for easy understanding.

Figure 4A:
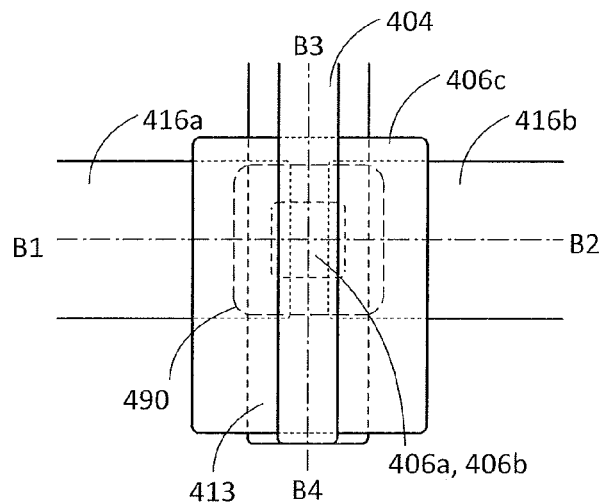
FIGS. 4A and 4B are a top view and a cross-sectional view which illustrate a transistor of one embodiment of the present invention.
Figure 4B:
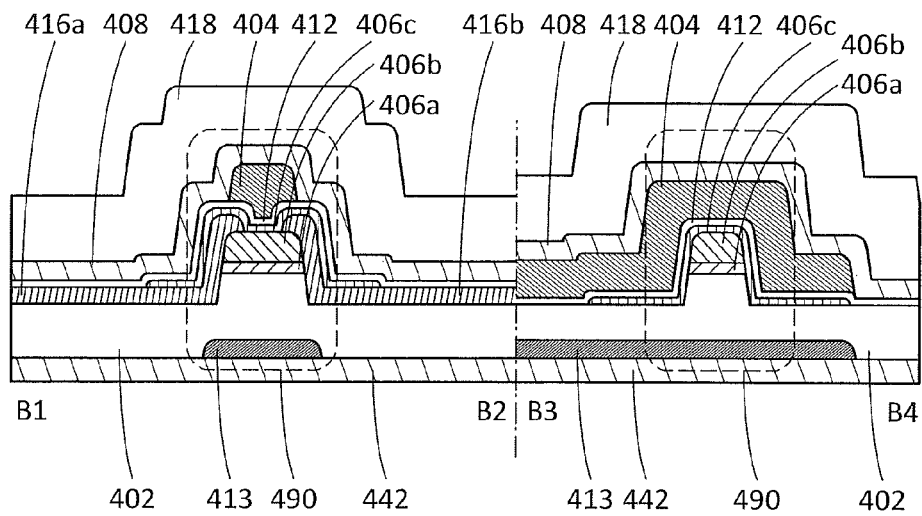

FIG. 4A is another example of the top view of the transistor 490. FIG. 4B is an example of a cross-sectional view taken along dashed-dotted line B1-B2 and dashed-dotted line B3-B4 in FIG. 4A. Note that some components such as an insulator are omitted in FIG. 4A for easy understanding.

Figure 5A:
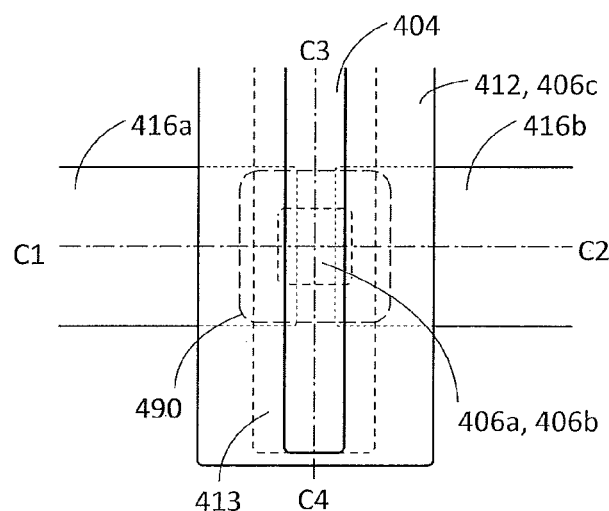
FIGS. 5A and 5B are a top view and a cross-sectional view which illustrate a transistor of one embodiment of the present invention.
Figure 5B:
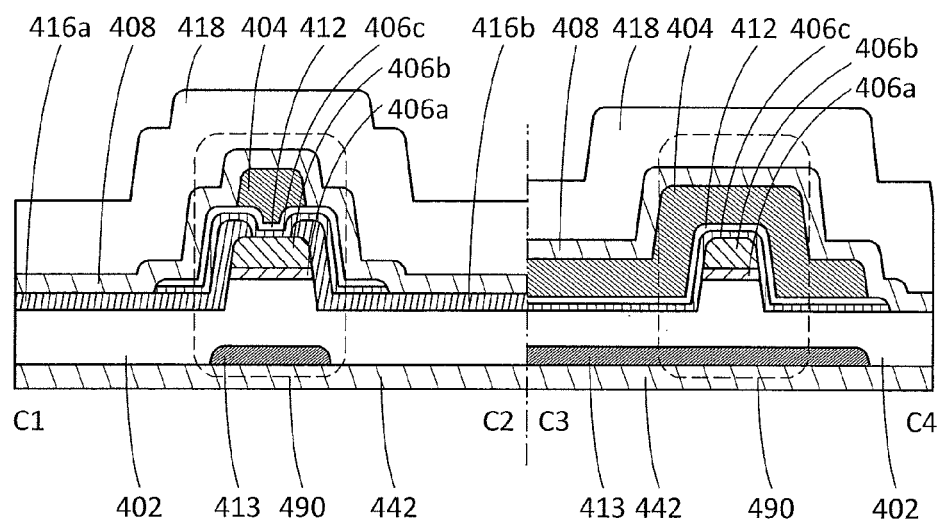

FIG. 5A is another example of the top view of the transistor 490. FIG. 5B is an example of a cross-sectional view taken along dashed-dotted line C1-C2 and dashed-dotted line C3-C4 in FIG. 5A. Note that some components such as an insulator are omitted in FIG. 5A for easy understanding.

As illustrated in the top view in FIG. 4A, the semiconductor 406c, the insulator 412, and the conductor 404 may be provided so that the semiconductor 406c covers a channel formation region of a transistor and its periphery, and the insulator 412 is provided over the entire surface of the transistor to cover the semiconductor 406c. In the cross-sectional view in FIG. 4B, the semiconductor 406c has a region whose end projects as compared with the conductor 404. Alternatively, as illustrated in the top view in FIG. 5A, the semiconductor 406c and the insulator 412 may be provided to cover a channel formation region of a transistor and its periphery. Note that in the cross-sectional view in FIG. 5B, ends of the semiconductor 406c and the insulator 412 each project as compared with the conductor 404.

When the transistor has any one of the structures illustrated in FIGS. 1A and 1B, FIGS. 4A and 4B, and FIGS. 5A and 5B, leakage current through a surface of the semiconductor 406c, a surface of the insulator 412, or the like can be reduced in some cases. In other words, the off-state current of the transistor can be reduced. At the time of etching of the insulator 412 and the semiconductor 406c, the conductor 404 is not necessarily used as a mask; thus, the conductor 404 is not exposed to plasma. Therefore, electrostatic damage of a transistor due to an antenna effect is less likely to occur, and thus, the semiconductor device can be manufactured with high yield. Since the degree of freedom of design of the semiconductor device is increased, the transistor is suitable for an integrated circuit such as a large scale integration (LSI) or very large scale integration (VLSI) having a complicated structure.

Figure 6A:
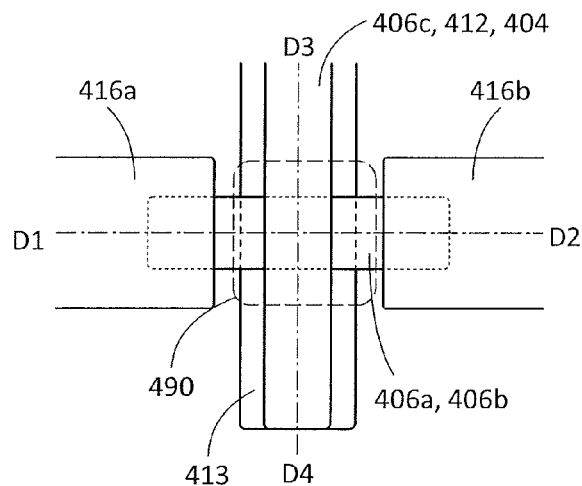
FIGS. 6A and 6B are a top view and a cross-sectional view which illustrate a transistor of one embodiment of the present invention.
Figure 6B:
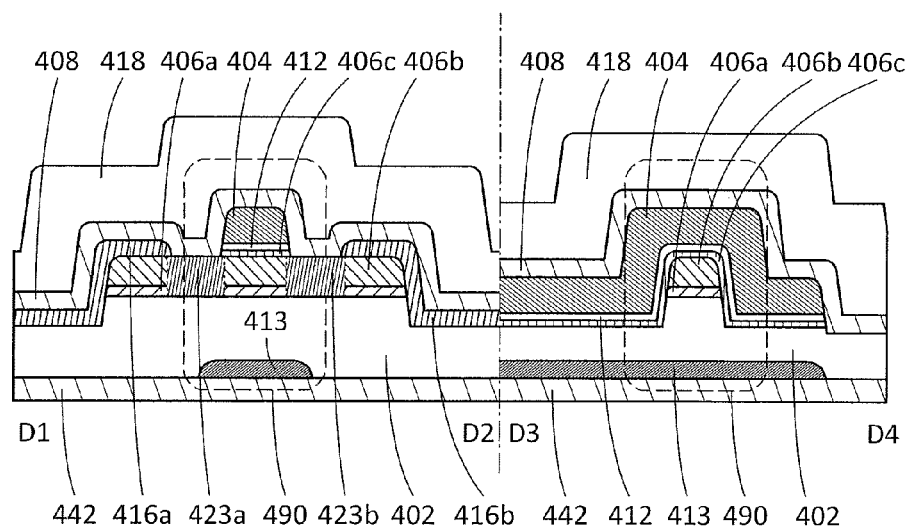

FIG. 6A is another example of the top view of the transistor 490. FIG. 6B is an example of a cross-sectional view taken along dashed-dotted line D1-D2 and dashed-dotted line D3-D4 in FIG. 6A. Note that some components such as an insulator are omitted in FIG. 6A for easy understanding.

Although FIGS. 1A and 1B, FIGS. 2A and 2B, and the like show a structure in which a region where the conductors 416a and 416b functioning as a source electrode and a drain electrode and the conductor 404 functioning as a gate electrode overlap with each other is provided, a transistor structure of one embodiment of the present invention is not limited thereto. For example, as illustrated in FIGS. 6A and 6B, a region where the conductors 416a and 416b and the conductor 404 overlap with each other is not necessarily provided. With such a structure, a transistor with a small parasitic capacitance can be formed. Thus, a transistor with favorable switching characteristics and less noise can be obtained.

Note that the conductors 416a and 416b and the conductor 404 do not overlap with each other; thus, resistance between the conductor 416a and the conductor 416b becomes high in some cases. In such a case, the resistance is preferably as low as possible because the on-state current of the transistor might be low. For example, the distance between the conductor 416a (conductor 416b) and the conductor 404 may be made small. For example, the distance between the conductor 416a (conductor 416b) and the conductor 404 may be greater than or equal to 0 μm and less than or equal to 1 μm, preferably greater than or equal to 0 μm and less than or equal to 0.5 more preferably greater than or equal to 0 μm and less than or equal to 0.2 μm, still more preferably greater than or equal to 0 μm and less than or equal to 0.1 μm.

A low-resistance region 423a (low-resistance region 423b) may be provided in the semiconductor 406b and/or the semiconductor 406a between the conductor 416a (conductor 416b) and the conductor 404. The low-resistance region 423a and the low-resistance region 423b each have, for example, a region whose carrier density is higher than that of the other region of the semiconductor 406b and/or that of the other region of the semiconductor 406a. Alternatively, the low-resistance region 423a and the low-resistance region 423b each have a region whose impurity concentration is higher than that of the other region of the semiconductor 406b and/or that of the other region of the semiconductor 406a. Alternatively, the low-resistance region 423a and the low-resistance region 423b each have a region whose carrier mobility is higher than that of the other region of the semiconductor 406b and/or that of the other region of the semiconductor 406a. The low-resistance region 423a and the low-resistance region 423b may be formed in such a manner that, for example, the conductor 404, the conductor 416a, the conductor 416b, and the like are used as masks and impurities are added to the semiconductor 406b and/or the semiconductor 406a.

The distance between the conductor 416a (conductor 416b) and the conductor 404 may be made short, and the low-resistance region 423a (low-resistance region 423b) may be provided in the semiconductor 406b and/or the semiconductor 406a between the conductor 416a(conductor 416b) and the conductor 404.

Figure 7A:
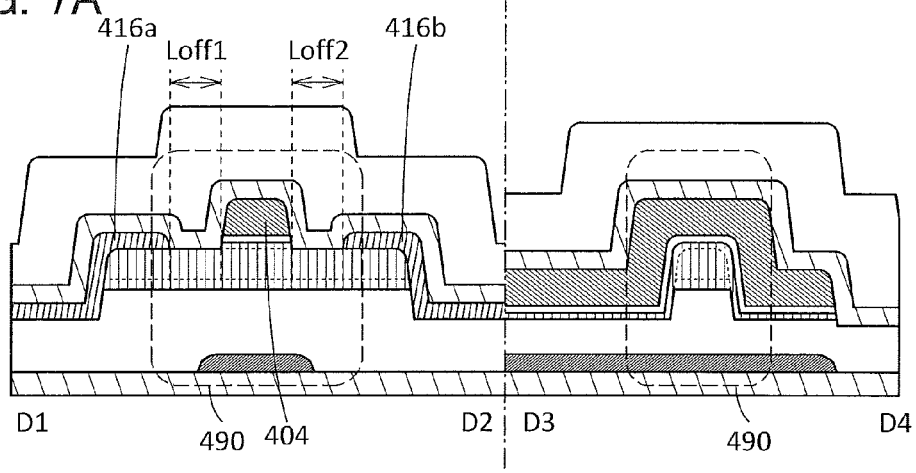
FIGS. 7A to 7C are cross-sectional views each illustrating a transistor of one embodiment of the present invention.

Alternatively, as in FIG. 7A, the transistor 490 does not necessarily include the low-resistance region 423a and the low-resistance region 423b, for example. In the transistor 490 without including the low-resistance region 423a and the low-resistance region 423b, the on-state current might be decreased but the short-channel effect can be reduced. Note that regions in FIG. 6B corresponding to the low-resistance region 423a and the low-resistance region 423b (a region between the conductor 416a and the conductor 404 and a region between the conductor 416b and the conductor 404) are referred to as an Loff1 region and an Loff2 region, respectively. For example, the length of each of the Loff1 region and the Loff2 region is preferably set to 50 nm or less, 20 nm or less, or 10 nm or less, in which case the on-state current of the transistor 490 hardly decreases even when the transistor 490 does not include the low-resistance region 423a and the low-resistance region 423b. Note that the areas of the Loff1 region and the Loff2 region may be different.

Figure 7B:
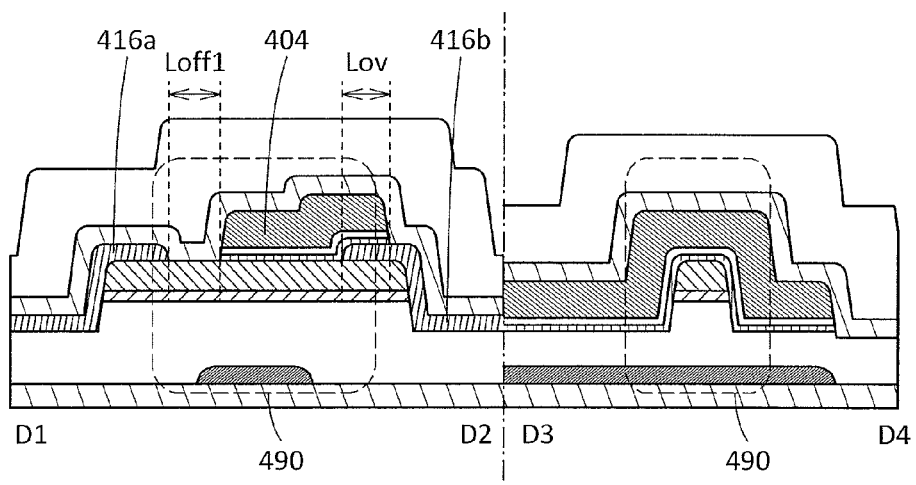

Alternatively, as in FIG. 7B, the transistor 490 may include only the Loff1 region without including the Loff2 region, for example. In the transistor 490 without including the Loff2 region, the on-state current and the short-channel effect are small. Note that a region where the conductor 416b and the conductor 404 overlap with each other is referred to as an Lov region. For example, the length of the Lov region is preferably shortened to 50 nm or less, 20 nm or less, or 10 nm or less, in which case degradation of switching characteristics of the transistor 490 due to parasitic capacitance hardly occurs.

Figure 7C:
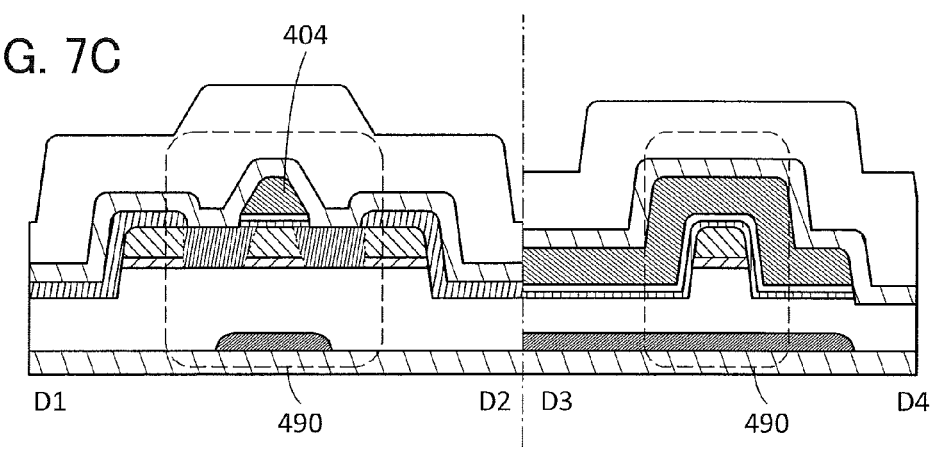

Alternatively, the conductor 404 of the transistor 490 may have a taper angle as illustrated in FIG. 7C, for example. In that case, for example, the low-resistance region 423a and the low-resistance region 423b have slopes in the depth direction in some cases. Note that not only in FIG. 7C but also in another drawing, the conductor 404 may have a taper angle.

Figure 8A:
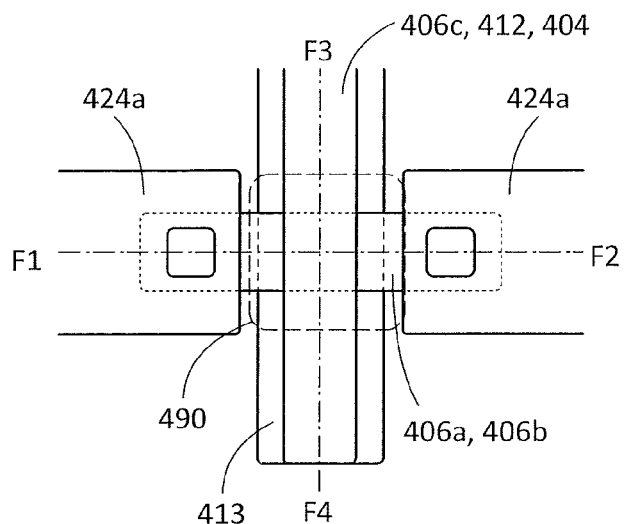
FIGS. 8A and 8B are a top view and a cross-sectional view which illustrate a transistor of one embodiment of the present invention.
Figure 8B:
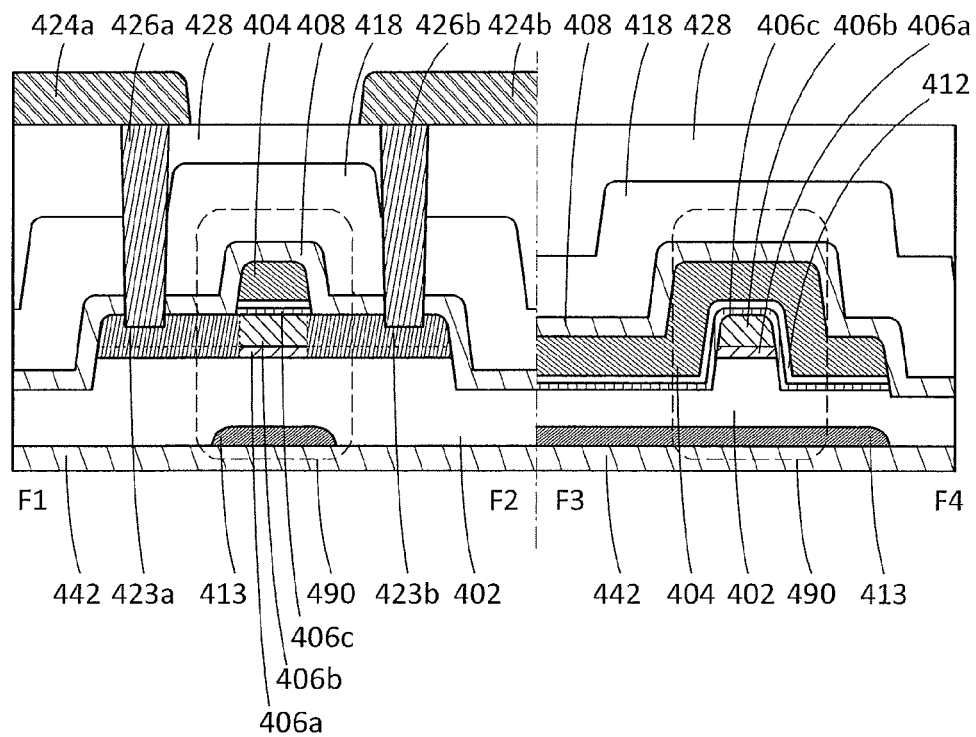

FIG. 8A is another example of the top view of the transistor 490. FIG. 8B is an example of a cross-sectional view taken along dashed-dotted line F1-F2 and dashed-dotted line F3-F4 in FIG. 8A. Note that some components such as an insulator are omitted in FIG. 8A for easy understanding.

The transistor 490 may have a structure in which, as illustrated in FIGS. 8A and 8B, the conductor 416a and the conductor 416b are not provided and the conductor 426a and the conductor 426b are in contact with the semiconductor 406b. In this case, the low-resistance region 423a (low-resistance region 423b) is preferably provided in a region in contact with at least the conductor 426a and the conductor 426b in the semiconductor 406b and/or the semiconductor 406a. The low-resistance region 423a and the low-resistance region 423b may be formed in such a manner that, for example, the conductor 404 and the like are used as masks and impurities are added to the semiconductor 406b and/or the semiconductor 406a. The conductor 426a and the conductor 426b may be provided in holes (portions which penetrate) or recessed portions (portions which do not penetrate) of the semiconductor 406b. When the conductor 426a and the conductor 426b are provided in holes or recessed portions of the semiconductor 406b, contact areas between the conductors 426a and 426b and the semiconductor 406b are increased; thus, the adverse effect of the contact resistance can be decreased. In other words, the on-state current of the transistor 490 can be increased.

Figure 9A:
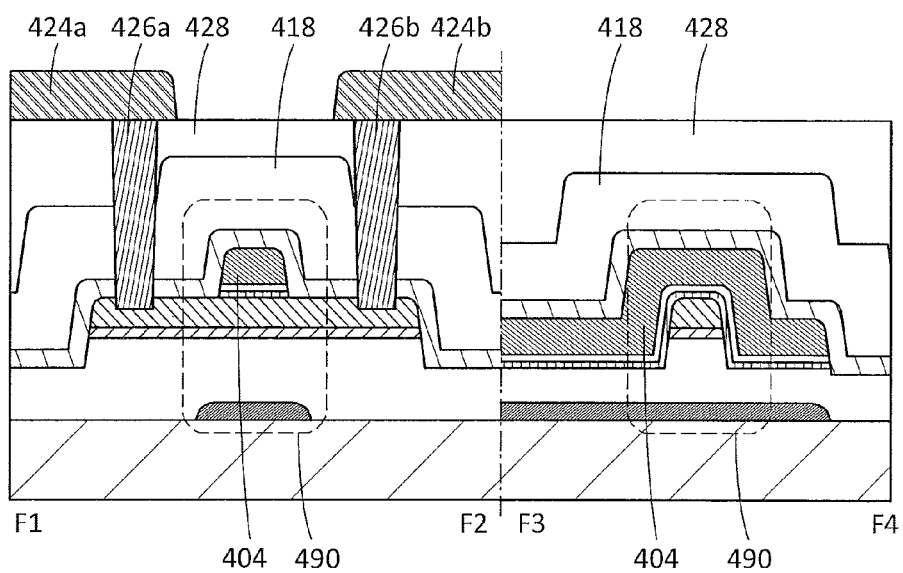
FIGS. 9A and 9B are cross-sectional views each illustrating a transistor of one embodiment of the present invention.

Alternatively, as in FIG. 9A, the transistor 490 does not necessarily include the low-resistance region 423a and the low-resistance region 423b, for example. In the transistor 490 without including the low-resistance region 423a and the low-resistance region 423b, the on-state current might be decreased but the short-channel effect can be reduced. A region between the conductor 404 and the conductor 426a (the conductor 426b) is referred to as an Loff region. For example, the length of each of the Loff regions is set to 50 nm or less, 20 nm or less, or 10 nm or less, in which case the on-state current of the transistor 490 hardly decreases in some cases even when the transistor 490 does not include the low-resistance region 423a and the low-resistance region 423b.

Figure 9B:
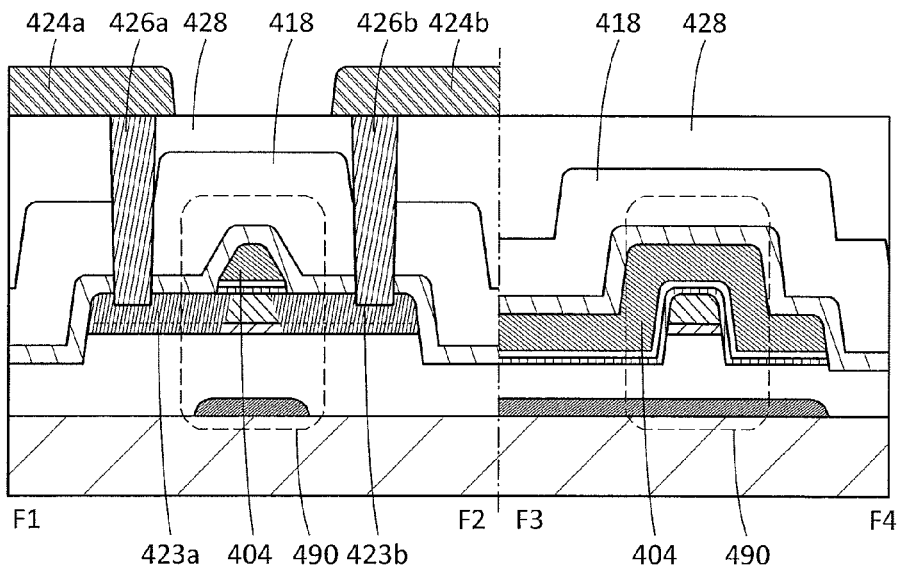

Alternatively, the conductor 404 of the transistor 490 may have a taper angle as illustrated in FIG. 9B, for example. In that case, for example, the low-resistance region 423a and the low-resistance region 423b have slopes in the depth direction in some cases.

Figure 10A:
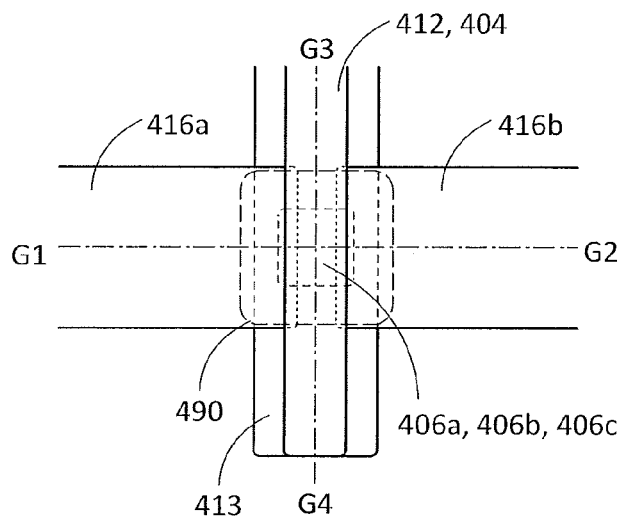
FIGS. 10A and 10B are a top view and a cross-sectional view which illustrate a transistor of one embodiment of the present invention.
Figure 10B:
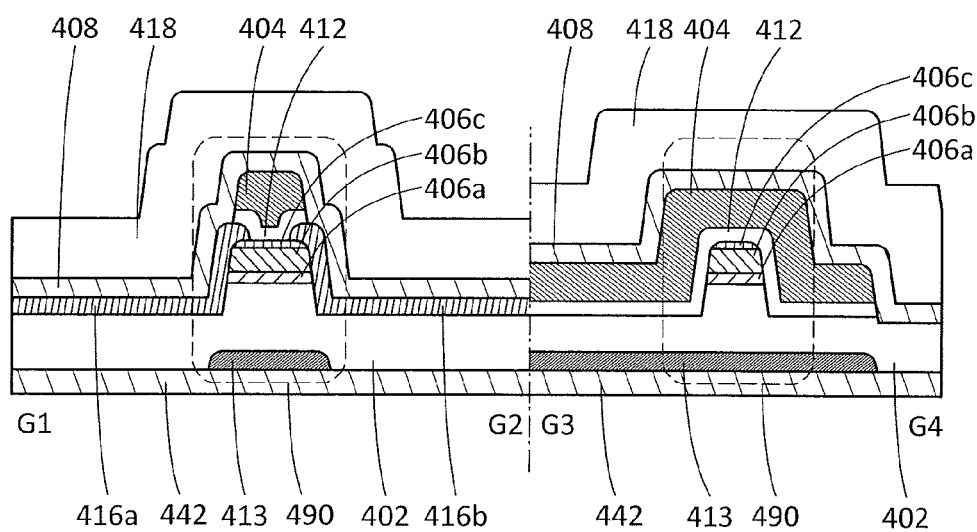

FIGS. 10A and 10B are a top view and a cross-sectional view of the transistor 490. FIG. 10A is the top view and FIG. 10B is the cross-sectional view taken along dashed-dotted line G1-G2 and dashed-dotted line G3-G4 in FIG. 10A. Note that for simplification of the drawing, some components are not illustrated in the top view of FIG. 10A.

The transistor 490 in FIGS. 10A and 10B includes the conductor 413 over the substrate 442; the insulator 402 having a projection over the substrate 442 and the conductor 413; the semiconductor 406a over the projection of the insulator 402; the semiconductor 406b over the semiconductor 406a; the semiconductor 406c over the semiconductor 406b; the conductor 416a and the conductor 416b which are in contact with the semiconductor 406a, the semiconductor 406b, and the semiconductor 406c and which are arranged to be separated from each other; the insulator 412 over the semiconductor 406c, the conductor 416a, and the conductor 416b; the conductor 404 over the insulator 412; the insulator 408 over the conductor 416a, the conductor 416b, the insulator 412, and the conductor 404; and the insulator 418 over the insulator 408.

The insulator 412 is in contact with at least side surfaces of the semiconductor 406b in the cross section taken along line G3-G4. The conductor 404 faces at least a top surface and the side surfaces of the semiconductor 406b with the insulator 412 provided therebetween in the cross section taken along line G3-G4. The conductor 413 faces a bottom surface of the semiconductor 406b through the insulator 402 provided therebetween. The insulator 402 does not necessarily include a projection. Furthermore, the semiconductor 406c, the insulator 408, or the insulator 418 is not necessarily provided.

The structure of the transistor 490 illustrated in FIGS. 10A and 10B is partly different from that of the transistor 490 in FIGS. 3A and 3B. Specifically, the structures of the semiconductors 406a to 406c of the transistor 490 illustrated in FIGS. 3A and 3B are different from the structures of the semiconductors 406a to 406c of the transistor 490 in FIGS. 10A and 10B. Thus, for the transistor in FIGS. 10A and 10B, the description of the transistor in FIGS. 3A and 3B can be referred to as appropriate.

Figure 11A:
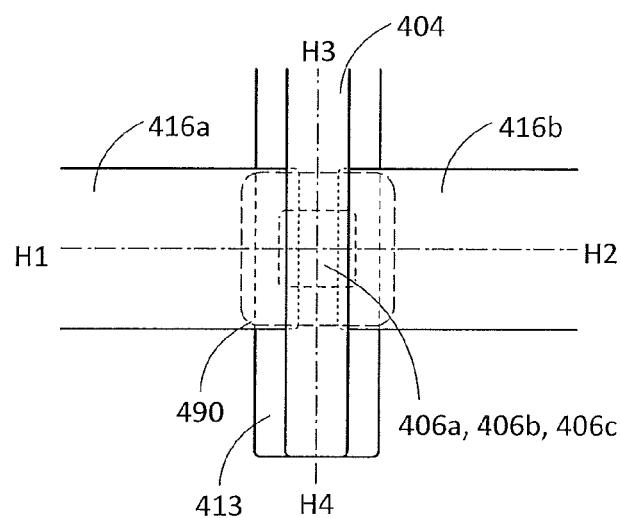
FIGS. 11A and 11B are a top view and a cross-sectional view which illustrate a transistor of one embodiment of the present invention.
Figure 11B:
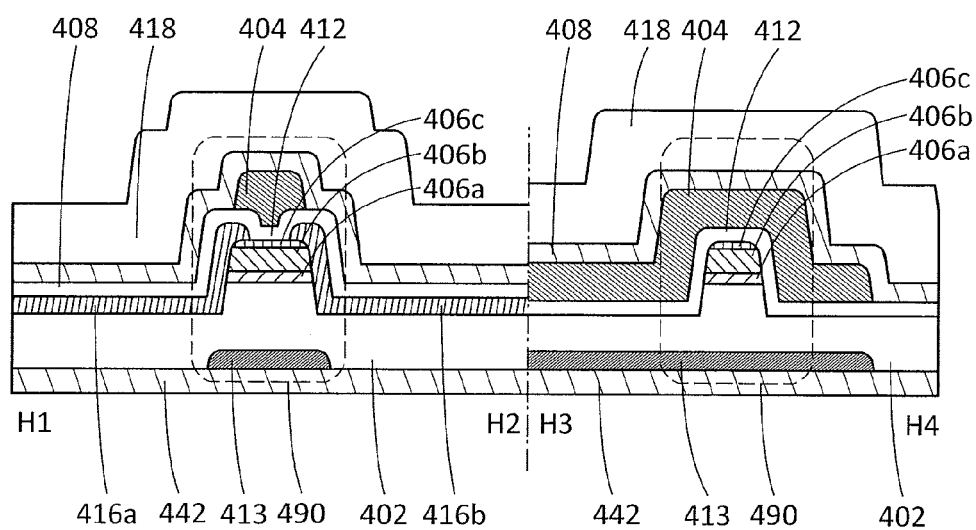

FIG. 11A is another example of the top view of the transistor 490. FIG. 11B is an example of a cross-sectional view taken along dashed-dotted line H1-H2 and dashed-dotted line H3-H4 in FIG. 11A. Note that some components such as an insulator are omitted in FIG. 11A for easy understanding.

Although an example where the insulator 412 and the conductor 404 have similar shapes in the top view in FIG. 10A is shown, a transistor structure of one embodiment of the present invention is not limited thereto. For example, as illustrated in FIGS. 11A and 11B, the insulator 412 may be provided over the insulator 402, the semiconductor 406c, the conductor 416a, and the conductor 416b.

<Method 1 for Manufacturing Transistor>

Next, an example of a method for manufacturing the transistor 490 illustrated in FIGS. 1A and 1B is described with reference to FIGS. 12A to 12C, FIGS. 13A to 13C, FIGS. 14A to 14C, and FIGS. 15A to 15C.

First, the substrate 442 is prepared. An insulator may be formed over the substrate 442.

Next, a conductor to be the conductor 413 is formed. The conductor to be the conductor 413 may be formed by a sputtering method, a CVD method, an MBE method, a PLD method, an ALD method, or the like.

Next, part of the conductor to be the conductor 413 is etched, so that the conductor 413 is formed.

Next, the insulator 402 is formed. The insulator 402 may be formed by a sputtering method, a CVD method, an MBE method, a PLD method, an ALD method, or the like. Note that here, the case where the top surface of the insulator 402 is planarized by a CMP method or the like is described. By planarizing the top surface of the insulator 402, the subsequent steps can be performed easily, and the yield of the transistor 490 can be increased. For example, by a CMP method, the RMS roughness of the insulator 402 is less than or equal to 1 nm, preferably less than or equal to 0.5 nm, more preferably less than or equal to 0.3 nm. Ra with the measurement area of 1 μm×1 μm is less than 1 nm, preferably less than 0.6 nm, more preferably less than 0.5 nm, still more preferably less than 0.4 nm. P–V with the measurement area of 1 μm×1 pin is less than 10 nm, preferably less than 9 nm, more preferably less than 8 nm, still more preferably less than 7 nm. The transistor 490 of one embodiment of the present invention is not limited to a transistor when the top surface of the insulator 402 is planarized.

The insulator 402 may be formed to contain excess oxygen. Alternatively, oxygen may be added after the insulator 402 is formed. The addition of oxygen may be performed by an ion implantation method at an acceleration voltage of higher than or equal to 2 kV and lower than or equal to 100 kV and at a dose of greater than or equal to $5 \times 10^{14}$ ions/cm$^2$ and less than or equal to $5 \times 10^{16}$ ions/cm$^2$, for example.

Note that in the case where the insulator 402 is a stacked-layer film, films in the stacked-layer film may be formed using by different formation methods such as the above formation methods. For example, the first film may be formed by a CVD method and the second film may be formed by an ALD method. Alternatively, the first film may be formed by a sputtering method and the second film may be formed by an ALD method. When films are formed by different formation methods as described above, the films can have different functions or different properties. Furthermore, by stacking the films, a more appropriate film can be formed as a stacked-layer film.

In other words, an n-th film (n is a natural number) is formed by at least one of a sputtering method, a CVD method, an MBE method, a PLD method, an ALD method, and the like, and an n+1-th film is formed by at least one of a sputtering method, a CVD method, an MBE method, a PLD method, an ALD method, and the like. Note that the n-th film and the n+1-th film may be formed by the same formation method or different formation methods. Note that the n-th film and the n+2-th film may be formed by the same formation method. Alternatively, all the films may be formed by the same formation method.

Figure 12A:
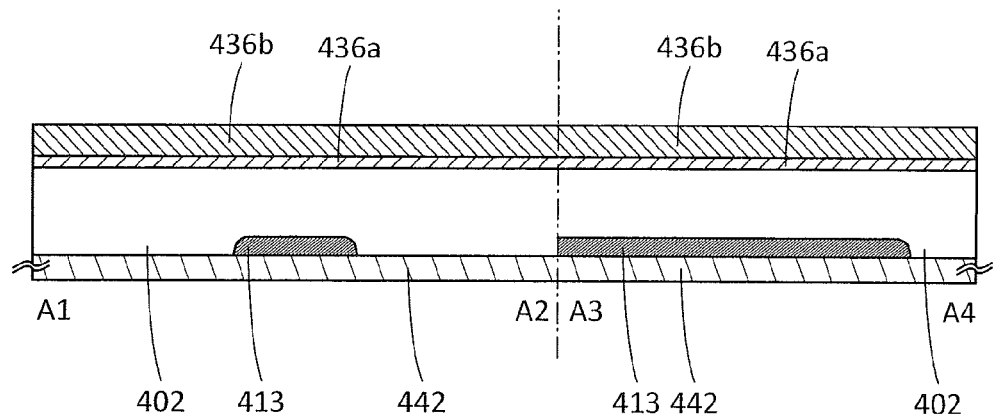
FIGS. 12A to 12C illustrate a method for manufacturing a transistor of one embodiment of the present invention.

Next, a semiconductor 436a to be the semiconductor 406a and a semiconductor 436b to be the semiconductor 406b are formed in this order (see FIG. 12A). The semiconductor to be the semiconductor 406a and the semiconductor to be the semiconductor 406b may be formed by a sputtering method, a CVD method, an MBE method, a PLD method, an ALD method, or the like.

In the case where In—Ga—Zn oxide layers are formed as the semiconductor 436a and the semiconductor 436b by an MOCVD method, trimethylindium, trimethylgallium, dimethylzinc, and the like may be used as the source gases. The source gas is not limited to the combination of these gases, triethylindium or the like may be used instead of trimethylindium. Triethylgallium or the like may be used instead of trimethylgallium. Diethylzinc or the like may be used instead of dimethylzinc.

Next, first heat treatment is preferably performed. Heat treatment is preferable because, for example, excess oxygen in the insulator 402 is moved to the semiconductor 406b through the semiconductor 406a to reduce oxygen vacancies in the semiconductor 406b. In this case, the semiconductor 406a is preferably a layer having an oxygen-transmitting property (a layer through which oxygen passes or is transmitted).

Oxygen is released from the insulator 402 and taken into the semiconductor 406a by heat treatment or the like. In some cases, oxygen exists and is apart from atoms in the semiconductor 406a, or exists and is bonded to oxygen or the like. As the density becomes lower, i.e., the number of spaces between the atoms becomes larger, the semiconductor 406a has a higher oxygen-transmitting property. For example, in the case where the semiconductor 406a has a layered crystal structure and oxygen movement in which oxygen crosses the layer is less likely to occur, the semiconductor 406a is preferably a layer having low crystallinity as appropriate.

The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor 436a and crystallinity of the semiconductor 436b can be increased and impurities such as hydrogen and water can be removed.

Figure 12B:
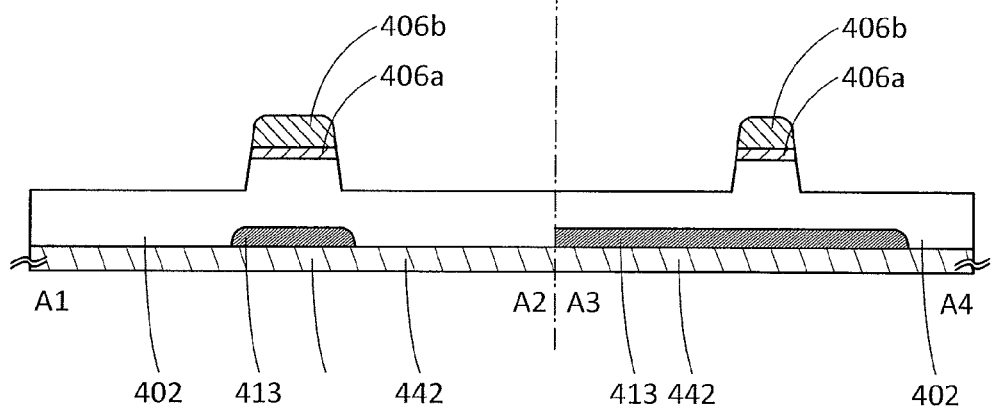

Next, a mask is formed and the semiconductor 436a and the semiconductor 436b are etched using the mask, so that the semiconductor 406a and the semiconductor 406b are formed (see FIG. 12B). A photoresist can be used as the mask. Alternatively, a hard mask may be used as the mask. A specific example of using a hard mask is described with reference to FIG. 20B.

Next, a conductor 416 is formed. The conductor 416 may be formed by a sputtering method, a CVD method, an MBE method, a PLD method, an ALD method, or the like.

The conductor 416a and the conductor 416b are formed in such a manner that the conductor 416 is formed and then partly etched. Therefore, it is preferable to employ a formation method by which the semiconductor 406b is not damaged when the conductor 416 is formed. In other words, the conductor 416 is preferably formed by an MCVD method or the like.

Note that in the case where the conductor 416 is a stacked-layer film, films in the stacked-layer film may be formed by different formation methods such as a sputtering method, a CVD method (a plasma CVD method, a thermal CVD method, an MCVD method, an MOCVD method, or the like), an MBE method, a PLD method, and an ALD method. For example, the first film may be formed by an MOCVD method and the second film may be formed by a sputtering method. Alternatively, the first film may be formed by an ALD method and the second film may be formed by an MOCVD method. Alternatively, the first film may be fainted by an ALD method and the second film may be formed by a sputtering method. Alternatively, the first film may be formed by an ALD method, the second film may be formed by a sputtering method, and the third film may be formed by an ALD method. When films are formed by different formation methods as described above, the films can have different functions or different properties. Furthermore, by stacking the films, a more appropriate film can be formed as a stacked-layer film In other words, in the case where the conductor 416 is a stacked-layer film, for example, an n-th film (n is a natural number) is formed by at least one of a sputtering method, a CVD method (a plasma CVD method, a thermal CVD method, an MCVD method, an MOCVD method, or the like), an MBE method, a PLD method, an ALD method, and the like and an n+1-th film is formed by at least one of a sputtering method, a CVD method (a plasma CVD method, a thermal CVD method, an MCVD method, an MOCVD method, or the like), an MBE method, a PLD method, an ALD method, and the like. Note that the n-th film and the n+1-th film may be formed by different formation methods. Note that the n-th film and the n+2-th film may be formed by the same formation method. Alternatively, all the films may be formed by the same formation method.

Note that the conductor 416 or at least one of the films in the stacked-layer film of the conductor 416 and the semiconductor to be the semiconductor 406a or the semiconductor to be the semiconductor 406b may be formed by the same formation method. For example, both of them may be formed by an ALD method. Thus, they can be formed without exposure to the air. As a result, entry of impurities can be prevented.

Note that the conductor 416 or at least one of the films in the stacked-layer film of the conductor 416, the semiconductor to be the semiconductor 406a or the semiconductor to be the semiconductor 406b, and the insulator 402 or at least one of the films in the stacked-layer film of the insulator 402 may be formed by the same formation method. For example, all of them may be formed by a sputtering method.

Thus, they can be formed without exposure to the air. As a result, entry of impurities can be prevented. Note that a method for manufacturing a semiconductor device of one embodiment of the present invention is not limited thereto.

Figure 13A:
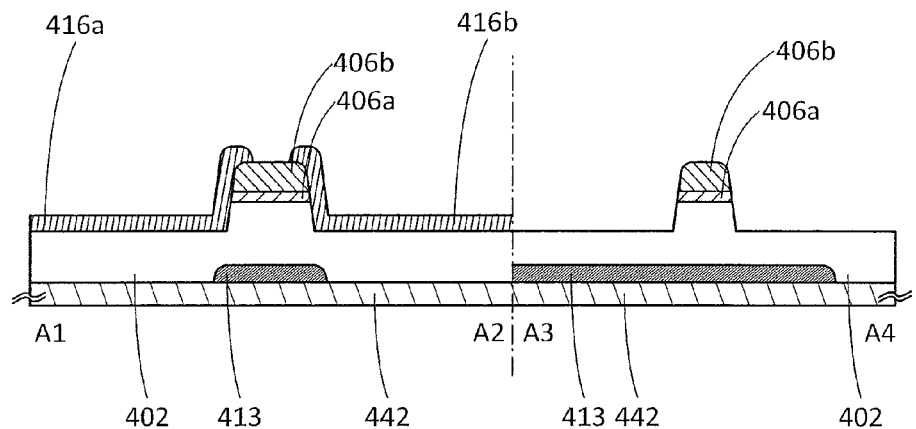
FIGS. 13A to 13C illustrate a method for manufacturing a transistor of one embodiment of the present invention.

Next, a mask is formed, and a conductor to be the conductor 416a and the conductor 416b is etched using the mask, so that the conductor 416a and the conductor 416b are formed (see FIG. 13A).

Figure 13B:
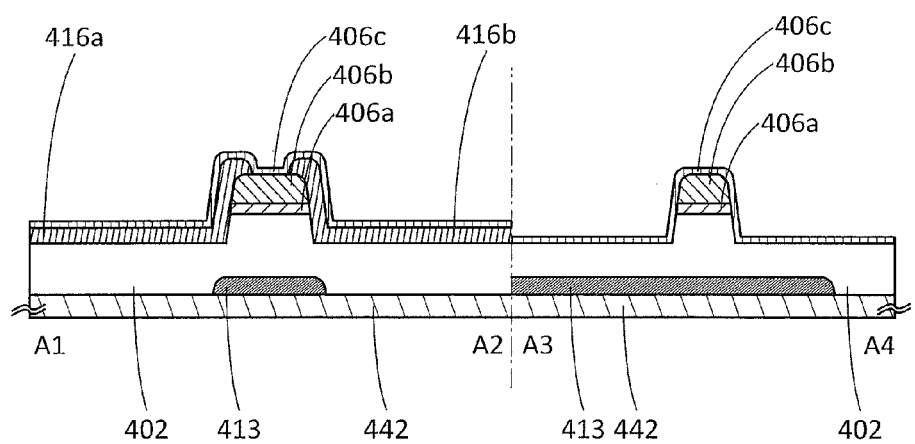

Next, a semiconductor to be the semiconductor 406c is formed (see FIG. 13B). The semiconductor to be the semiconductor 406c can be formed by a sputtering method, a CVD method, an MBE method, a PLD method, an ALD method, or the like.

In the case where an In—Ga—Zn oxide layer is formed as the semiconductor to be the semiconductor 406c by an MOCVD method, trimethylindium, trimethylgallium, dimethylzinc, or the like may be used as the source gases. The source gas is not limited to the above combination of these gases, triethylindium or the like may be used instead of trimethylindium. Triethylgallium or the like may be used instead of trimethylgallium. Diethylzinc or the like may be used instead of dimethylzinc.

Next, second heat treatment may be performed. For example, as the semiconductor 406a, a semiconductor whose oxygen-transmitting property is higher than that of the semiconductor to be the semiconductor 406c is selected. That is, as the semiconductor to be the semiconductor 406c, a semiconductor whose oxygen-transmitting property is lower than that of the semiconductor 406a is selected. In other words, as the semiconductor 406a, a semiconductor having a function of passing oxygen is selected. As the semiconductor to be the semiconductor 406c, a semiconductor having a function of blocking oxygen is selected. In this case, by the second heat treatment, excess oxygen in the insulator 402 is moved to the semiconductor 406b through the semiconductor 406a. The semiconductor 406b is covered with the semiconductor to be the semiconductor 406c; thus, outward diffusion of excess oxygen is less likely to occur. Therefore, by performing the second heat treatment at this time, defects (oxygen vacancies) in the semiconductor 406b can be efficiently reduced. Note that the second heat treatment may be performed at a temperature such that excess oxygen (oxygen) in the insulator 402 is diffused into the semiconductor 406b. For example, the description of the first heat treatment may be referred to for the second heat treatment. The second heat treatment is preferably performed at a temperature lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulator 402 can be inhibited.

Here, it is preferable that hydrogen be reduced as much as possible as well as the oxygen vacancies in the semiconductor 406b. For example, hydrogen in the semiconductor 406b can be reduced by the heat treatment. As the temperature of the heat treatment is higher, the hydrogen concentration can be reduced, which is preferable.

On the other hand, for example, by heat treatment after the conductor 416a and the conductor 416b are formed, a wiring material is oxidized and the resistance of the wiring material is increased in some cases. Therefore, in some cases, it is preferable to make, in particular, the temperature of the heat treatment after the conductor 416a and the conductor 416b are formed low. The temperature of the heat treatment is preferably low also in terms of manufacturing costs.

Here, the case where hydrogen trapped by oxygen vacancies in the semiconductor 406b is removed is described. Hydrogen trapped by oxygen vacancies in the semiconductor 406b is preferably released from trapping sites and diffused into the outside of the semiconductor 406b.

Here, for example, by adding excess oxygen to the semiconductor 406b or the semiconductor 406c, oxygen enters oxygen vacancies trapped by hydrogen, so that hydrogen can be easily released in some cases. By adding excess oxygen to the semiconductor 406c, oxygen in the semiconductor 406c may be diffused into the semiconductor 406b. By adding oxygen, oxygen vacancies are reduced and hydrogen can be reduced at a lower temperature in some cases. By adding oxygen, the hydrogen concentration in the semiconductor 406b can be made lower in some cases.

Added oxygen and hydrogen are bonded to form water; thus, hydrogen is easily removed from the semiconductor 406b in some cases.

Here, in the case where a region with a high oxygen concentration is formed in the semiconductor 406b or the semiconductor 406c over the semiconductor 406b by adding oxygen, the region might be damaged. For example, when oxygen is injected to the semiconductor 406b or the semiconductor 406c over the semiconductor 406b by applying acceleration voltage by an ion implantation method or the like, a defect might occur in the injection process.

Here, for example, a layer 420 is provided above the semiconductor 406b and a region with a high oxygen concentration is formed in the layer 420, so that damage to the semiconductor 406b can be reduced, which is preferable. For example, high-concentration oxygen is added to the layer 420 provided above the semiconductor 406b and then, oxygen is diffused into the layer 420 to be moved to the semiconductor 406b, so that damage to the semiconductor 406b can be reduced.

By adding oxygen after the layer 420 is provided over the semiconductor 406b, contamination in a step of adding oxygen can be prevented, for example. Specifically, attachment or entry of an element other than oxygen from a treatment chamber or a transfer system of an apparatus can be prevented, for example.

Figure 13C:
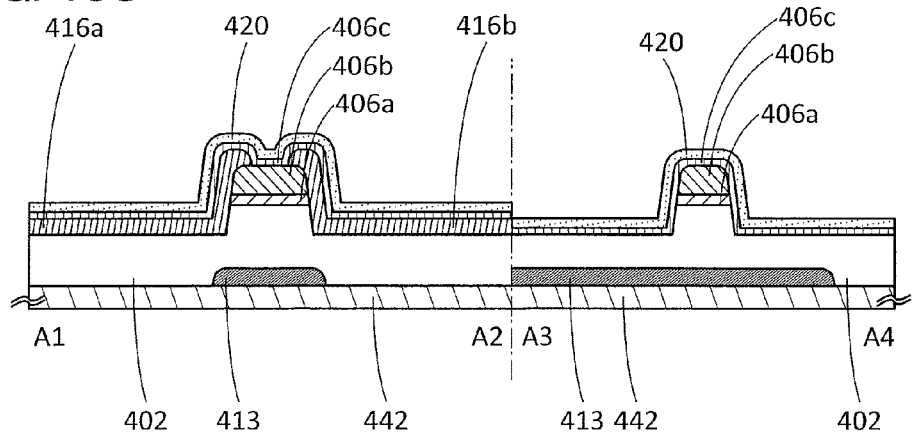

In an example illustrated in FIG. 13C, the semiconductor 406c is provided over the semiconductor 406b, and the layer 420 is formed over the semiconductor 406c. Here, as described later, the layer 420 may be formed before the semiconductor 406c is provided.

The layer 420 preferably has a high hydrogen-transmitting property.

As the layer 420, an insulator, a semiconductor, or the like can be used. As the layer 420, a metal oxide can be used, for example. The layer 420 may be formed to have a single layer or stacked layers using an oxide containing, for example, boron, carbon, fluorine, magnesium, aluminum, silicon, phosphorus, chlorine, argon, titanium, vanadium, chromium, manganese, cobalt, nickel, copper, zinc, gallium, germanium, yttrium, zirconium, niobium, molybdenum, ruthenium, indium, tin, lanthanum, neodymium, hafnium, tantalum, or tungsten. For the layer 420, titanium oxide, manganese oxide, zinc oxide, gallium oxide, molybdenum oxide, indium oxide, tin oxide, tungsten oxide, or the like may be used, for example. For the layer 420, for example, silicon oxide, silicon nitride, silicon oxynitride, silicon nitride oxide, or the like can be used.

For the layer 420, an oxide containing at least one or more of indium, the element M, and zinc can be used. For the layer 420, for example, an In—Ga oxide, an In—Zn oxide, a Zn—Ga oxide, a Zn—Sn oxide, an In—Ga—Zn oxide, an In—Sn—Zn oxide, or an In—Hf—Zn oxide may be used. In particular, it is preferable to use an In—Ga—Zn oxide containing Ga more than In, an In—Ga—Zn oxide in which the Ga content is twice as much as the In content, or an In—Ga—Zn oxide in which the Ga content is three times as much as the In content in an atomic ratio.

For the layer 420, the material that is described as that of the insulator 412 can be used.

Figure 14A:
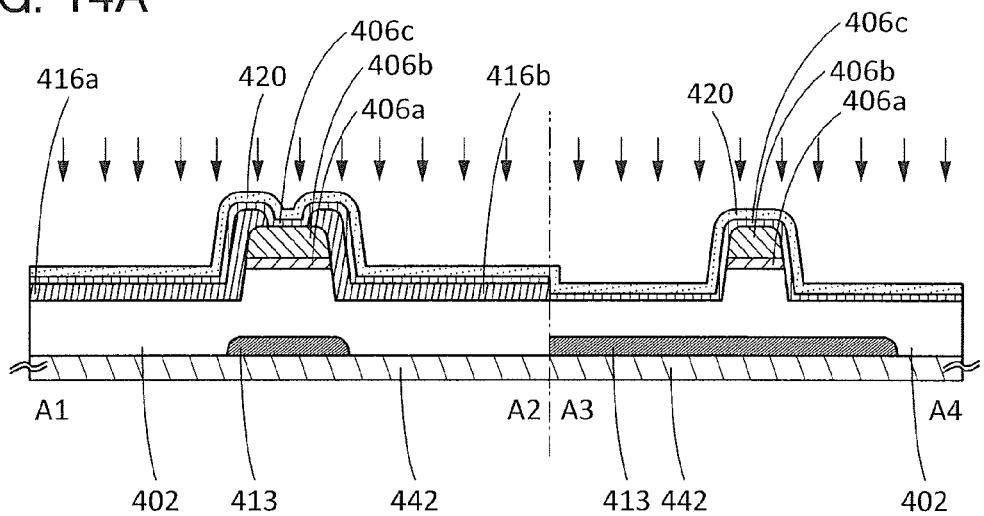
FIGS. 14A to 14C illustrate a method for manufacturing a transistor of one embodiment of the present invention.

Next, oxygen is added (see FIG. 14A). Oxygen can be added by an ion implantation method, plasma treatment, or the like. As the ion implantation method, a mass-separation method may be used. $O^+$ ions or $O_2^+$ ions can be mainly used, for example.

After oxygen is added, heat treatment may be performed. By heat treatment, oxygen is easily diffused into the semiconductor 406b in some cases.

Figure 14B:
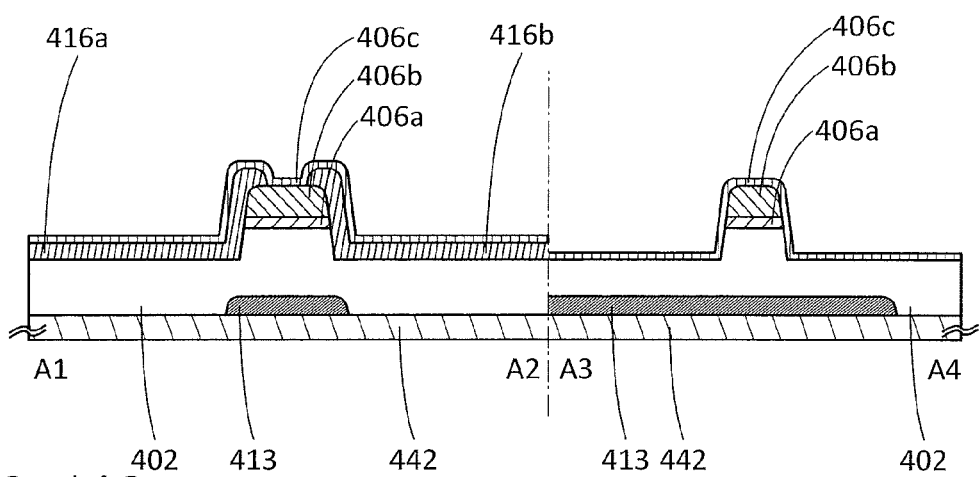

Next, the layer 420 is removed (see FIG. 14B). Wet etching or dry etching can be used for removing the layer 420. For example, wet etching is preferable because it is a simple method and does not cause damage due to plasma or the like.

In the case where the etching selectivity of the layer 420 to a film under the layer 420, e.g., the semiconductor 406c or the semiconductor 406b is low, dry etching is preferably used. The layer 420 is etched by dry etching with a high etching selectivity, so that the layer 420 can be removed with good controllability in some cases.

Figure 14C:
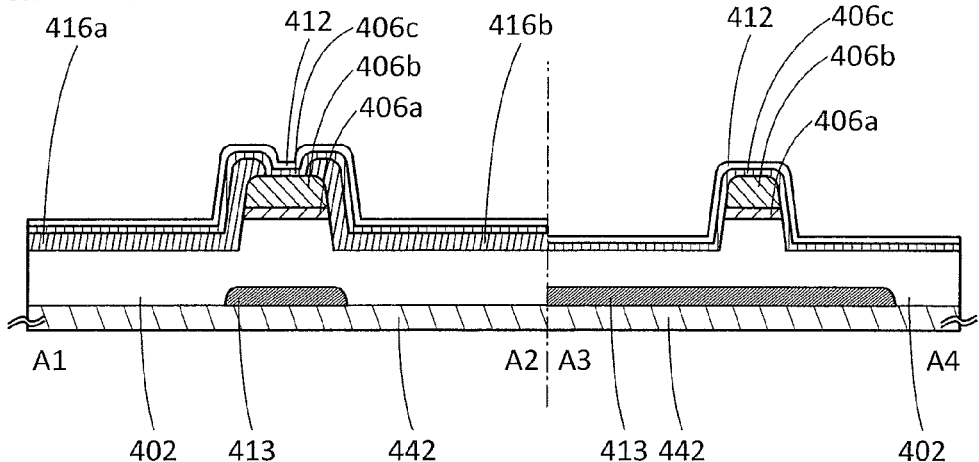

Next, an insulator to be the insulator 412 is formed (see FIG. 14C). The insulator to be the insulator 412 may be formed by a sputtering method, a CVD method, an MBE method, a PLD method, an ALD method, or the like.

Note that in the case where the insulator to be the insulator 412 is a stacked-layer film, films in the stacked-layer film may be formed by different formation methods such as a sputtering method, a CVD method (a plasma CVD method, a thermal CVD method, an MCVD method, an MOCVD method, or the like), an MBE method, a PLD method, and an ALD method. For example, the first film may be formed by an MOCVD method and the second film may be formed by a sputtering method. Alternatively, the first film may be formed by an ALD method and the second film may be formed by an MOCVD method. Alternatively, the first film may be formed by an ALD method and the second film may be formed by a sputtering method. Alternatively, the first film may be formed by an ALD method, the second film may be formed by a sputtering method, and the third film may be formed by an ALD method. Thus, when films are formed by different formation methods, the films can have different functions or different properties. Furthermore, by stacking the films, a more appropriate film can be formed as a stacked-layer film.

In other words, in the case where the insulator to be the insulator 412 is a stacked-layer film, for example, an n-th film (n is a natural number) is formed by at least one of a sputtering method, a CVD method (a plasma CVD method, a thermal CVD method, an MCVD method, an MOCVD method, or the like), an MBE method, a PLD method, an ALD method, and the like and an n+1-th film is formed by at least one of a sputtering method, a CVD method (a plasma CVD method, a thermal CVD method, an MCVD method, an MOCVD method, or the like), an MBE method, a PLD method, an ALD method, and the like. Note that the n-th film and the n+1-th film may be formed by different formation methods. Note that the n-th film and the n+2-th film may be formed by the same formation method. Alternatively, all the films may be formed by the same formation method.

Next, oxygen addition may be performed through the insulator 412. For a method of adding oxygen, the above-described method of adding oxygen can be referred to.

Next, third heat treatment may be performed. For example, as the semiconductor 406a, a semiconductor whose oxygen-transmitting property is higher than that of the semiconductor to be the semiconductor 406c is selected. That is, as the semiconductor to be the semiconductor 406c, a semiconductor whose oxygen-transmitting property is lower than that of the semiconductor 406a. As the semiconductor to be the semiconductor 406c, a semiconductor having a function of blocking oxygen is selected. For example, as the semiconductor 406a, a semiconductor whose oxygen-transmitting property is higher than that of the insulator to be the insulator 412 is selected. That is, as the insulator to be the insulator 412, a semiconductor whose oxygen-transmitting property is lower than that of the semiconductor 406a is selected. In other words, as the semiconductor 406a, a semiconductor having a function of passing oxygen is selected. As the insulator to be the insulator 412, an insulator having a function of blocking oxygen is selected. In this case, by the third heat treatment, excess oxygen in the insulator 402 is moved to the semiconductor 406b through the semiconductor 406a. The semiconductor 406b is covered with the semiconductor to be the semiconductor 406c and the insulator to be the insulator 412; thus, outward diffusion of excess oxygen is less likely to occur. Therefore, by performing the third heat treatment at this time, defects (oxygen vacancies) in the semiconductor 406b can be efficiently reduced. Note that the third heat treatment may be performed at a temperature such that excess oxygen (oxygen) in the insulator 402 is diffused into the semiconductor 406b. For example, the description of the first heat treatment may be referred to for the third heat treatment. The third heat treatment is preferably performed at a temperature lower than that of the first heat treatment. The third heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulator 402 can be inhibited. Note that in the case where the insulator 408 has a function of blocking oxygen, the semiconductor 406c and/or the insulator 412 does not necessarily have a function of blocking oxygen.

Next, a conductor to be the conductor 404 is formed. The conductor to be the conductor 404 may be formed by a sputtering method, a CVD method, an MBE method, a PLD method, an ALD method, or the like.

The insulator to be the insulator 412 functions as a gate insulator of the transistor 490. Therefore, the conductor to be the conductor 404 is preferably formed by a formation method by which the insulator to be the insulator 412 is not damaged when the conductor to be the conductor 404 is formed. In other words, the conductor is preferably formed by an MCVD method or the like.

Note that in the case where the conductor to be the conductor 404 is a stacked-layer film, films in the stacked-layer film may be formed by different formation methods such as a sputtering method, a CVD method (a plasma CVD method, a thermal CVD method, an MCVD method, an MOCVD method, or the like), an MBE method, a PLD method, and an ALD method. For example, the first film may be formed by an MOCVD method and the second film may be formed by a sputtering method. Alternatively, the first film may be formed by an ALD method and the second film may be formed by an MOCVD method. Alternatively, the first film may be formed by an ALD method and the second film may be formed by a sputtering method. Alternatively, the first film may be formed by an ALD method, the second film may be formed by a sputtering method, and the third film may be formed by an ALD method. Thus, when films are formed by different formation methods, the films can have different functions or different properties. Furthermore, by stacking the films, a more appropriate film can be formed as a stacked-layer film.

In other words, in the case where the conductor to be the conductor 404 is a stacked-layer film, for example, an n-th film (n is a natural number) is formed by at least one of a sputtering method, a CVD method (a plasma CVD method, a thermal CVD method, an MCVD method, an MOCVD method, or the like), an MBE method, a PLD method, an ALD method, and the like and an n+1-th film is formed by at least one of a sputtering method, a CVD method (a plasma CVD method, a thermal CVD method, an MCVD method, an MOCVD method, or the like), an MBE method, a PLD method, an ALD method, and the like. Note that the n-th film and the n+1-th film may be formed by different formation methods. Note that the n-th film and the n+2-th film may be formed by the same formation method. Alternatively, all the films may be formed by the same formation method.

Note that the conductor to be the conductor 404 or at least one of the films in the stacked-layer film of the conductor to be the conductor 404 and the insulator to be the insulator 412 or at least one of the films in the stacked-layer film of the insulator to be the insulator 412 may be formed by the same formation method. For example, both of them may be formed by an ALD method. Thus, they can be formed without exposure to the air. As a result, entry of impurities can be prevented. For example, the conductor to be the conductor 404 and the insulator to be the insulator 412 which are in contact with each other may be formed by the same formation method. Thus, the formation can be performed in the same chamber. As a result, entry of impurities can be prevented.

Note that the conductor to be the conductor 404 or at least one of the films in the stacked-layer film of the conductor to be the conductor 404 and the insulator to be the insulator 412 or at least one of the films in the stacked-layer film of the insulator to be the insulator 412 may be formed by the same formation method. For example, all of them may be formed by a sputtering method. Thus, they can be formed without exposure to the air. As a result, entry of impurities can be prevented.

Figure 15A:
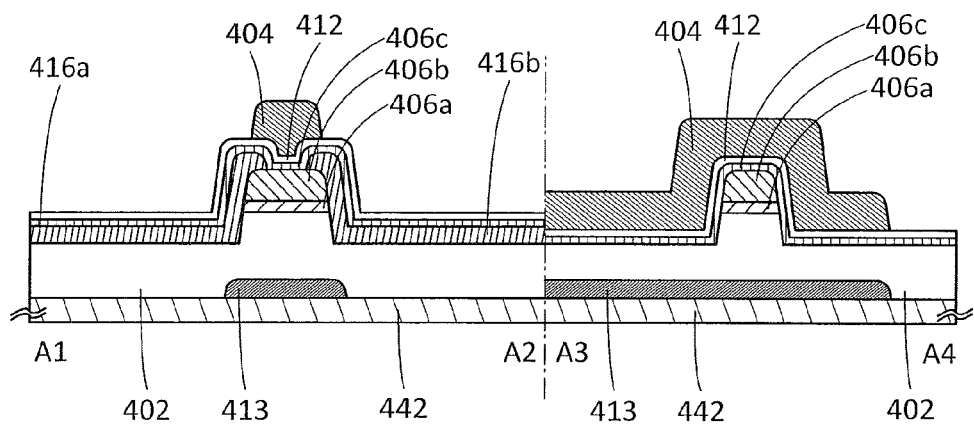
FIGS. 15A to 15C illustrate a method for manufacturing a transistor of one embodiment of the present invention.

Next, the conductor to be the conductor 404 is partly etched, so that the conductor 404 is formed (see FIG. 15A). The conductor 404 is formed to overlap with at least part of the semiconductor 406b.

Next, the insulator 408 is formed. The insulator 408 may be formed by a sputtering method, a CVD method, an MBE method, a PLD method, an ALD method, or the like.

Next, fourth heat treatment may be performed. For example, as the semiconductor 406a, a semiconductor whose oxygen-transmitting property is higher than that of the semiconductor 406c is selected. In other words, as the semiconductor 406c, a semiconductor whose oxygen-transmitting property is lower than that of the semiconductor 406a is selected. As the semiconductor 406c, a semiconductor having a function of blocking oxygen is selected. For example, as the semiconductor 406a, a semiconductor whose oxygen-transmitting property is higher than that of the insulator 412 is selected. In other words, as the insulator 412, a semiconductor whose oxygen-transmitting property is lower than that of the semiconductor 406a is selected. For example, as the semiconductor 406a, a semiconductor whose oxygen-transmitting property is higher than that of the insulator 408 is selected. That is, as the insulator 408, a semiconductor whose oxygen-transmitting property is lower than that of the semiconductor 406a is selected. In other words, as the semiconductor 406a, a semiconductor having a function of passing oxygen is selected. As the insulator 408, an insulator having a function of blocking oxygen is selected. In this case, by the fourth heat treatment, excess oxygen in the insulator 402 is moved to the semiconductor 406b through the semiconductor 406a. The semiconductor 406b is covered with any of the semiconductor 406c, the insulator 412, and the insulator 408; thus, outward diffusion of excess oxygen is less likely to occur. Therefore, by performing the fourth heat treatment at this time, defects (oxygen vacancies) in the semiconductor 406b can be efficiently reduced. Note that the fourth heat treatment may be performed at a temperature such that excess oxygen (oxygen) in the insulator 402 is diffused into the semiconductor 406b. For example, the description of the first heat treatment may be referred to for the fourth heat treatment. The fourth heat treatment is preferably performed at a temperature lower than that of the first heat treatment. The fourth heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulator 402 can be inhibited. Note that in the case where the insulator 408 has a function of blocking oxygen, the semiconductor 406c and/or the insulator 412 does not necessarily have a function of blocking oxygen.

One or more of the first heat treatment, the second heat treatment, the third heat treatment, and the fourth heat treatment are not necessarily performed.

Figure 15B:
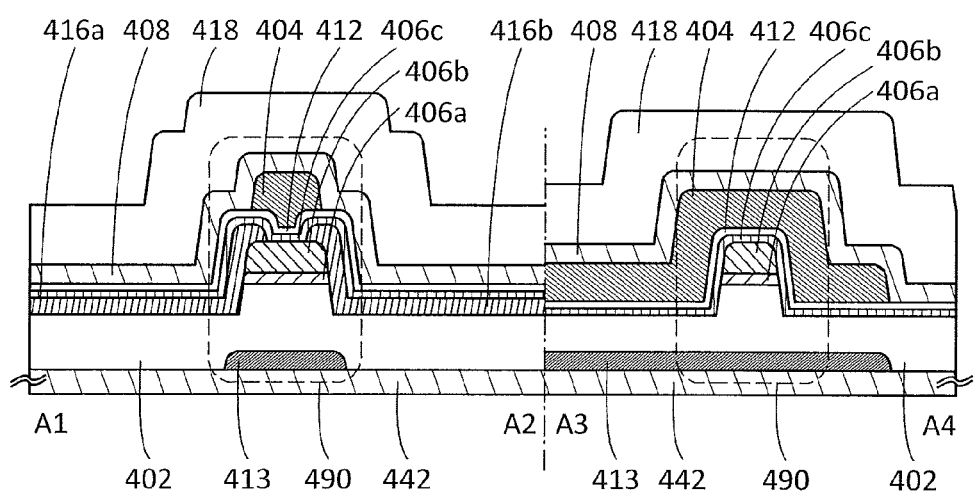

Next, the insulator 418 is formed (see FIG. 15B). The insulator 418 may be formed by a sputtering method, a CVD method, an MBE method, a PLD method, an ALD method, or the like.

Figure 20A:
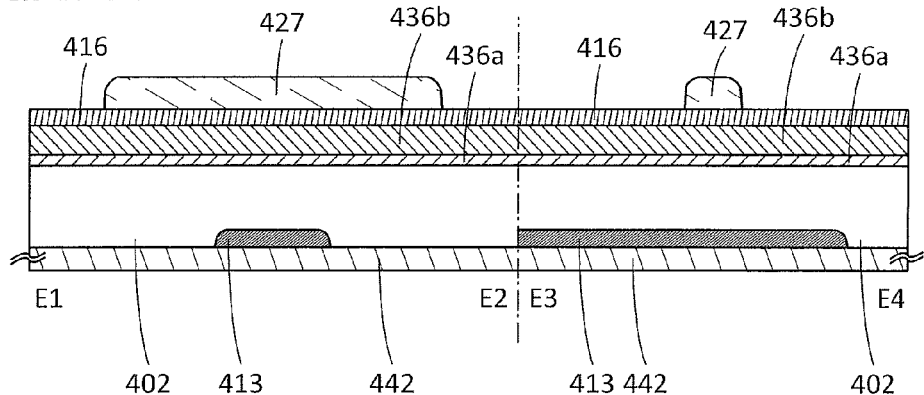
FIGS. 20A to 20C illustrate a method for manufacturing a transistor of one embodiment of the present invention.
Figure 20B:
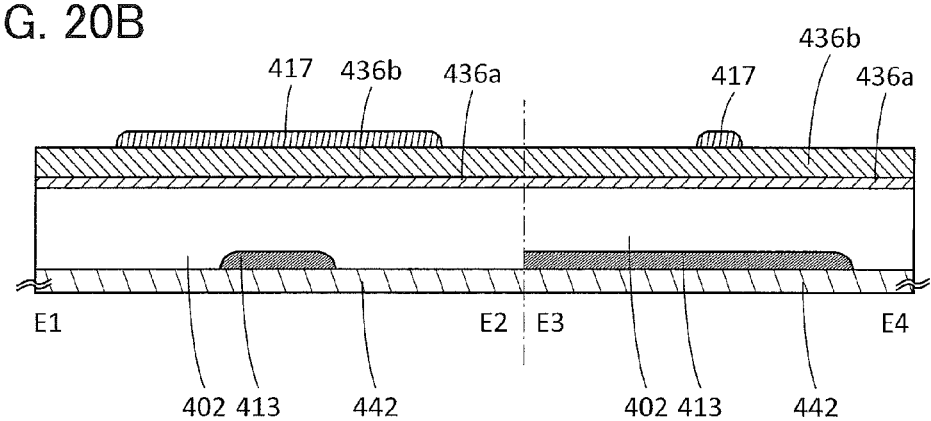
Figure 20C:
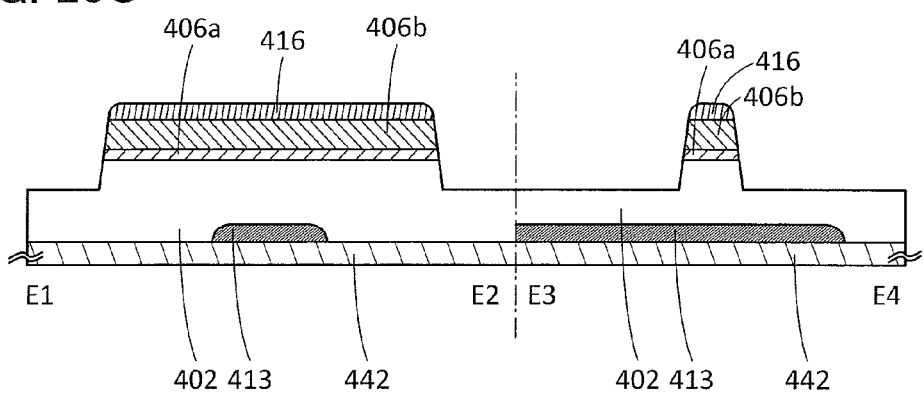

Through the above steps, the transistor 490 illustrated in FIGS. 20A to 20C can be manufactured.

Figure 15C:
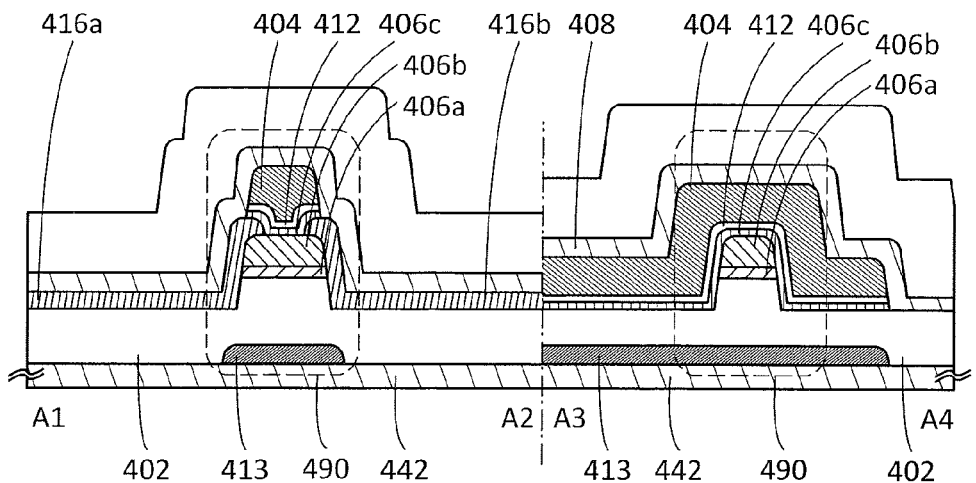

Note that part of the insulator 412 and part of the semiconductor 406c may be etched in a manner similar to that of the conductor to be the conductor 404 after the step in FIG. 14C. In this case, in the transistor 490, as illustrated in FIG. 15C, an end surface of the conductor 404, an end surface of the insulator 412, and an end surface of the semiconductor 406c can be substantially smoothly continuous. The conductor to be the conductor 404, the insulator to be the insulator 412, and the semiconductor to be the semiconductor 406c may be partly etched through the same photolithography process, for example. Alternatively, the insulator to be the insulator 412 and the semiconductor to be the semiconductor 406c may be etched using the conductor 404 as a mask. Thus, the conductor 404, the insulator 412, and the semiconductor 406c have similar shapes in the top view. The insulator 412 and/or the semiconductor 406c may project as compared with the conductor 404 as illustrated in the enlarged cross-sectional view in FIG. 17C or the conductor 404 may project as compared with the insulator 412 and/or the semiconductor 406c as illustrated in the enlarged cross-sectional view in FIG. 17D. With such a shape, shape defects are reduced and gate leakage current can be reduced in some cases.

<Method 2 for Manufacturing Transistor>

Next, as a modification example of the method 1, a method for manufacturing the transistor 490 illustrated in FIGS. 1A and 1B is described with reference to FIGS. 12A to 12C, FIGS. 16A to 16C, and FIGS. 17A to 17D.

In the method 1, the layer 420 is found after the semiconductor 406c is provided. An example where the layer 420 is formed before the semiconductor 406c is provided is described below.

Figure 12C:
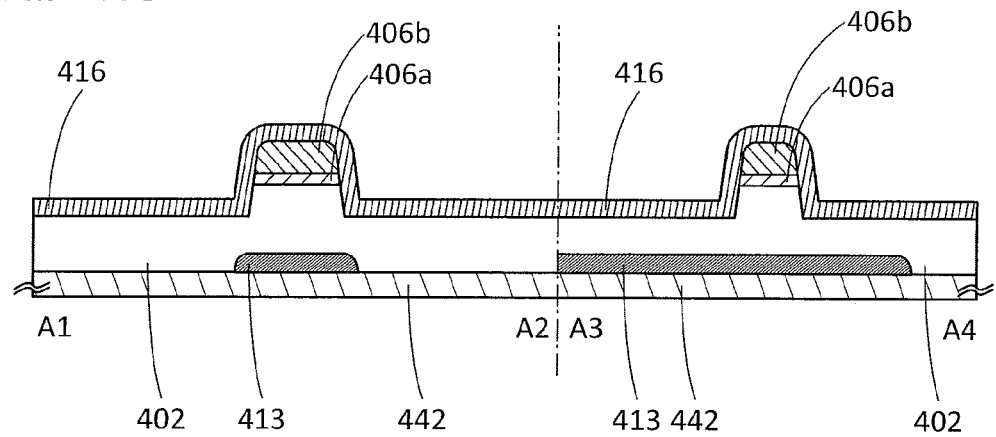

First, through the steps described in FIGS. 12A to 12C, the substrate 442, the conductor 413, the insulator 402, the semiconductor 406a, the semiconductor 406b, the conductor 416a, and the conductor 416b are formed.

Next, the layer 420 is formed. Then, oxygen is added (see FIG. 16B).

After oxygen is added, heat treatment may be performed. By heat treatment, oxygen is easily diffused into the semiconductor 406b in some cases.

Figure 16A:
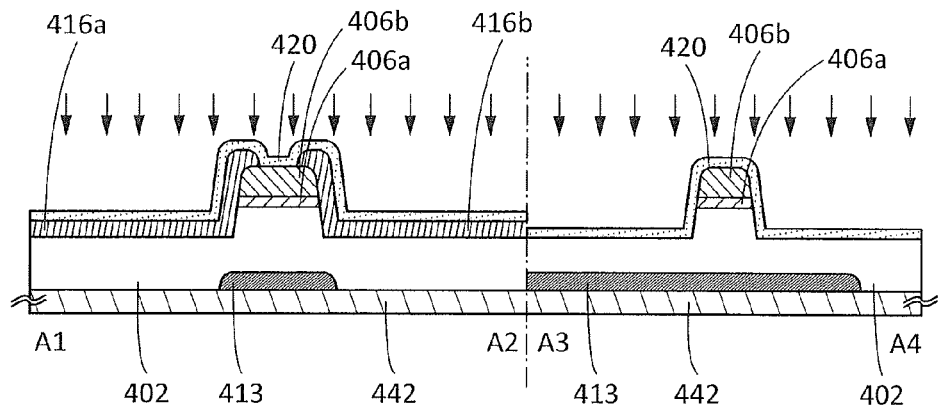
FIGS. 16A to 16C illustrate a method for manufacturing a transistor of one embodiment of the present invention.
Figure 16B:
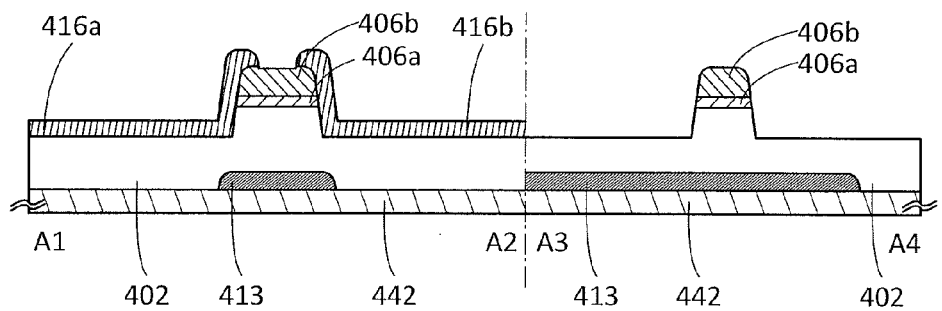
Figure 16C:
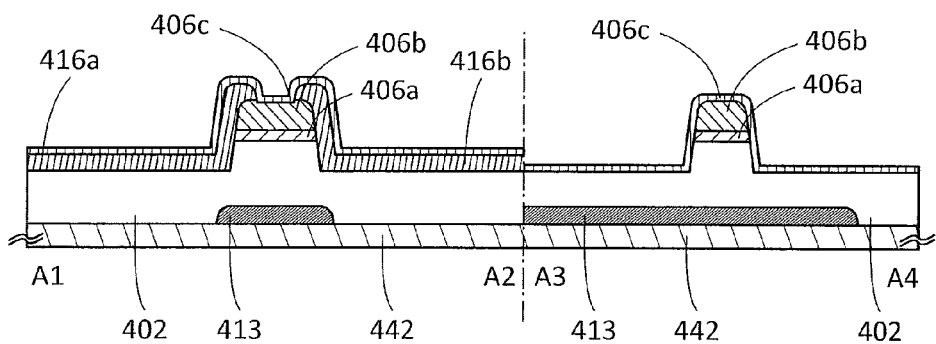

Next, the layer 420 is removed (see FIG. 16C). The above method can be referred to for the material that can be used for the layer 420, formation of the layer 420, the subsequent addition of oxygen, and the subsequent removal of the layer 420.

Next, the semiconductor 406c is formed.

To improve the characteristics of the transistor 490, a film denser than the semiconductor 406b is preferably used as the semiconductor 406c in some cases. Alternatively, a film having a higher hydrogen-transmitting property than that of the semiconductor 406b is preferably used as the semiconductor 406c in some cases. Further alternatively, a film having a lower oxygen-transmitting property than that of the semiconductor 406b is preferably used as the semiconductor 406c in some cases. On the other hand, when such a film is used as the semiconductor 406c, hydrogen released from the semiconductor 406a and the semiconductor 406b is blocked by the semiconductor 406c, and the hydrogen concentrations in the semiconductor 406a and the semiconductor 406b are less likely to be reduced in some cases. Furthermore, oxygen is less likely to be diffused from layers over the semiconductor 406c.

Therefore, the following manner illustrated in FIGS. 16A to 16C is preferable because the hydrogen concentrations in the semiconductors 406a and 406b can be reduced: after the semiconductors 406a and 406b are formed, the layer 420 is formed, oxygen is added to reduce oxygen vacancies and hydrogen in the semiconductors 406a and 406b, the layer 420 is removed, and then, the semiconductor 406c is provided.

Here, it is preferable that in the case where the layer 420 is formed over the semiconductor 406b, oxygen is added, and then the layer 420 is removed by etching as illustrated in FIG. 16B, the semiconductor 406b be less likely to be removed by the etching. That is, the etching rate of the layer 420 is preferably higher than that of the semiconductor 406b. Damage to a surface of the semiconductor 406b caused by the etching is preferably small.

Alternatively, in the etching step of the layer 420, a top surface of the semiconductor 406b may be etched. For example, in the case where damage to the vicinity of the surface of the semiconductor 406b or entry of an element included in the layer 420 to the vicinity of the surface of the semiconductor 406b occur when the layer 420 is formed, the damage or the element can be removed by etching the top surface of the semiconductor 406b.

Here, the case where a film containing at least one or more of indium, the element M, and zinc is used as the layer 420 and the semiconductor 406b is described.

The difference between the proportion of indium contained in the layer 420 and the proportion of indium contained in the semiconductor 406b is preferably large. For example, the proportion of indium contained in the layer 420 is preferably less than or equal to 0.6 times, more preferably less than or equal to 0.3 times as large as the proportion of indium contained in the semiconductor 406b. Alternatively, the proportion of indium contained in the layer 420 is preferably greater than or equal to 1.5 times, more preferably greater than or equal to 3 times as large as the proportion of indium contained in the semiconductor 406b, for example.

Here, the proportion of indium means the ratio of indium atoms to the total number of atoms contained in indium, the element M, and zinc. The same applies to the proportion of the element M and the proportion of zinc.

Alternatively, the difference between the proportion of the element M contained in the layer 420 and the proportion of the element M contained in the semiconductor 406b is preferably large. For example, the proportion of the element M contained in the layer 420 is preferably less than or equal to 0.6 times, more preferably less than or equal to 0.3 times as large as the proportion of the element M contained in the semiconductor 406b. Alternatively, the proportion of the element M contained in the layer 420 is preferably greater than or equal to 1.5 times, more preferably greater than or equal to 3 times as large as the proportion of the element M contained in the semiconductor 406b.

Alternatively, the difference between the proportion of zinc contained in the layer 420 and the proportion of zinc contained in the semiconductor 406b is preferably large. For example, the proportion of zinc contained in the layer 420 is preferably less than or equal to 0.6 times, more preferably less than or equal to 0.3 times as large as the proportion of zinc contained in the semiconductor 406b. Alternatively, the proportion of zinc contained in the layer 420 is preferably greater than or equal to 1.5 times, more preferably greater than or equal to 3 times as large as the proportion of zinc contained in the semiconductor 406b.

By increasing the difference between the layer 420 and the semiconductor 406b in the proportion of indium, the element M, or zinc, the etching selectivity can be increased and a reduction in the thickness of the semiconductor 406b can be suppressed when the layer 420 is removed by dry etching, for example. By increasing the difference between the layer 420 and the semiconductor 406b in the proportions of these elements, the processing accuracy can be further increased in some cases. For example, when the dry etching is monitored by performing spectroscopic analysis on light emission of plasma due to reaction species, the timing when the etching of the layer 420 is almost finished and the process is switched to the etching of the semiconductor 406b under the layer 420 is easily detected; thus, the etching amount of the semiconductor 406b can be small.

By increasing the proportion of zinc contained in the layer 420 to be higher than that in the semiconductor 406b, the wet etching rate of the layer 420 can be higher than that of the semiconductor 406b in some cases, when acid or alkali is used as an etchant of the wet etching, for example. As the acid-based chemical solution, a solution containing phosphoric acid or a solution containing oxalic acid can be used, for example. As the solution containing phosphoric acid, an acid containing phosphoric acid, acetic acid, nitric acid, and pure water can be used, for example. The proportions of phosphoric acid, acetic acid, nitric acid, and pure water may be, for example, 85:5:5:5 in volume percentage. As the alkali solution, ammonia hydrogen peroxide mixture (a solution in which ammonia water and hydrogen peroxide water are mixed) can be used.

As the conductors 416a and 416b, a metal nitride such as tantalum nitride or a platinum-based material such as platinum, ruthenium, or iridium is preferably used because resistance against wet etching of the layer 420 can be increased.

As the layer 420, a film having a higher hydrogen-transmitting property than the semiconductor 406c is preferably used.

A structure in which the layer 420 contains indium and the semiconductor 406c does not contain indium may be employed, for example. Gallium oxide is preferably used for the semiconductor 406c. For example, when gallium oxide is used for the semiconductor 406c, a transistor with a lower off-state current can be obtained.

Next, the insulator 412 is formed.

Next, oxygen addition may be performed through the insulator 412. For a method of adding oxygen, the above-described method of adding oxygen can be referred to.

Next, heat treatment may be performed.

Figure 17A:
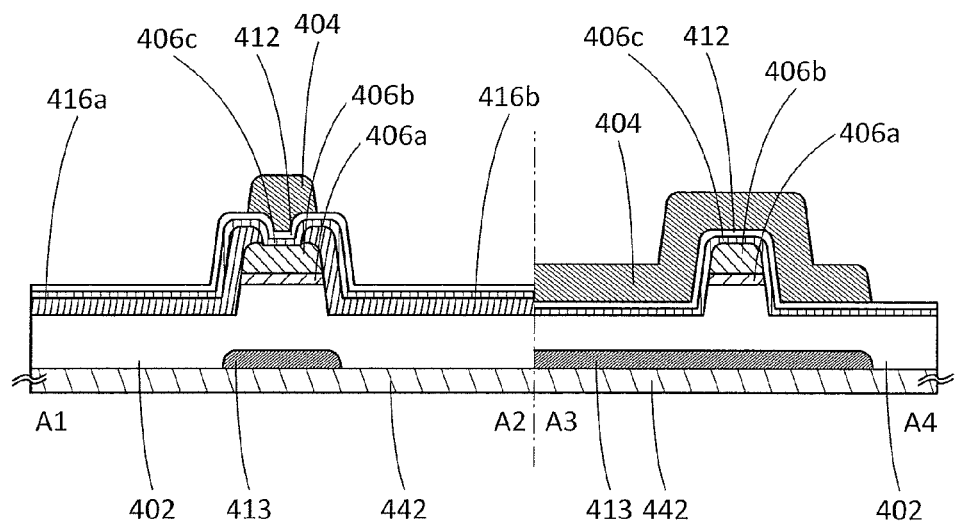
FIGS. 17A to 17D illustrate a method for manufacturing a transistor of one embodiment of the present invention.
Figure 17B:
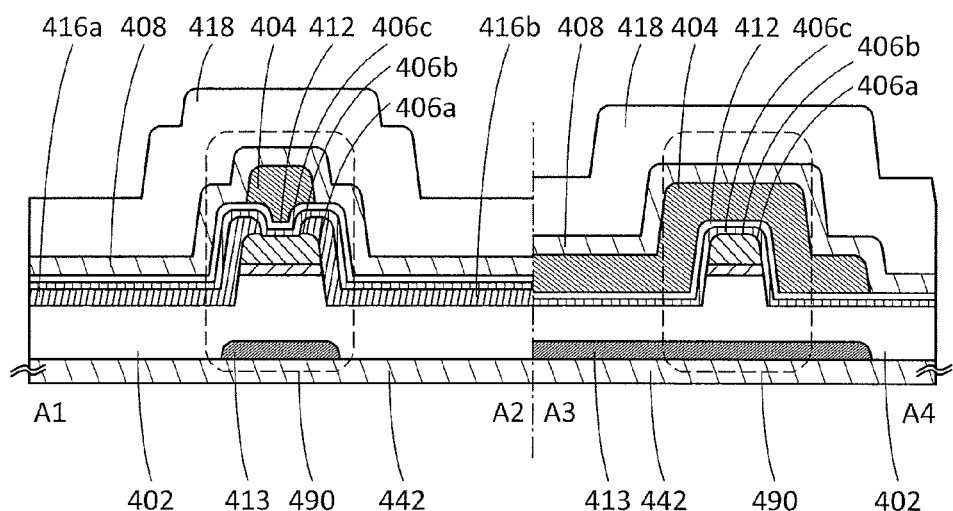
Figure 17C:
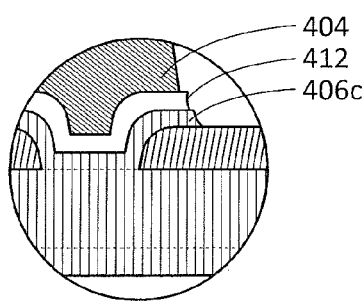
Figure 17D:
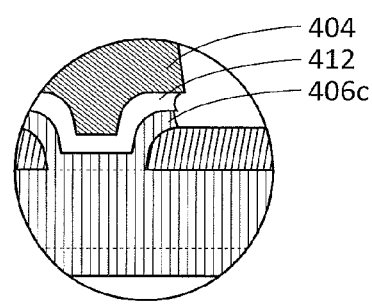

Next, the conductor 404 is formed (see FIG. 17A). The conductor 404 is formed to overlap with at least part of the semiconductor 406b.

Next, the insulator 408 is formed. After the insulator 408 is formed, heat treatment may be performed. Next, the insulator 418 is formed (see FIG. 17B). Through the above steps, the transistor 490 illustrated in FIGS. 1A and 1B can be manufactured.

<Method 3 for Manufacturing Transistor>

Next, as a modification example of the above two methods, a method for manufacturing the transistor 490 illustrated in FIGS. 1A and 1B is described with reference to FIGS. 18A to 18C and FIGS. 19A and 19B. In the following manufacturing method, the conductors 416a and 416b are formed after the layer 420 is removed.

Figure 18A:
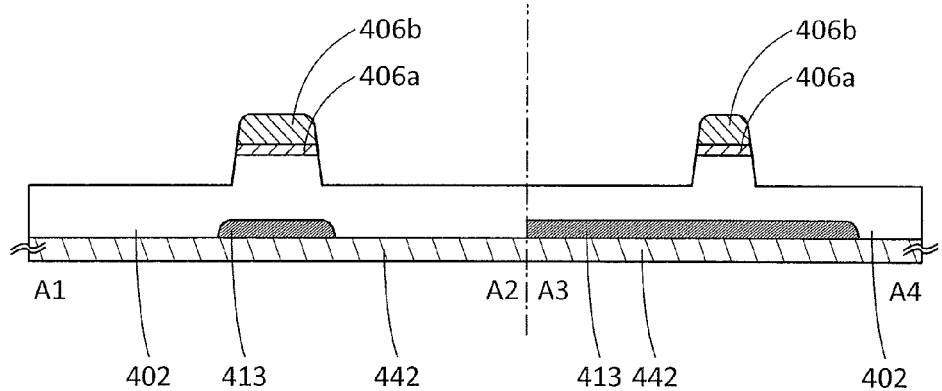
FIGS. 18A to 18C illustrate a method for manufacturing a transistor of one embodiment of the present invention.

The substrate 442, the conductor 413, the insulator 402, the semiconductor 406a, and the semiconductor 406b are formed through the steps illustrated in FIGS. 12A and 12B (see FIG. 18A).

Figure 18B:
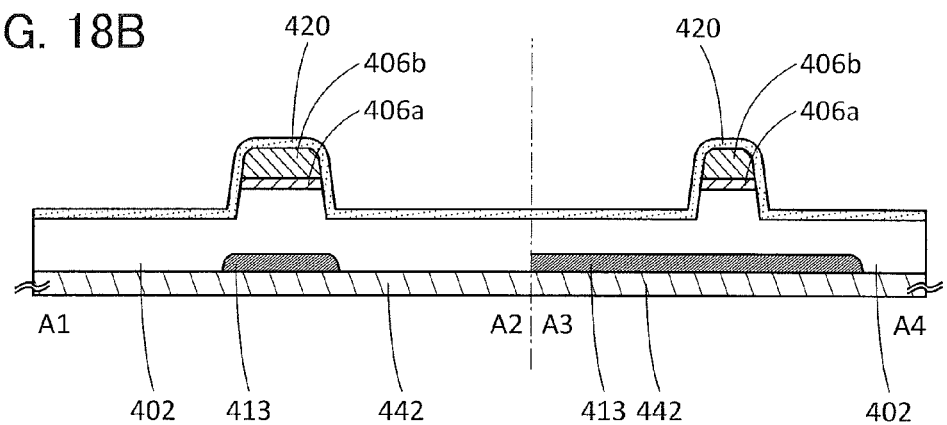
Figure 18C:
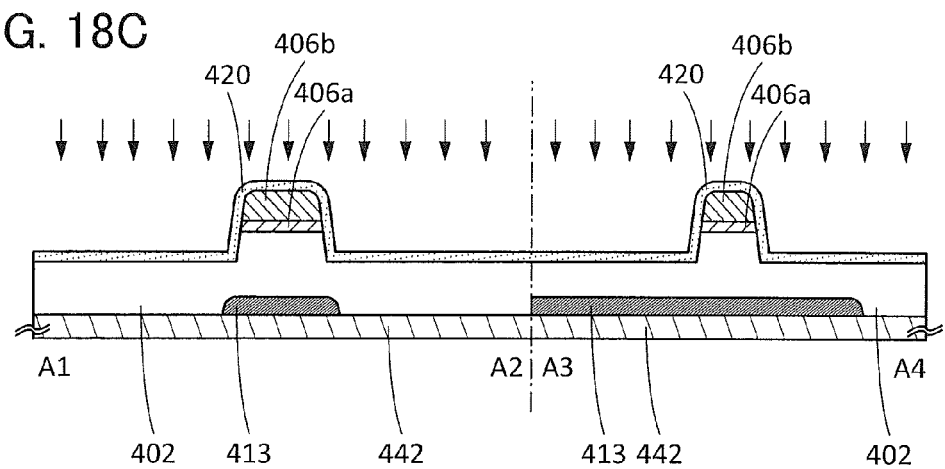

Next, the layer 420 is formed (see FIG. 18B). Next, oxygen is added (see FIG. 18C).

After oxygen is added, heat treatment may be performed. By heat treatment, oxygen is easily diffused into the semiconductor 406b in some cases.

Next, the layer 420 is removed. The above method can be referred to for the material that can be used for the layer 420, formation of the layer 420, the subsequent addition of oxygen, and the subsequent removal of the layer 420.

Figure 19A:
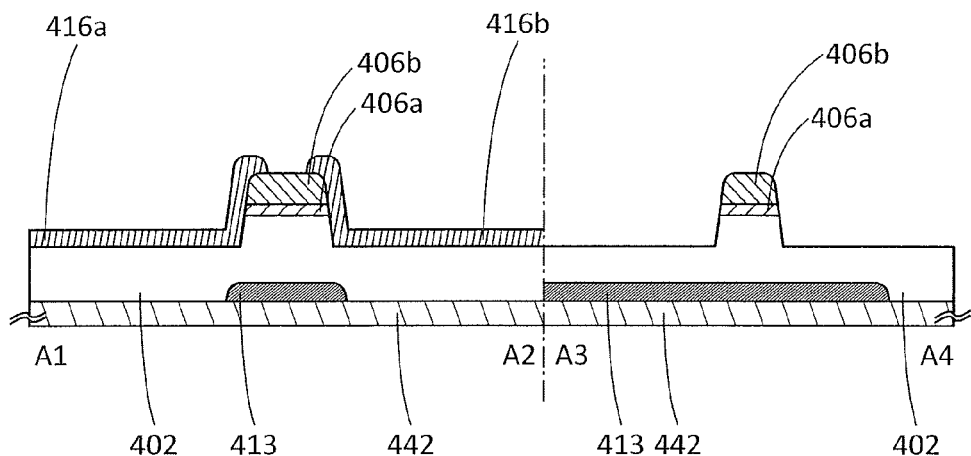
FIGS. 19A and 19B illustrate a method for manufacturing a transistor of one embodiment of the present invention.

Next, the conductors 416a and 416b are formed (see FIG. 19A). By fainting the conductors 416a and 416b in a step after oxygen is added, the following can be suppressed, for example: the conductors 416a and 416b react with oxygen and the reacted region is insulated. Furthermore, for example, since high etching selectivity to the conductors 416a and 416b does not need to be considered in the etching conditions of the layer 420, the number of choices of an etchant used for wet etching, a gas used for dry etching, and the like can be increased; thus, etching is easily performed in some cases.

Figure 19B:
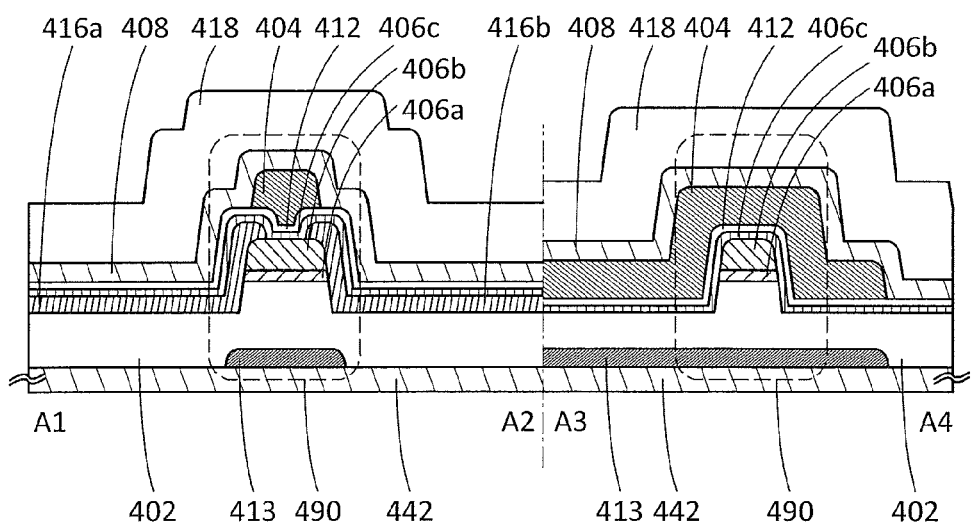

Next, steps after the step illustrated in FIG. 19B are described. For the following steps, the above manufacturing method can be referred to.

First, the semiconductor 406c is formed. After the semiconductor 406c is formed, heat treatment may be performed.

Next, the insulator 412 is formed.

Next, oxygen addition may be performed through the insulator 412. For a method of adding oxygen, the above-described method of adding oxygen can be referred to.

Next, heat treatment may be performed.

Next, the conductor 404 is formed. Note that the conductor 404 is formed to overlap with at least part of the semiconductor 406b. Next, the insulator 408 is formed. After the insulator 408 is formed, heat treatment may be performed. Next, the insulator 418 is formed (see FIG. 19B). Through the above steps, the transistor 490 illustrated in FIGS. 1A and 1B can be manufactured.

<Method 4 for Manufacturing Transistor>

Next, an example of a method for manufacturing the transistor 490 illustrated in FIGS. 2A and 2B is described with reference to FIGS. 20A to 20C and FIGS. 21A to 21C.

First, the insulator 552, the conductor 413, the insulator 402, the semiconductor 436a to be the semiconductor 406a, and the semiconductor 436b to be the semiconductor 406b are formed in the step illustrated in FIG. 12A.

Next, the conductor 416 is formed. For a method for forming the conductor 416, any of the above manufacturing methods may be referred to. Next, a mask 427 is formed (see FIG. 20A). For the mask 427, a photoresist may be used. Note that for the mask 427, a bottom anti-reflective coating (BARC) film may be provided as a base of a photoresist. When the bottom anti-reflective coating film is provided, defects due to halation can be suppressed and a minute defect can be obtained.

Next, the conductor 416 is etched using the mask 427, whereby a conductor 417 is formed (see FIG. 20B). Here, the conductor 417 is referred to as a hard mask in some cases. To form the conductor 417 having a minute shape, the mask 427 having a minute shape needs to be formed. When the mask 427 having a minute shape is too thick, the mask might fall down; therefore, the mask 427 preferably includes a region with a thickness small enough to be self-standing. The conductor 416 to be etched using the mask 427 preferably has a thickness small enough to be etched under conditions that the mask 427 can withstand. Since the conductor 416 becomes the conductor 416a and the conductor 416b serving as a source electrode and a drain electrode of the transistor 490, the conductor 416 preferably has a certain thickness such that the on-state current of the transistor 490 is high. Accordingly, the conductor 416 includes a region with a thickness of, for example, greater than or equal to 5 nm and less than or equal to 30 nm, preferably greater than or equal to 5 nm and less than or equal to 20 nm, more preferably greater than or equal to 5 nm and less than or equal to 15 nm.

Next, the semiconductor 436a and the semiconductor 436b are etched using the conductor 417 as a mask, so that the semiconductor 406a and the semiconductor 406b are formed. At this time, when the insulator 402 is etched, an s-channel structure is likely to be formed (see FIG. 20C).

Figure 21A:
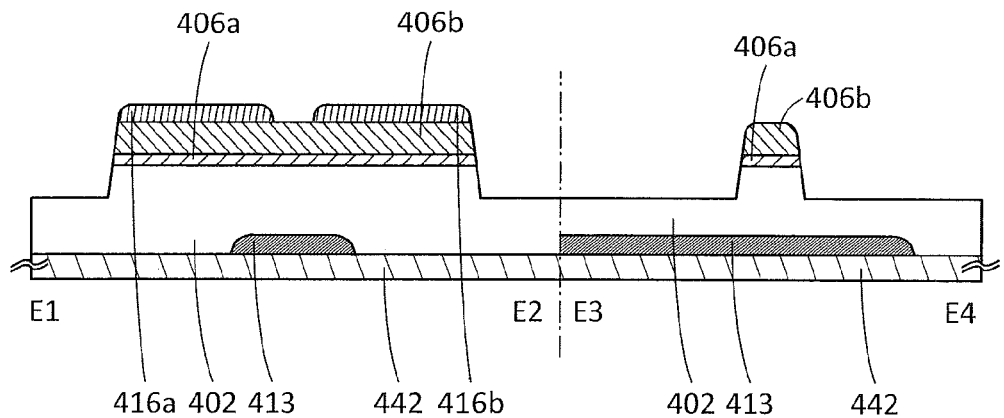
FIGS. 21A to 21C illustrate a method for manufacturing a transistor of one embodiment of the present invention.

Next, part of the conductor 417 is etched, so that the conductor 416a and the conductor 416b are formed (see FIG. 21A). As described above, the conductor 416 formed as a mask for etching the semiconductor 436a and the semiconductor 436b becomes the conductor 416a and the conductor 416b serving as the source electrode and the drain electrode of the transistor 490. Since the conductor 416 to be the conductor 416a and the conductor 416b is also used as a mask, the number of steps for manufacturing the transistor 490 can be reduced. The transistor 490 has a structure suitable for a miniaturized semiconductor device because the area occupied by the conductor 416a and the conductor 416b can be small.

Figure 21B:
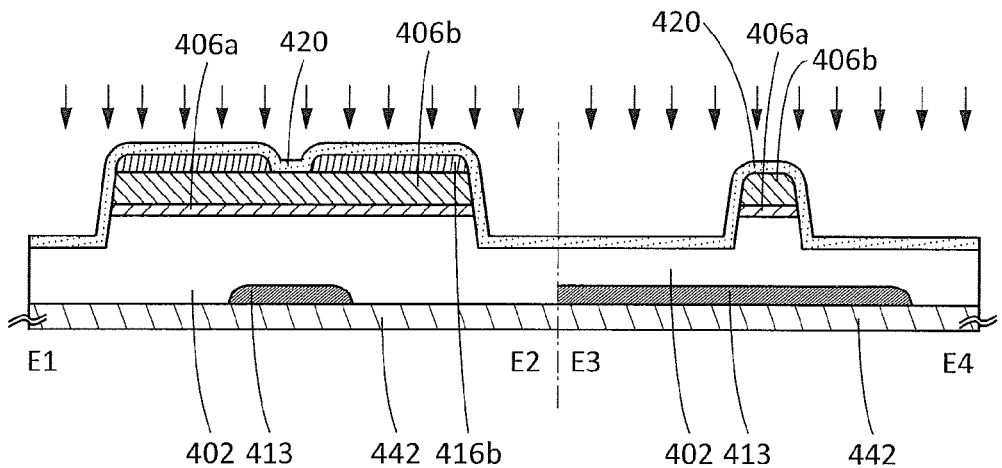

Next, steps after the step illustrated in FIG. 21B are described. For the following steps, the above manufacturing method can be referred to.

First, the layer 420 is formed. For a material that can be used for the layer 420, the description for any of the above manufacturing methods may be referred to. Next, oxygen is added (see FIG. 21B).

After oxygen is added, heat treatment may be performed. By heat treatment, oxygen is easily diffused into the semiconductor 406b in some cases.

Next, the layer 420 is removed. Next, a semiconductor film to be the semiconductor 406c is formed. Heat treatment may be performed after the semiconductor film is formed.

Next, an insulating film to be the insulator 412 is formed.

Next, oxygen addition may be performed through the insulator 412. For a method of adding oxygen, the above-described method of adding oxygen can be referred to.

Next, heat treatment may be performed.

Next, a conductive film to be the conductor 404 is formed.

Next, the conductive film to be the conductor 404 is partly etched, so that the conductor 404 is formed. The conductor 404 is formed to overlap with at least part of the semiconductor 406b.

Next, in a manner similar to that of the conductive film to be the conductor 404, the insulating film to be the insulator 412 is partly etched, so that the insulator 412 is formed.

Figure 21C:
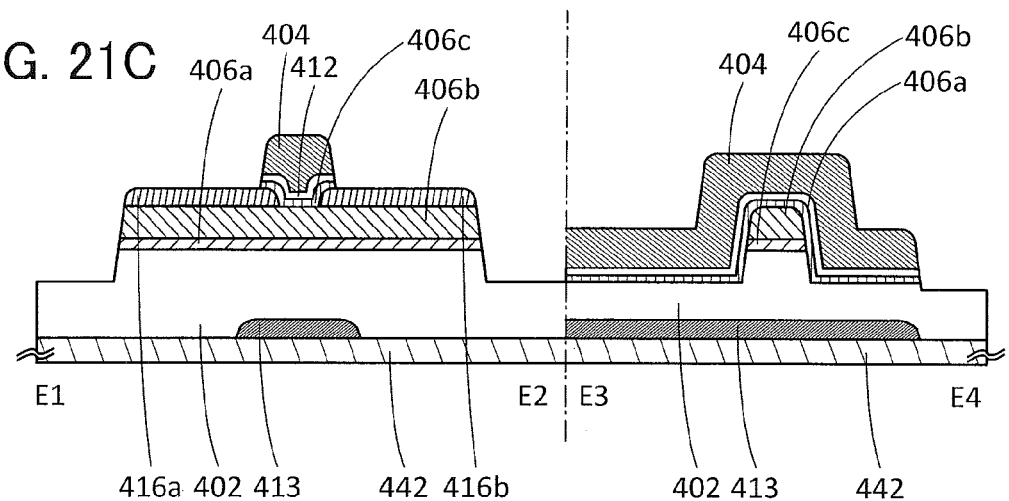

Next, in a manner similar to those of the conductive film to be the conductor 404 and the insulating film to be the insulator 412, the semiconductor to be the semiconductor 406c is partly etched, so that the semiconductor 406c is formed (see FIG. 21C).

Figure 22:
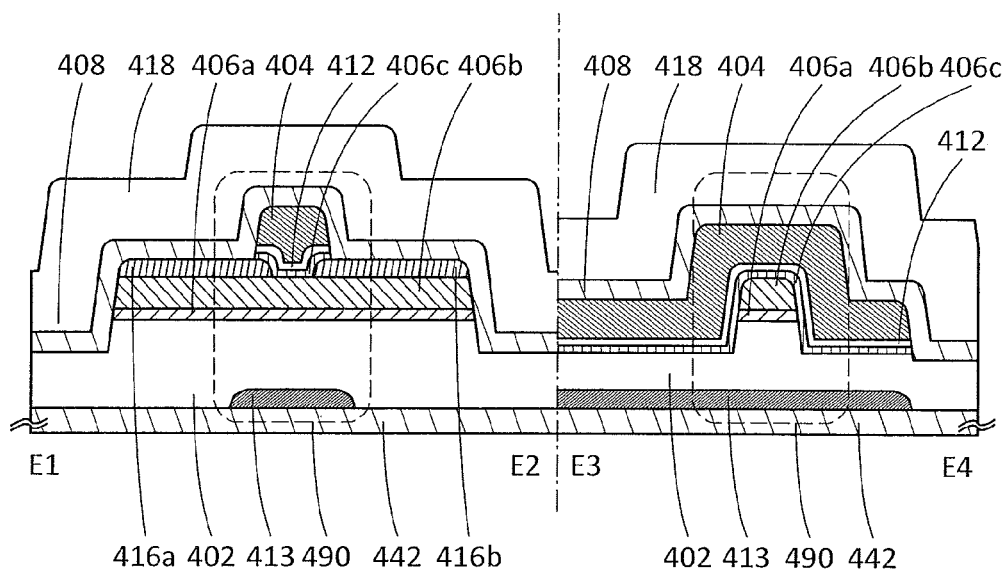
FIG. 22 illustrates a method for manufacturing a transistor of one embodiment of the present invention.

Next, the insulator 408 is formed. After the insulator 408 is formed, heat treatment may be performed. Next, the insulator 418 is formed (see FIG. 22). Through the above steps, the transistor 490 illustrated in FIGS. 2A and 2B can be manufactured.

<Structure of Semiconductor Device>

Next, an example of a semiconductor device including the transistor 490 is described with reference to FIG. 23.

Figure 23:
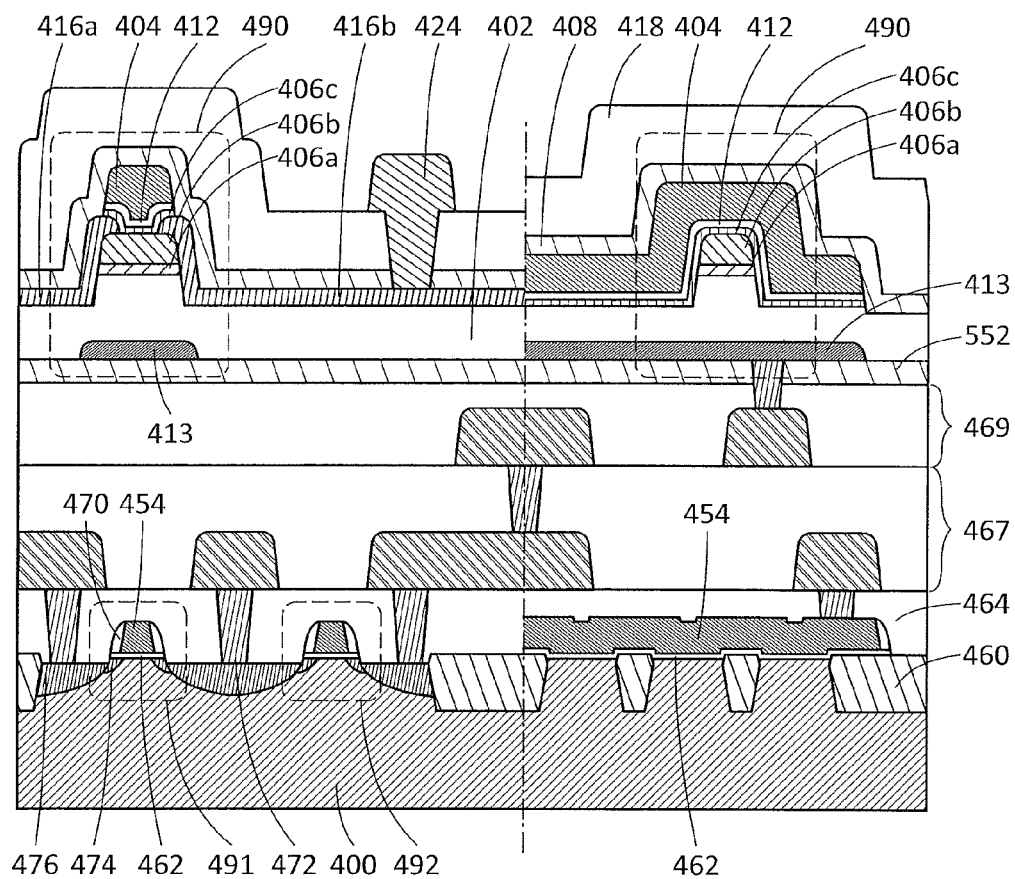
FIG. 23 is a cross-sectional view illustrating a semiconductor device of one embodiment of the present invention.

FIG. 23 is a cross-sectional view of a semiconductor device of one embodiment of the present invention. FIG. 23 shows different cross sections on the left side and the right side of a dashed-dotted line.

The semiconductor device illustrated in FIG. 23 includes a transistor 491, an insulator (insulating layer) 552 over the transistor 491, and a transistor 490 over the insulator 552. The insulator 552 has a function of blocking oxygen and hydrogen.

The transistor 491 includes an insulator 462 over a semiconductor substrate 400, a conductor 454 over the insulator 462, an insulator 470 in contact with a side surface of the conductor 454, a region 476 of the semiconductor substrate 400 over which the conductor 454 and the insulator 470 are not provided, and a region 474 of the semiconductor substrate 400 over which the insulator 470 is provided.

For the semiconductor substrate 400, a single-material semiconductor of silicon, germanium, or the like or a compound semiconductor of silicon carbide, silicon germanium, gallium arsenide, gallium nitride, indium phosphide, zinc oxide, gallium oxide, or the like may be used, for example. For the semiconductor substrate 400, an amorphous semiconductor or a crystalline semiconductor may be used, and examples of a crystalline semiconductor include a single crystal semiconductor, a polycrystalline semiconductor, and a microcrystalline semiconductor.

The insulator 462 serves as a gate insulator of the transistor 491. The conductor 454 serves as a gate electrode of the transistor 491. The insulator 470 serves as a sidewall insulator (also referred to as a sidewall) of the conductor 454. The region 476 serves as a source region or a drain region of the transistor 491. The region 474 serves as a lightly doped drain (LDD) region of the transistor 491.

The region 474 can be formed by adding an impurity using the conductor 454 as a mask. After that, the insulator 470 is formed and an impurity is added using the conductor 454 and the insulator 470 as masks, so that the region 476 can be formed. Thus, when the region 474 and the region 476 are formed using the same kind of impurities, the region 474 has a lower impurity concentration than the region 476.

When the transistor 491 includes the region 474, a short-channel effect can be suppressed. Therefore, such a structure is suitable for miniaturization.

The transistor 491 is kept away from another transistor provided in the semiconductor substrate 400 by a region 460 or the like. The region 460 is an insulating region. Although FIG. 23 shows an example where the region 460 is formed by a shallow trench isolation (STI) method, one embodiment of the present invention is not limited thereto. For example, instead of the region 460, an insulator formed by a local oxidation of silicon (LOCOS) method may be used so that transistors are separated from each other.

FIG. 23 shows an example where the transistor 492 having the same conductivity type as the transistor 491 is provided to be adjacent to the transistor 491. Furthermore, in FIG. 23, the transistor 491 and the transistor 492 are electrically connected to each other through the region 476. The transistor 491 and the transistor 492 may have different conductivity types. In that case, the transistors 491 and 492 may be separated from each other by the region 460, depending on the transistors 491 and 492, different kinds of impurities contained in the region 474 and the region 476 are used, and well regions having different conductivity types may be formed in part of a region of the semiconductor substrate 400 overlapping with the conductor serving as one or both of gate electrodes of the transistors 491 and 492.

When the transistors 491 and 492 have different conductivity types, a complementary metal oxide semiconductor (CMOS) can be formed. With a CMOS, power consumption of the semiconductor device can be reduced. Furthermore, operation speed can be increased.

Note that the structures of the transistors 491 and 492 are not limited to the structures illustrated in FIG. 23. For example, a structure where the semiconductor substrate 400 has a projection (also referred to as a protrusion or a fin), like the transistors 491 and 492 illustrated in FIG. 24, may be used. In the structures of the transistors 491 and 492 illustrated in FIG. 24, an effective channel width with respect to the occupation area can be increased as compared with those illustrated in FIG. 23. Thus, the on-state currents of the transistors 491 and 492 can be increased.

Figure 25:
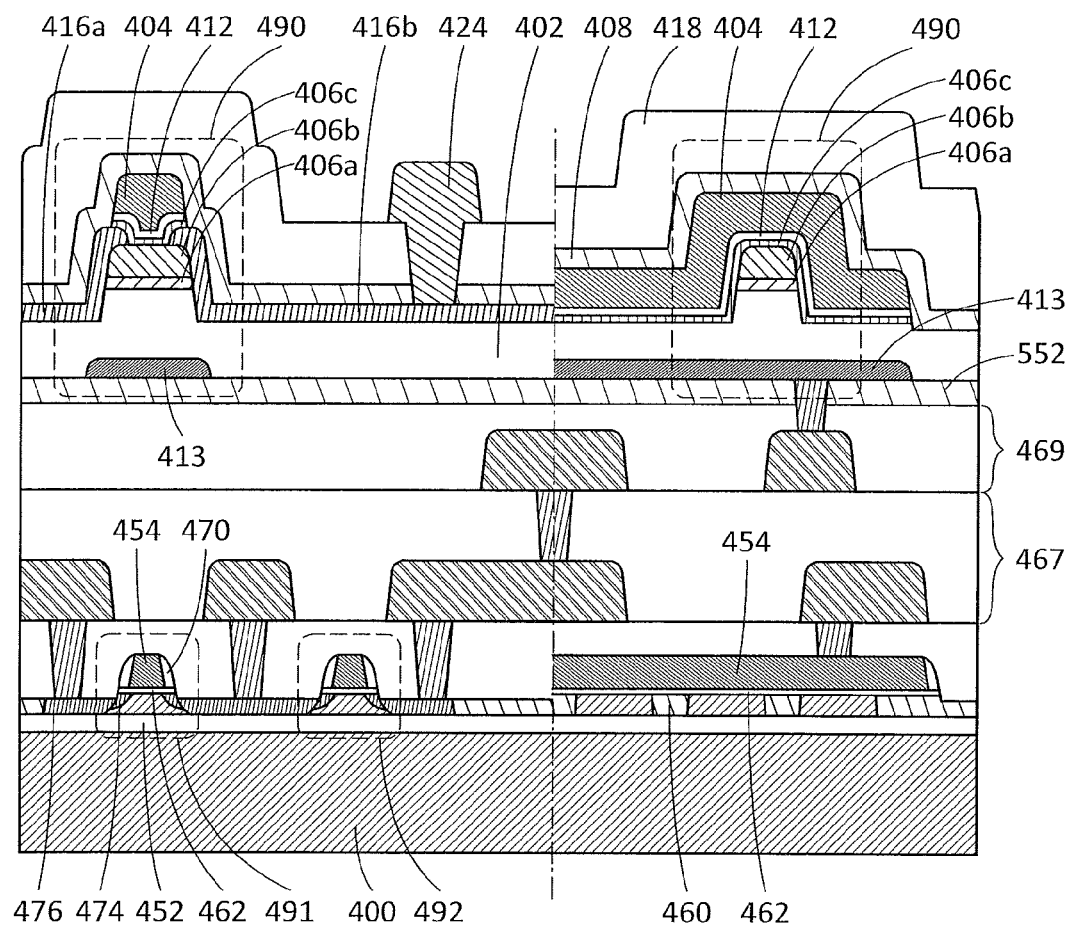
FIG. 25 is a cross-sectional view illustrating a semiconductor device of one embodiment of the present invention.

Alternatively, for example, a structure where an insulator region 452 is provided in the semiconductor substrate 400, like the transistors 491 and 492 illustrated in FIG. 25, may be used. With the structures of the transistors 491 and 492 illustrated in FIG. 25, transistors which independently operate can be separated from each other more surely and thus, leakage current can be suppressed. Consequently, the off-state currents of the transistors 491 and 492 can be low. Furthermore, the on-state currents of the transistors 491 and 492 can be high.

As illustrated in FIG. 23 and the like, the insulator 552 is preferably provided between transistor 490 or the like and the transistors 491 and 492 or the like. The insulator 552 preferably has a function of blocking oxygen and hydrogen. Alternatively, the insulator 552 preferably has a higher capability to block oxygen and hydrogen than the semiconductor 406a and/or the semiconductor 406c. As the insulator 552, for example, a single layer or stacked layers of aluminum oxide, aluminum oxynitride, gallium oxide, gallium oxynitride, yttrium oxide, yttrium oxynitride, hafnium oxide, hafnium oxynitride, tantalum oxide, zirconium oxide, lead zirconate titanate (PZT), strontium titanate ($SrTiO_3$), $(Ba,Sr)TiO_3$ (BST), or the like can be used. Alternatively, the insulating film may be subjected to nitriding treatment to be an oxynitride film. Aluminum oxide is particularly preferable because of its excellent barrier property against water, hydrogen, and oxygen.

The insulator 552 may be formed by a sputtering method, a chemical vapor deposition (CVD) method, a molecular beam epitaxy (MBE) method, a pulsed laser deposition (PLD) method, an atomic layer deposition (ALD) method, or the like.

The CVD method can include a plasma enhanced CVD (PECVD) method using plasma, a thermal CVD (TCVD) method using heat, and the like. Moreover, the CVD method can include a metal CVD (MCVD) method and a metal organic CVD (MOCVD) method depending on a source gas.

By using the PECVD method, a high-quality film can be formed at a relatively low temperature. By using the TCVD method, in which plasma is not used, a film can be formed with few defects because damage caused by plasma does not occur.

When the CVD method is used, the composition of a film to be formed can be controlled with a flow rate ratio of the source gases. For example, by the MCVD method and the MOCVD method, a film with a certain composition can be formed depending on a flow rate ratio of the source gases. Moreover, with the MCVD method and the MOCVD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is not needed. Thus, the transistors 490 can be manufactured with improved productivity.

For example, in the case where the transistor 491 and the transistor 492 are silicon transistors, electrical characteristics of the transistor may be improved because dangling bonds of silicon can be reduced by supplying hydrogen from the outside. The supply of hydrogen may be performed by heat treatment under an atmosphere containing hydrogen, for example. Alternatively, for example, an insulator containing hydrogen is provided in the vicinity of the transistors 491 and 492 and heat treatment is performed, so that the hydrogen may be diffused and supplied to the transistors 491 and 492. Specifically, an insulator 464 over the transistors 491 and 492 is preferably an insulator containing hydrogen. Note that the insulator 464 may have a single-layer structure or a stacked-layer structure. For example, a stacked-layer structure including silicon oxynitride or silicon oxide, and silicon nitride oxide or silicon nitride may be used.

An insulator containing hydrogen may release hydrogen, the amount of which is larger than or equal to $1\times10^{18}$ atoms/$cm^3$, larger than or equal to $1\times10^{19}$ atoms/$cm^3$, or larger than or equal to $1\times10^{20}$ atoms/$cm^3$ in TDS analysis (converted into the number of hydrogen atoms) in the range of a surface temperature of 100° C. to 700° C. or 100° C. to 500° C.

Hydrogen diffused from the insulator 464 might reach the vicinity of the transistor 490 through a conductor 472 provided in an opening of the insulator 464, a wiring layer 467 over the insulator 464, a wiring layer 469 over the wiring layer 467, or the like; however, since the insulator 552 has a function of blocking hydrogen, the amount of hydrogen which reaches the transistor 490 is small. Hydrogen serves as a carrier trap or a carrier generation source in an oxide semiconductor and causes deterioration of electrical characteristics of the transistor 490 in some cases. Therefore, blocking hydrogen by the insulator 552 is important to improve performance and reliability of the semiconductor device. Note that a conductor embedded in an opening, e.g., the conductor 472, has a function of electrically connecting elements such as transistors and capacitors. In the wiring layer 467, the wiring layer 469, and the like, a hatched region represents a conductor and a non-hatched region represents an insulator. The wiring layers, e.g., the wiring layer 467 and the wiring layer 469, have a function of electrically connecting the conductors embedded in the openings, e.g., the conductor 472 and the like.

On the other hand, for example, by supplying oxygen to the transistor 490 from the outside, oxygen vacancies in the oxide semiconductor can be reduced; thus, electrical characteristics of the transistor are improved in some cases. The supply of oxygen may be performed by heat treatment under an atmosphere containing oxygen, for example. Alternatively, for example, an insulator containing excess oxygen (oxygen) is provided in the vicinity of the transistor 490 and heat treatment is performed, so that the oxygen may be diffused and supplied to the transistor 490. Here, as the insulator 402 of the transistor 490, an insulator containing excess oxygen is used.

Diffused oxygen might reach the transistors 491 and 492 through layers; however, since the insulator 552 has a function of blocking oxygen, the amount of oxygen which reaches the transistors 491 and 492 is small. In the case where the transistors 491 and 492 are silicon transistors, entry of oxygen into silicon might be a factor of decreasing crystallinity of silicon or inhibiting carrier movement. Therefore, blocking oxygen by the insulator 552 is important to improve performance and reliability of the semiconductor device.

In FIG. 23 and the like, the semiconductor device preferably includes an insulator 408 over the transistor 490. The insulator 408 has a function of blocking oxygen and hydrogen. Alternatively, the insulator 408 has, for example, a higher capability of blocking oxygen and hydrogen than the semiconductor 406a and/or the semiconductor 406c. For the insulator 408, the description of the insulator 552 is referred to, for example.

When the semiconductor device includes the insulator 408, outward diffusion of oxygen from the transistor 490 can be suppressed. Consequently, excess oxygen (oxygen) contained in the insulator 402 and the like can be effectively supplied to the transistor 490. Since the insulator 408 blocks entry of impurities including hydrogen from layers above the insulator 408 or the outside of the semiconductor device, deterioration of the electrical characteristics of the transistor 490 due to the entry of impurities can be suppressed.

Although in the above description, the insulator 552 and/or the insulator 408 is described separately from the transistor 490 for convenience, the insulator 552 and/or the insulator 408 may be part of the transistor 490.

The semiconductor device preferably includes the insulator 418 over the insulator 408. Furthermore, the semiconductor device may include a conductor 424 which is electrically connected to the transistor 490 through a conductor 416b provided in an opening of the insulator 418 and the insulator 408.

At least part of this embodiment can be implemented in combination with any of the other embodiments described in this specification as appropriate.

Embodiment 2

In this embodiment, a structure of an oxide semiconductor of one embodiment of the present invention that can be applied to the semiconductors 406a to 406c described in the above embodiment is described. In this specification, trigonal and rhombohedral crystal systems are included in a hexagonal crystal system.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 26A:
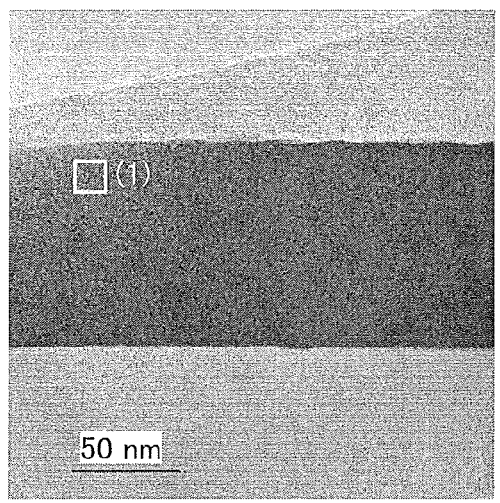
FIGS. 26A to 26D are Cs-corrected high-resolution TEM images of a cross section of a CAAC-OS and a cross-sectional schematic view of the CAAC-OS.

A CAAC-OS observed with TEM is described below. FIG. 26A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 26B:
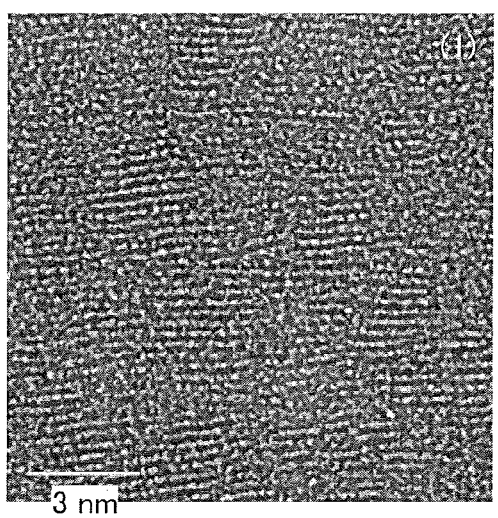

FIG. 26B is an enlarged Cs-corrected high-resolution TEM image of a region (1) in FIG. 26A. FIG. 26B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 26C:
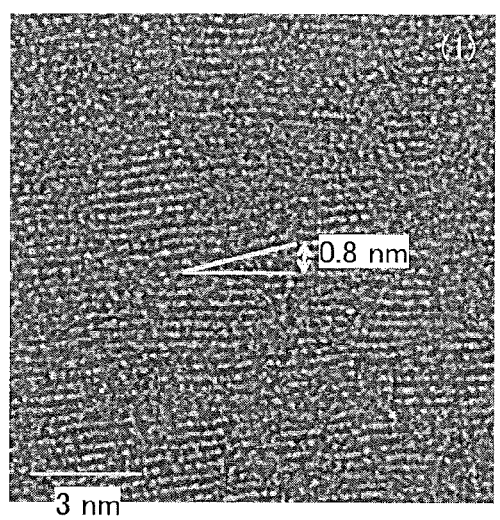

As shown in FIG. 26B, the CAAC-OS has a characteristic atomic arrangement. The characteristic atomic arrangement is denoted by an auxiliary line in FIG. 26C. FIGS. 26B and 26C prove that the size of a pellet is approximately 1 nm to 3 nm, and the size of a space caused by tilt of the pellets is approximately 0.8 nm Therefore, the pellet can also be referred to as a nanocrystal (nc).

Figure 26D:
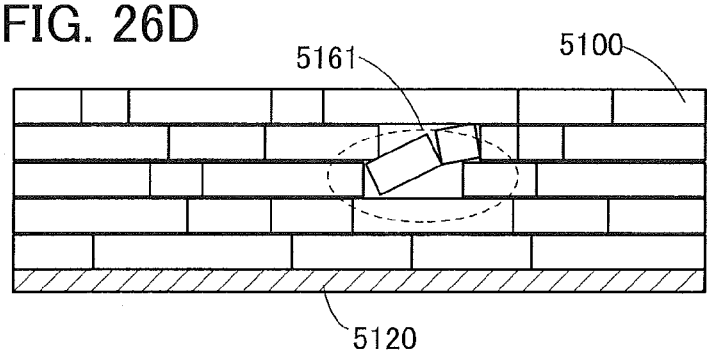

Here, according to the Cs-corrected high-resolution TEM images, the schematic arrangement of pellets 5100 of a CAAC-OS over a substrate 5120 is illustrated by such a structure in which bricks or blocks are stacked (see FIG. 26D). The part in which the pellets are tilted as observed in FIG. 26C corresponds to a region 5161 shown in FIG. 26D.

Figure 27A:
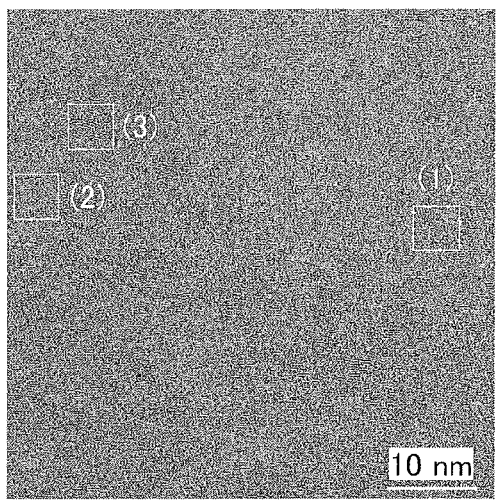
FIGS. 27A to 27D are Cs-corrected high-resolution TEM images of a plane of a CAAC-OS.
Figure 27B:
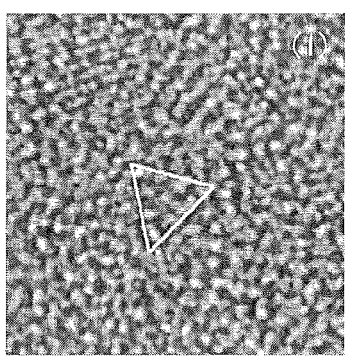
Figure 27C:
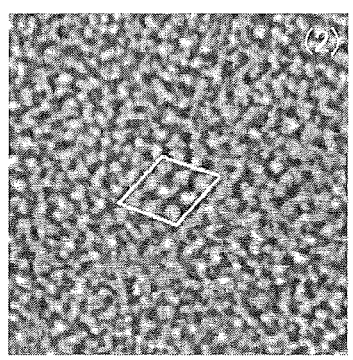
Figure 27D:
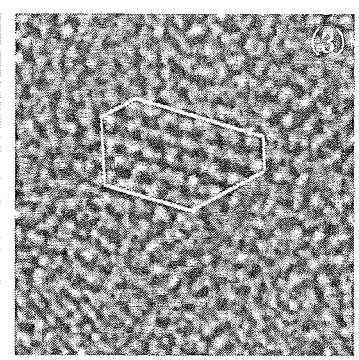

FIG. 27A shows a Cs-corrected high-resolution TEM image of a plane of the CAAC-OS observed from a direction substantially perpendicular to the sample surface. FIGS. 27B, 27C, and 27D are enlarged Cs-corrected high-resolution TEM images of regions (1), (2), and (3) in FIG. 27A, respectively. FIGS. 27B, 27C, and 27D indicate that metal atoms are arranged in a triangular, quadrangular, or hexagonal configuration in a pellet. However, there is no regularity of arrangement of metal atoms between different pellets.

Figure 28A:
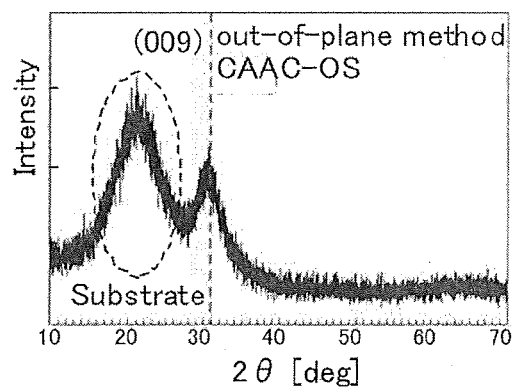
FIGS. 28A to 28C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 28A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 28B:
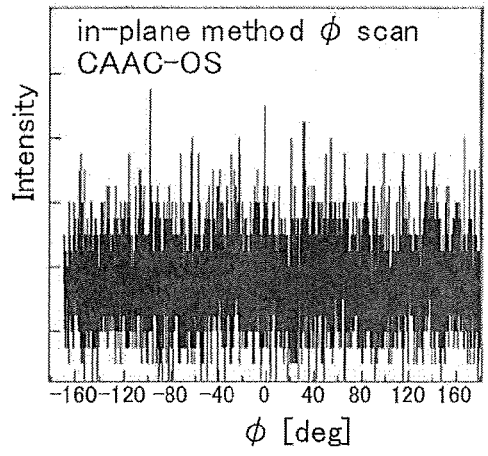
Figure 28C:
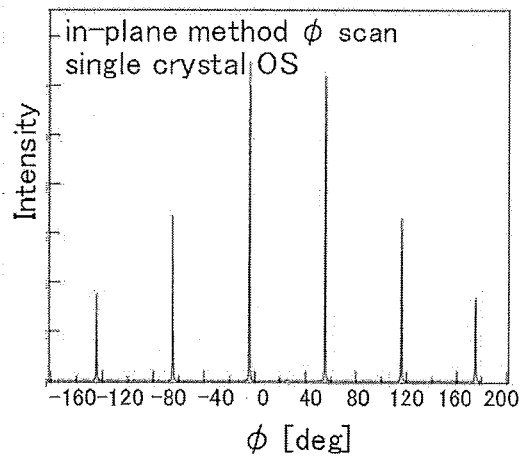

On the other hand, in structural analysis of the CAAC-OS by an in-plane method in which an X-ray is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 28B, a peak is not clearly observed. In contrast, in the case of a single crystal oxide semiconductor of $InGaZnO_4$, when $\phi$ scan is performed with $2\theta$ fixed at around 56°, as shown in FIG. 28C, six peaks which are derived from crystal planes equivalent to the (110) plane are observed. Accordingly, the structural analysis using XRD shows that the directions of a-axes and b-axes are irregularly oriented in the CAAC-OS.

Figure 29A:
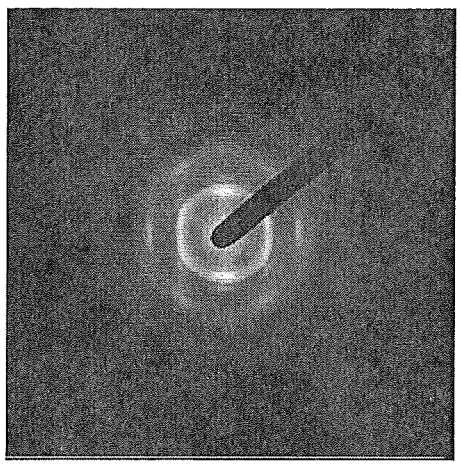
FIGS. 29A and 29B show electron diffraction patterns of a CAAC-OS.
Figure 29B:
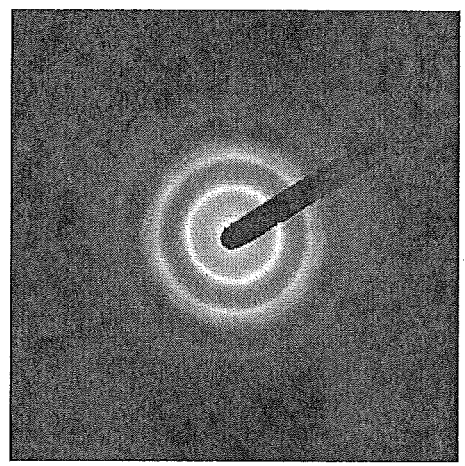

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 29A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 29B shows a diffraction pattern obtained in such a manner that an electron beam with a probe diameter of 300 nm is incident on the same sample in a direction perpendicular to the sample surface. As shown in FIG. 29B, a ring-like diffraction pattern is observed. Thus, the electron diffraction also indicates that the a-axes and b-axes of the pellets included in the CAAC-OS do not have regular alignment. The first ring in FIG. 29B is considered to be derived from the (010) plane, the (100) plane, and the like of the InGaZnO$_4$ crystal. The second ring in FIG. 29B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small amount of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small amount of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. A charge trapped by the carrier traps in the oxide semiconductor takes a long time to be released. The trapped charge may behave like a fixed charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 30:
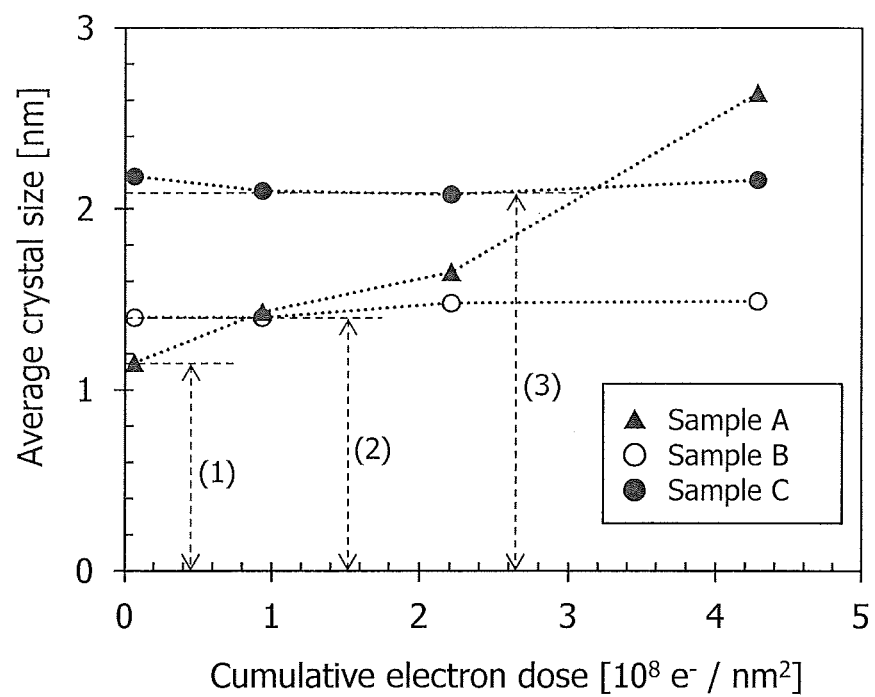
FIG. 30 shows a change in crystal part of an In—Ga—Zn oxide induced by electron irradiation.

FIG. 30 shows change in the average size of crystal parts (at 22 points to 45 points) in each sample. Note that the crystal part size corresponds to the length of a lattice fringe. FIG. 30 indicates that the crystal part size in the a-like OS increases with an increase in the cumulative electron dose. Specifically, as shown by (1) in FIG. 30, a crystal part of approximately 1.2 nm (also referred to as an initial nucleus) at the start of TEM observation grows to a size of approximately 2.6 nm at a cumulative electron dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$. Specifically, as shown by (2) and (3) in FIG. 30, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 31A:
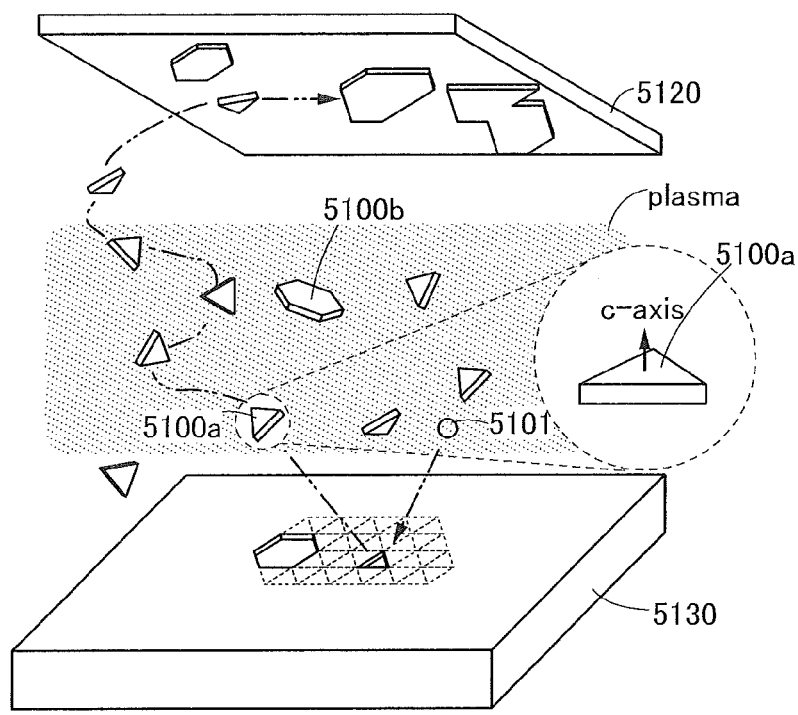
FIGS. 31A and 31B are schematic views showing deposition models of a CAAC-OS and an nc-OS.

FIG. 31A is a schematic view of the inside of a deposition chamber where a CAAC-OS is deposited by a sputtering method.

A target 5130 is attached to a backing plate. A plurality of magnets are provided to face the target 5130 with the backing plate positioned therebetween. The plurality of magnets generate a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 in and less than or equal to 1 in, preferably greater than or equal to 0.02 in and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 32A:
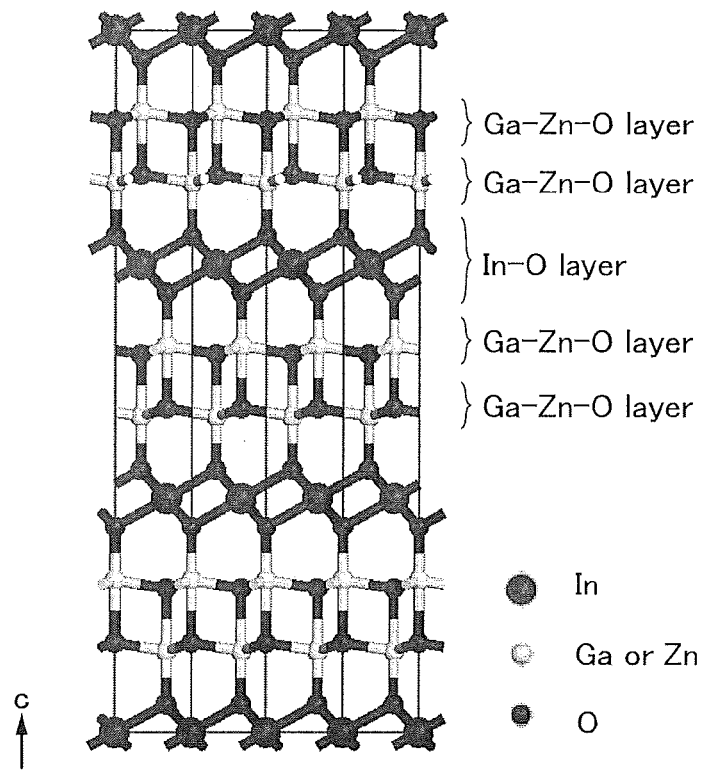
FIGS. 32A to 32C show an InGaZnO$_4$ crystal and a pellet.

Here, the target 5130 has a polycrystalline structure which includes a plurality of crystal grains and in which a cleavage plane exists in at least one crystal grain. FIG. 32A shows a structure of an $InGaZnO_4$ crystal included in the target 5130 as an example. Note that FIG. 32A shows a structure of the case where the $InGaZnO_4$ crystal is observed from a direction parallel to the b-axis. FIG. 32A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 32B:
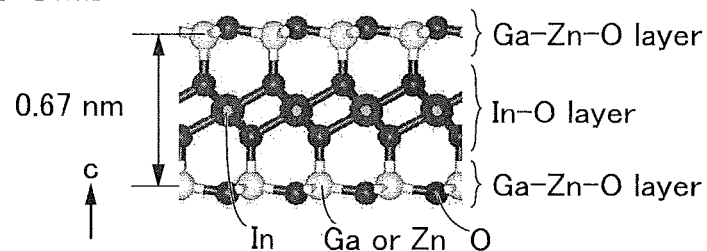
Figure 32C:
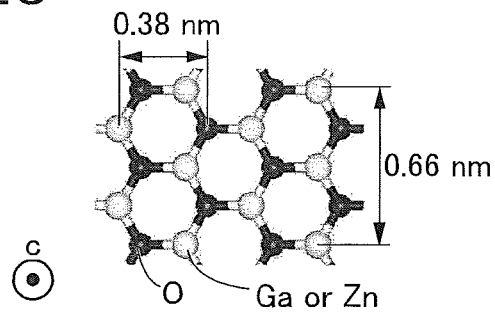

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 30. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 32B is separated. Note that FIG. 32C shows the structure of the separated pellet 5100 observed from a direction parallel to the c-axis. Therefore, the pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 30 corresponds to the amount of growth in plasma. Here, in the case where the temperature of the substrate 5120 is at around room temperature, the pellet 5100 on the substrate 5120 hardly grows; thus, an nc-OS is formed (see FIG. 31B). An nc-OS can be deposited when the substrate 5120 has a large size because a temperature at which the deposition of an nc-OS is carried out is approximately room temperature. Note that in order that the pellet 5100 grows in plasma, it is effective to increase deposition power in sputtering. High deposition power can stabilize the structure of the pellet 5100.

Figure 31B:
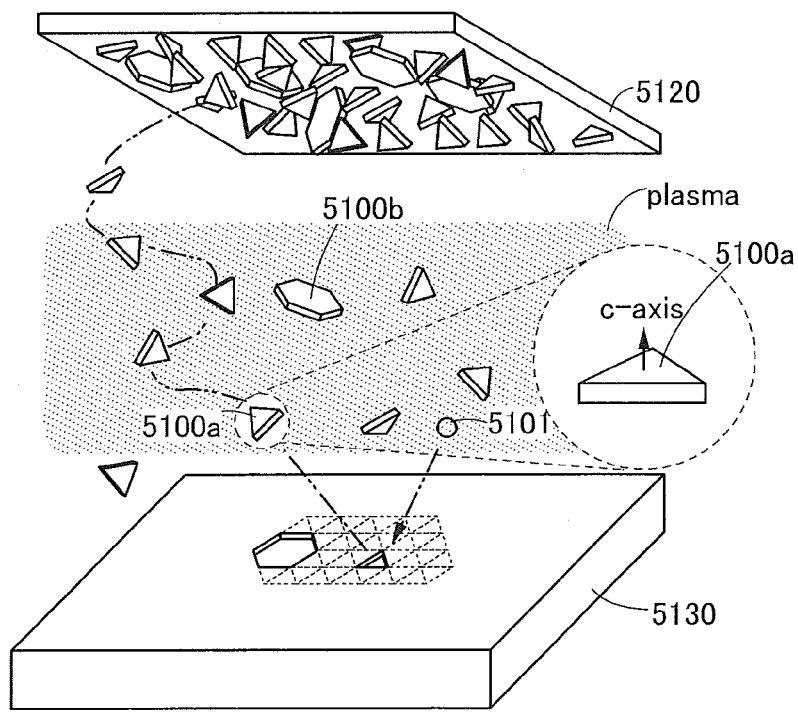

As shown in FIGS. 31A and 31B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 31A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 inn and less than or equal to 5 nm, or greater than or equal to 0.5 nm and less than or equal to 2 nm. FIGS. 33A to 33D are cross-sectional schematic views.

Figure 33A:
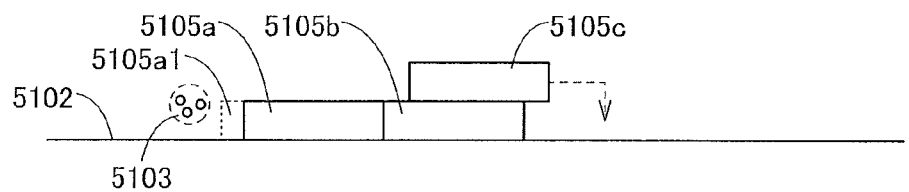
FIGS. 33A to 33D are schematic views showing a deposition model of a CAAC-OS.

As illustrated in FIG. 33A, a pellet 5105*a* and a pellet 5105*b* are deposited over the zinc oxide layer 5102. Here, side surfaces of the pellet 5105*a* and the pellet 5105*b* are in contact with each other. In addition, a pellet 5105*c* is deposited over the pellet 5105*b*, and then glides over the pellet 5105*b*. Furthermore, a plurality of particles 5103 separated from the target together with the zinc oxide are crystallized by heat from the substrate 5120 to form a region 5105*a*1 on another side surface of the pellet 5105*a*. Note that the plurality of particles 5103 may contain oxygen, zinc, indium, gallium, or the like.

Figure 33B:
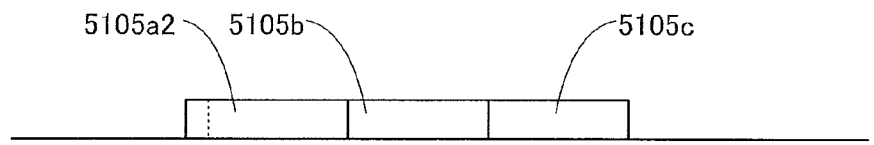

Then, as illustrated in FIG. 33B, the region 5105*a*1 grows to part of the pellet 5105*a* to form a pellet 5105*a*2. In addition, a side surface of the pellet 5105*c* is in contact with another side surface of the pellet 5105*b*.

Figure 33C:
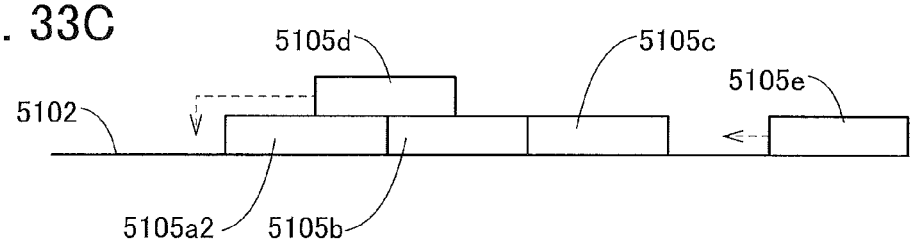

Next, as illustrated in FIG. 33C, a pellet 5105*d* is deposited over the pellet 5105*a*2 and the pellet 5105*b*, and then glides over the pellet 5105*a*2 and the pellet 5105*b*. Furthermore, a pellet 5105*e* glides toward another side surface of the pellet 5105*c* over the zinc oxide layer 5102.

Figure 33D:
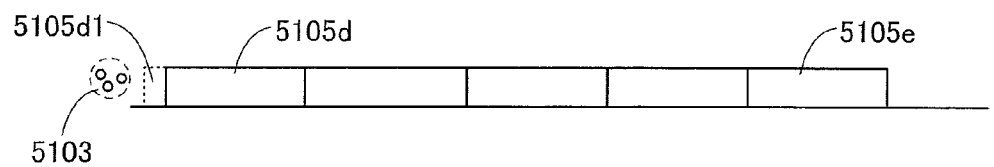

Then, as illustrated in FIG. 33D, the pellet 5105*d* is placed so that a side surface of the pellet 5105*d* is in contact with a side surface of the pellet 5105*a*2.

Furthermore, a side surface of the pellet 5105*e* is in contact with another side surface of the pellet 5105*c*. A plurality of particles 5103 separated from the target 5130 together with the zinc oxide are crystallized by heat from the substrate 5120 to form a region 5105*d*1 on another side surface of the pellet 5105*d*.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 30 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets

5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that, even in such a case, owing to intermolecular force, the pellets 5100 are arranged so that a gap between the pellets is as small as possible even on the unevenness surface. Therefore, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

At least part of this embodiment can be implemented in combination with any of the other embodiments described in this specification as appropriate.

Embodiment 3

An example of a circuit of a semiconductor device which includes a transistor or the like of one embodiment of the present invention is described in this embodiment.

<CMOS Inverter>

Figure 34A:
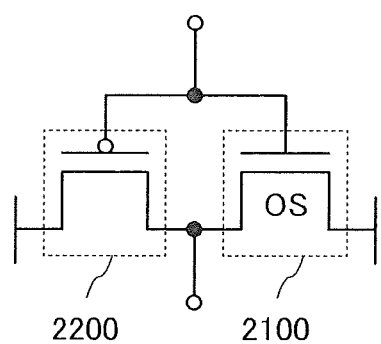
FIGS. 34A and 34B are circuit diagrams each illustrating a semiconductor device of one embodiment of the present invention.

A circuit diagram in FIG. 34A shows a configuration of a so-called CMOS inverter in which a p-channel transistor 2200 and an n-channel transistor 2100 are connected to each other in series and in which gates of them are connected to each other.

<Structure 2 of Semiconductor Device>

Figure 35:
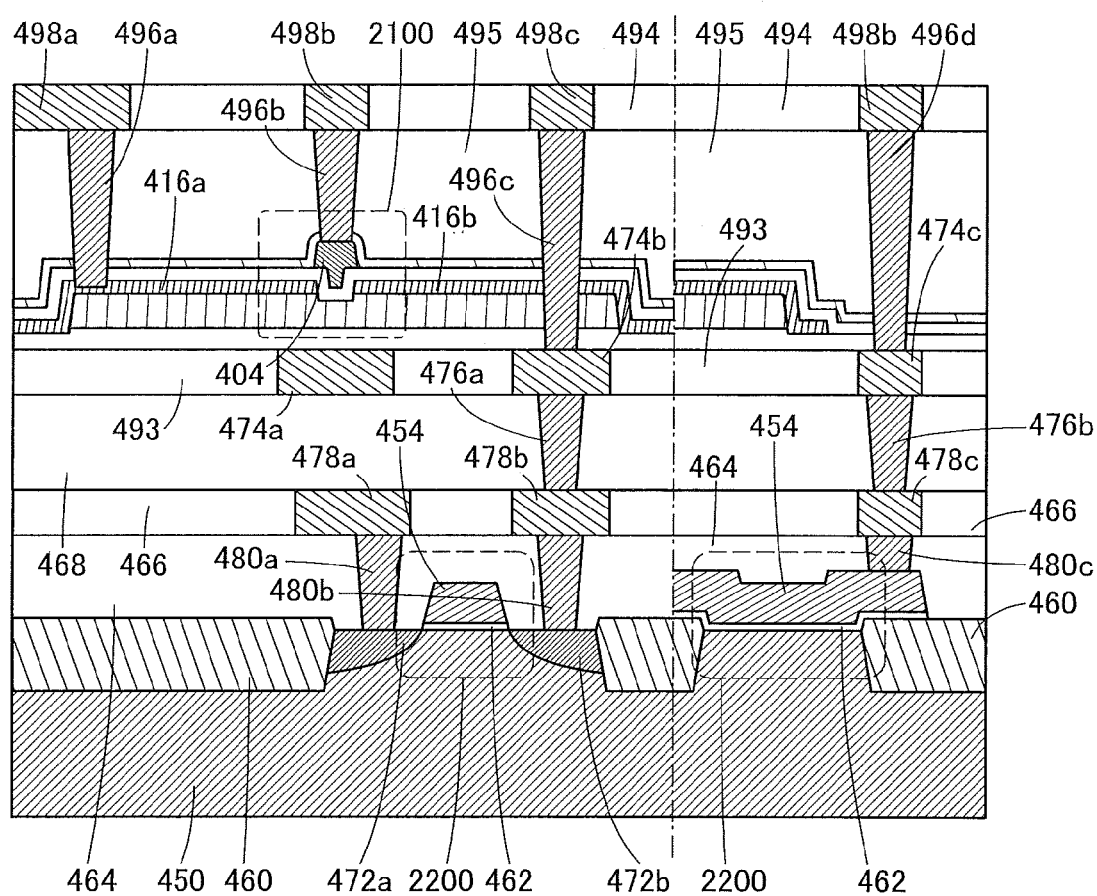
FIG. 35 is a cross-sectional view illustrating a semiconductor device of one embodiment of the present invention.

FIG. 35 is a cross-sectional view of the semiconductor device of FIG. 34A. The semiconductor device shown in FIG. 35 includes the transistor 2200 and the transistor 2100. The transistor 2100 is placed above the transistor 2200. Although an example where the transistor shown in FIGS. 1A and 1B in Embodiment 1 is used as the transistor 2100 is shown, a semiconductor device of one embodiment of the present invention is not limited thereto. For example, the transistors illustrated in FIGS. 2A and 2B, FIGS. 3A and 3B, FIGS. 4A and 4B, FIGS. 5A and 5B, FIGS. 6A and 6B, FIGS. 7A to 7C, FIGS. 8A and 8B, FIGS. 9A and 9B, FIGS. 10A and 10B, and FIGS. 11A and 11B can be used as the transistor 2100. Therefore, the description of the above transistors is referred to for the transistor 2100 as appropriate.

The transistor 2200 shown in FIG. 35 is a transistor using a semiconductor substrate 450. The transistor 2200 includes a region 472a in the semiconductor substrate 450, a region 472b in the semiconductor substrate 450, the insulator 462, and the conductor 454. For the transistor 2200 illustrated in FIGS. 34A and 34B, the description of the transistor 491 or the transistor 492 illustrated in FIG. 23 may be referred to, for example.

In the transistor 2200, the regions 472a and 472b have functions of a source region and a drain region. The insulator 462 has a function of a gate insulator. The conductor 454 has a function of a gate electrode. Therefore, the resistance of a channel formation region can be controlled by a potential applied to the conductor 454. In other words, conduction or non-conduction between the region 472a and the region 472b can be controlled by the potential applied to the conductor 454.

For the semiconductor substrate 450, the description of the semiconductor substrate 400 may be referred to.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

A top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is separated from an adjacent transistor by the region 460 and the like. The region 460 is an insulating region.

The semiconductor device shown in FIG. 35 includes the insulator 464, an insulator 466, an insulator 468, a conductor 480a, a conductor 480b, a conductor 480c, a conductor 478a, a conductor 478b, a conductor 478c, the conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 493, an insulator 495, and an insulator 494.

The insulator 464 is placed over the transistor 2200. The insulator 466 is placed over the insulator 464. The insulator 468 is placed over the insulator 466. The insulator 493 is placed over the insulator 468. The transistor 2100 is placed over the insulator 493. The insulator 495 is placed over the transistor 2100. The insulator 494 is placed over the insulator 495.

The insulator 464 includes an opening reaching the region 472a, an opening reaching the region 472b, and an opening reaching the conductor 454. In the openings, the conductor 480a, the conductor 480b, and the conductor 480c are embedded.

In addition, the insulator 466 includes an opening reaching the conductor 480a, an opening reaching the conductor 480b, and an opening reaching the conductor 480c. In the openings, the conductor 478a, the conductor 478b, and the conductor 478c are embedded.

In addition, the insulator 468 includes an opening reaching the conductor 478b and an opening reaching the conductor 478c. In the openings, the conductor 476a and the conductor 476b are embedded.

In addition, the insulator 493 includes an opening overlapping with a channel formation region of the transistor 2100, an opening reaching the conductor 476a, and an opening reaching the conductor 476b. In the openings, the conductor 474a, the conductor 474b, and the conductor 474c are embedded.

The conductor 474a may have a function as a gate electrode of the transistor 2100. For the conductor 474a, the description of the conductor 413 can be referred to.

In addition, the insulator 495 includes an opening reaching the conductor 474b through the conductor 416b that is one of a source electrode and a drain electrode of the transistor 2100, an opening reaching the conductor 416a that is the other of the source electrode and the drain electrode of the transistor 2100, an opening reaching the conductor 404 that is the gate electrode of the transistor 2100, and an opening reaching the conductor 474c. In the openings, the conductor 496a, the conductor 496b, the conductor 496c, and the conductor 496d are embedded. Note that in some cases, an opening provided in a component of the transistor 2100 or the like is positioned between openings provided in other components.

In addition, the insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The description of the insulator 552 may be referred to for the insulators 464, 466, 468, 493, 495, and 494.

The insulator that has a function of blocking oxygen and impurities such as hydrogen is preferably included in at least one of the insulators 464, 466, 468, 493, 495, and 494. When an insulator that has a function of blocking oxygen and impurities such as hydrogen is placed near the transistor 2100, the electrical characteristics of the transistor 2100 can be stable.

Each of the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 24:
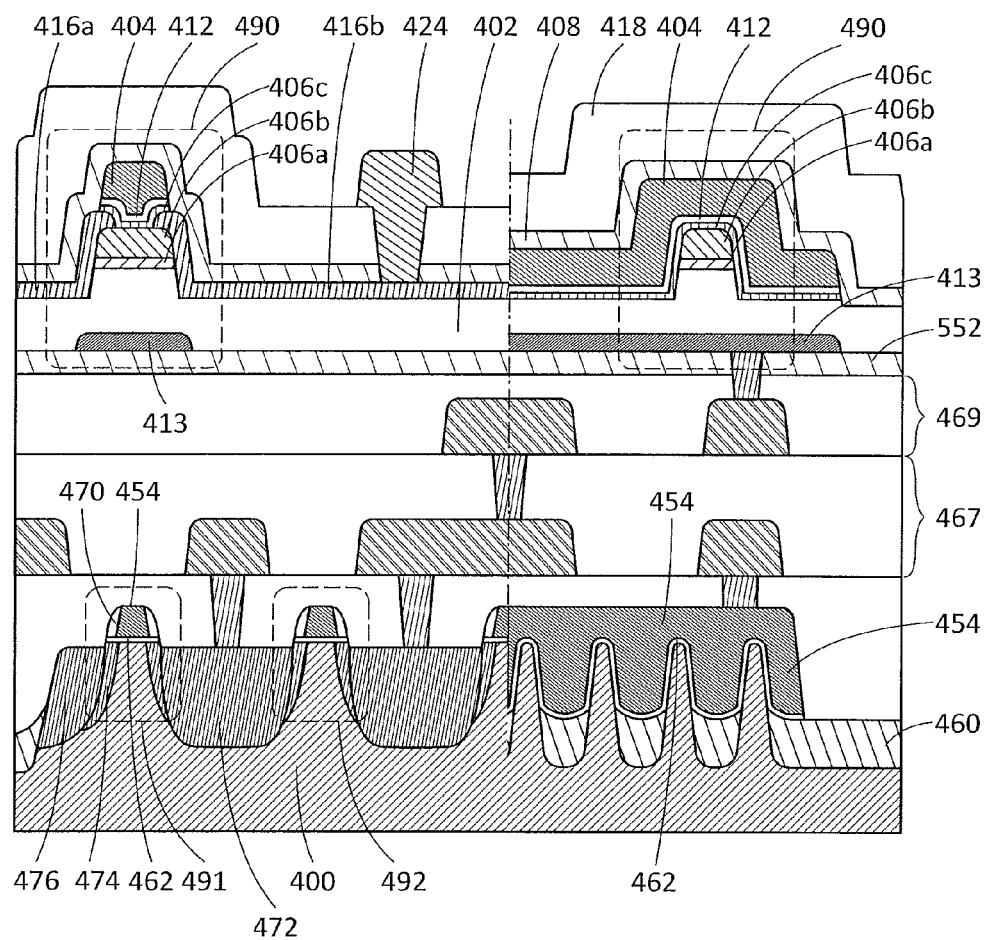
FIG. 24 is a cross-sectional view illustrating a semiconductor device of one embodiment of the present invention.

Note that in the semiconductor device illustrated in FIG. 35, the structure of the transistor 491 or the transistor 492 illustrated in FIG. 24 may be used as the structure of the transistor 2200. The transistors 491 and 492 illustrated in FIG. 24 each have a fin-type structure.

In the semiconductor device illustrated in FIG. 35, the structure of the transistor 491 or the transistor 492 illustrated in FIG. 25 may be used as the structure of the transistor 2200. The transistors 491 and 492 illustrated in FIG. 25 are provided in the semiconductor substrate 400 that is an SOI substrate.

In the semiconductor device shown in FIG. 35, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or strain engineering can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 34B:
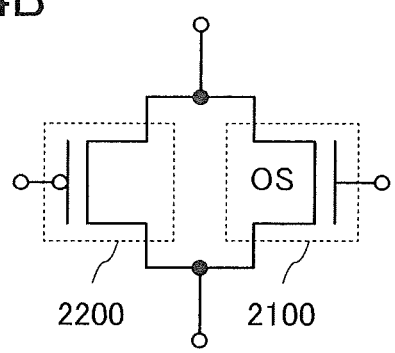

A circuit diagram in FIG. 34B shows a configuration in which sources of the transistors 2100 and 2200 are connected to each other and drains of the transistors 2100 and 2200 are connected to each other. With such a configuration, the transistors can function as a so-called CMOS analog switch.

<Memory Device 1>

Figure 36A:
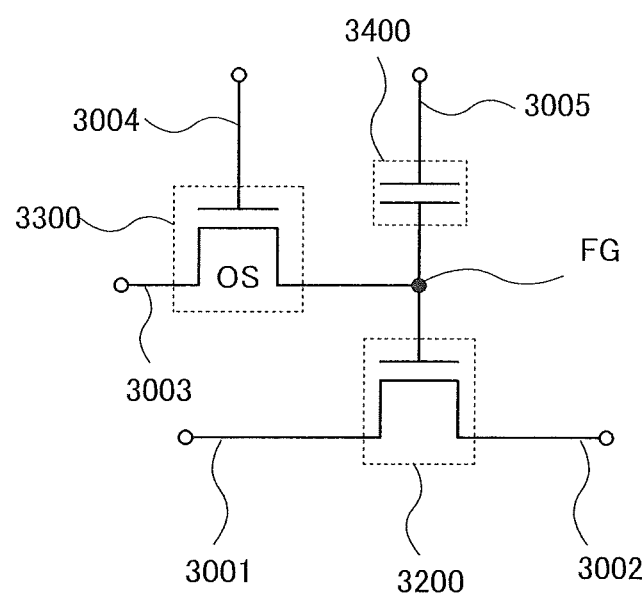
FIGS. 36A and 36B are circuit diagrams each illustrating a memory device of one embodiment of the present invention.
Figure 36B:
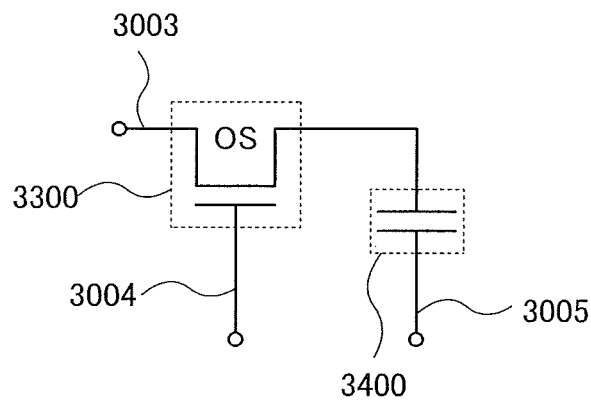

An example of a semiconductor device (memory device) which includes the transistor of one embodiment of the present invention, which can retain stored data even when not powered, and which has an unlimited number of write cycles is shown in FIGS. 36A and 36B.

The semiconductor device illustrated in FIG. 36A includes a transistor 3200 using a first semiconductor, a transistor 3300 using a second semiconductor, and a capacitor 3400. Note that any of the above-described transistors can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 36A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 36A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is off, so that the transistor 3300 is turned off. Thus, the charge is held at the node FG (retaining).

Since the off-state current of the transistor 3300 is low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is brought into "on state." In the case where the low-level charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. In the case where data of the other memory cells is not read, the fifth wiring 3005 may be supplied with a potential at which the transistor 3200 is in "off state" regardless of the charge supplied to the node FG, that is, a potential lower than $V_{th\_H}$. Alternatively, the fifth wiring 3005 may be supplied with a potential at which the transistor 3200 is brought into "on state" regardless of the charge supplied to the node FG, that is, a potential higher than $V_{th\_L}$.

<Structure 3 of Semiconductor Device>

Figure 37:
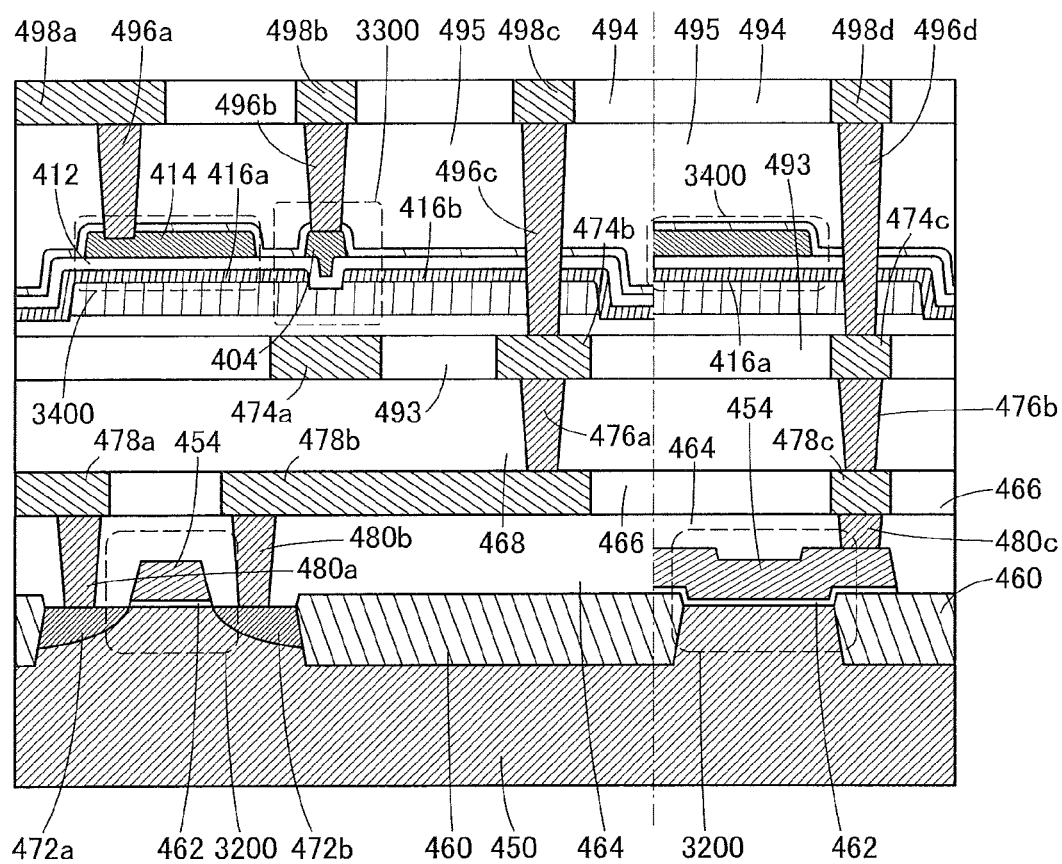
FIG. 37 is a cross-sectional view illustrating a semiconductor device of one embodiment of the present invention.

FIG. 37 is a cross-sectional view of the semiconductor device of FIG. 36A. The semiconductor device shown in FIG. 37 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIGS. 34A and 34B is referred to. Note that although the transistor 2200 is illustrated as a p-channel transistor in FIGS. 34A and 34B, the transistor 3200 may be an n-channel transistor.

The transistor 3200 illustrated in FIG. 37 is a transistor using the semiconductor substrate 450. The transistor 3200 includes the region 472a in the semiconductor substrate 450, the region 472b in the semiconductor substrate 450, the insulator 462, and the conductor 454.

The semiconductor device illustrated in FIG. 37 includes the insulator 464, the insulator 466, the insulator 468, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, the conductor 498c, a conductor 498d, the insulator 493, the insulator 495, and the insulator 494.

The insulator 464 is provided over the transistor 3200. The insulator 466 is provided over the insulator 464. The insulator 468 is provided over the insulator 466. The insulator 493 is provided over the insulator 468. The transistor 3300 is provided over the insulator 493. The insulator 495 is provided over the transistor 3300. The insulator 494 is provided over the insulator 495.

The insulator 464 has an opening reaching the region 472a, an opening reaching the region 472b, and an opening reaching the conductor 454. In the openings, the conductor 480a, the conductor 480b, and the conductor 480c are embedded.

In addition, the insulator 466 includes an opening reaching the conductor 480a, an opening reaching the conductor 480b, and an opening reaching the conductor 480c. In the openings, the conductor 478a, the conductor 478b, and the conductor 478c are embedded.

In addition, the insulator 468 includes an opening reaching the conductor 478b and an opening reaching the conductor 478c. In the openings, the conductor 476a and the conductor 476b are embedded.

Furthermore, the insulator 493 includes an opening overlapping with the channel formation region of the transistor 3300, an opening reaching the conductor 476a, and an opening reaching the conductor 476b. In the openings, the conductor 474a, the conductor 474b, and the conductor 474c are embedded.

The conductor 474a may have a function as a bottom gate electrode of the transistor 3300. Alternatively, for example, electric characteristics such as the threshold voltage of the transistor 3300 may be controlled by application of a constant potential to the conductor 474a. Further alternatively, for example, the conductor 474a and the conductor 404 that is the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

The insulator 495 includes an opening reaching the conductor 474b through the conductor 416b that is one of a source electrode and a drain electrode of the transistor 3300, an opening reaching the conductor 414 that overlaps with the conductor 416a that is the other of the source electrode and the drain electrode of the transistor 3300 with the insulator 412 provided therebetween, an opening reaching the conductor 404 that is the gate electrode of the transistor 3300, and an opening reaching the conductor 474c through the conductor 416a that is the other of the source electrode and the drain electrode of the transistor 3300. In the openings, the conductor 496a, the conductor 496b, the conductor 496c, and the conductor 496d are embedded. Note that in some cases, an opening provided in a component of the transistor 3300 or the like is through other components.

The insulator 494 includes an opening reaching the conductor 496a, an opening reaching the conductors 496b, an opening reaching the conductor 496c, and an opening reaching the conductor 496d. In the openings, the conductors 498a, 498b, 498c, and 498d are embedded.

At least one of the insulators 464, 466, 468, 493, 495, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

For a material that can be used for the conductor 498d, the description of the conductor 480a can be referred to, for example.

The source or drain of the transistor 3200 is electrically connected to the conductor 416b that is one of the source electrode and the drain electrode of the transistor 3300 through the conductor 480a, the conductor 478a, the conductor 476a, the conductor 474b, and the conductor 496c. The conductor 454 that is the gate electrode of the transistor 3200 is electrically connected to the conductor 416a that is the other of the source electrode and the drain electrode of the transistor 3300 through the conductor 480c, the conductor 478c, the conductor 476b, the conductor 474c, and the conductor 496d.

The capacitor 3400 includes an electrode electrically connected to the other of the source electrode and the drain electrode of the transistor 3300, the conductor 414, and the insulator 412. Because the insulator 412 can be formed by the same step as a gate insulator of the transistor 3300, productivity can be preferably increased in some cases. When a layer faulted by the same step as a gate electrode of the transistor 3300 is used as the conductor 414, productivity can be preferably increased in some cases.

For the structures of other components, the description of FIG. 35 and the like can be referred to as appropriate. Note that although the transistor 2200 is illustrated as a p-channel transistor in FIG. 35, the transistor 3200 may be an n-channel transistor.

Note that in FIG. 37, the structure of the transistor 491 or the transistor 492 illustrated in FIG. 24 may be used as the structure of the transistor 3200. The transistors 491 and 492 illustrated in FIG. 24 each have a fin-type structure.

In FIG. 37, the structure of the transistor 491 or the transistor 492 illustrated in FIG. 25 may be used as the structure of the transistor 3200. The transistors 491 and 492 illustrated in FIG. 25 are provided in the semiconductor substrate 450 that is an SOI substrate.

<Memory Device 2>

The semiconductor device in FIG. 36B is different from the semiconductor device in FIG. 36A in that the transistor 3200 is not provided. Also in this case, data can be written and retained in a manner similar to that of the semiconductor device in FIG. 36A.

Reading of data in the semiconductor device in FIG. 36B is described. When the transistor 3300 is brought into on state, the third wiring 3003 which is in a floating state and the capacitor 3400 are brought into conduction, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_B C \times V)/(C_B+C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0}+C \times V_1)/(C_B+C)$) is higher than the potential of the third wiring 3003 in the case of retaining the potential $V_0$ ($=(C_B \times V_{B0}+C \times V_0)/(C_B+C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

At least part of this embodiment can be implemented in combination with any of the other embodiments described in this specification as appropriate.

Embodiment 4

An imaging device of one embodiment of the present invention is described below.

<Imaging Device>

Figure 38A:
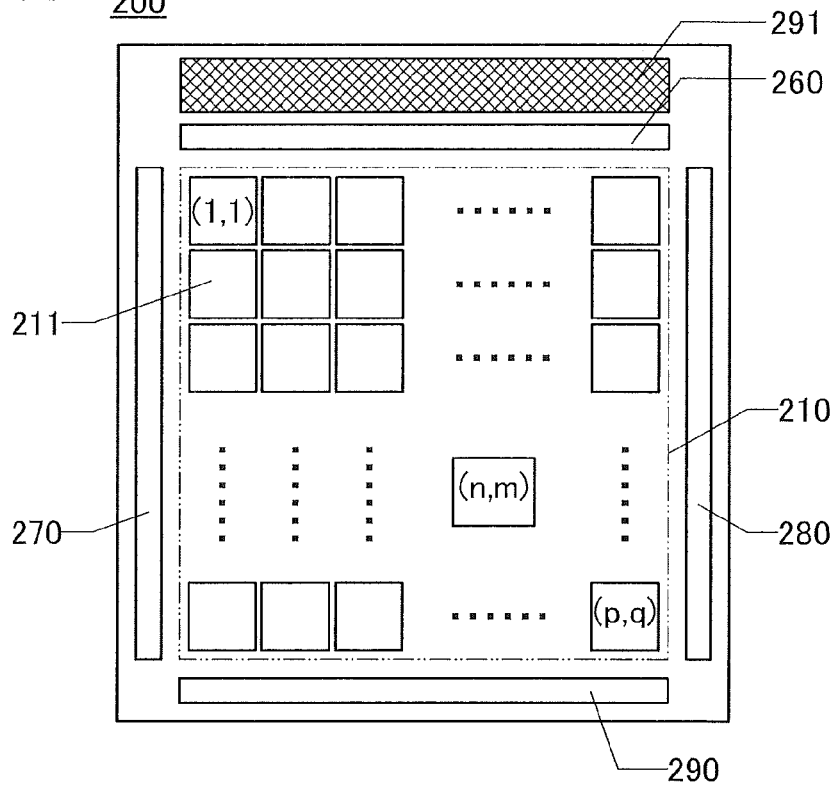
FIGS. 38A and 38B are top views each illustrating a semiconductor device of one embodiment of the present invention.

FIG. 38A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each a natural number greater than or equal to 2). The peripheral circuit 260, the peripheral circuit 270, the peripheral circuit 280, and the peripheral circuit 290 are each connected to a plurality of pixels 211, and a signal for driving the plurality of pixels 211 is supplied. In this specification and the like, in some cases, "a peripheral circuit" or "a driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. A semiconductor device such as an IC chip may be used as part or the whole of the peripheral circuit. Note that as the peripheral circuit, one or more of the peripheral circuits 260, 270, 280, and 290 may be omitted.

Figure 38B:
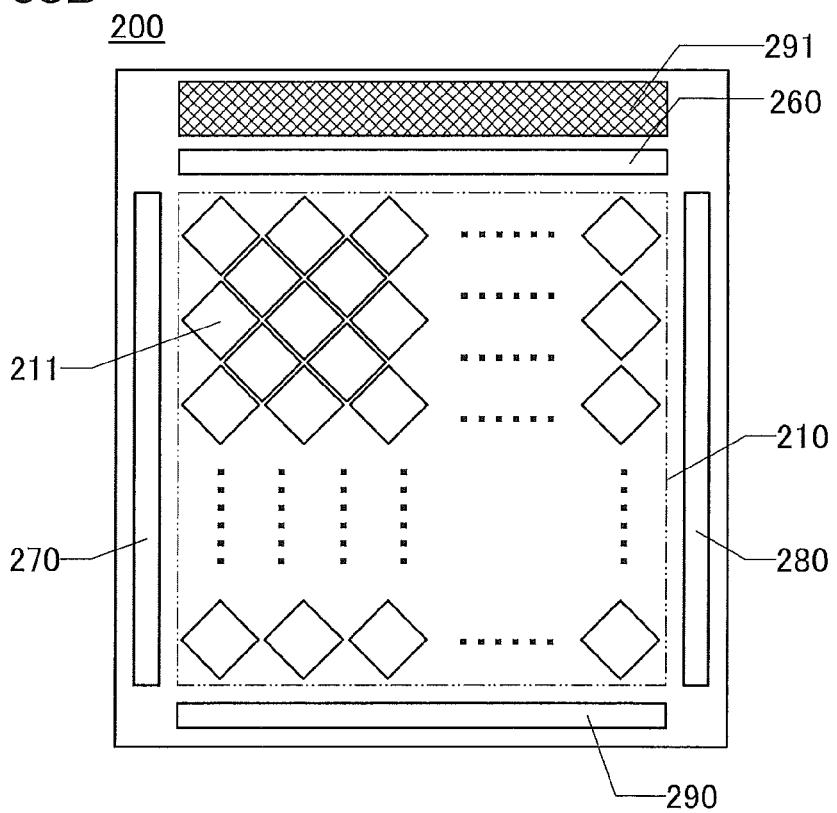

As illustrated in FIG. 38B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 39A:
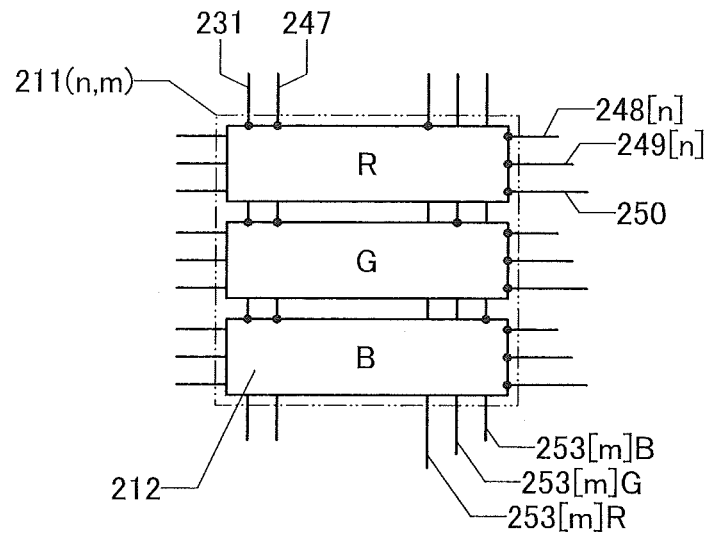
FIGS. 39A and 39B are block diagrams each illustrating a semiconductor device of one embodiment of the present invention.

FIG. 39A is a plan view showing an example of the pixel 211 with which a color image is obtained. The pixel 211 illustrated in FIG. 39A includes a subpixel 212 provided with a color filter transmitting light with a red (R) wavelength band (also referred to as a "subpixel 212R"), a subpixel 212 provided with a color filter transmitting light with a green (G) wavelength band (also referred to as a "subpixel 212G"), and a subpixel 212 provided with a color filter transmitting light with a blue (B) wavelength band (also referred to as a "subpixel 212B"). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the in-th column is referred to as a wiring 253[m]. Note that in FIG. 39A, the wirings 253 connected to the subpixel 212R, the subpixel 212G, and the subpixel. 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 39B:
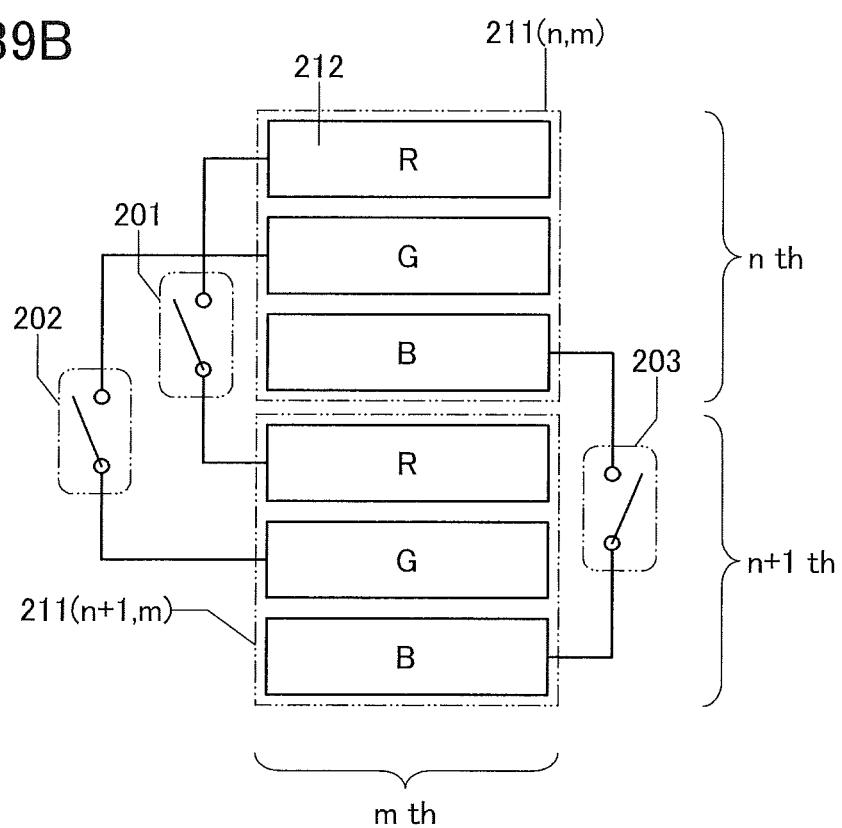

The imaging device 200 has a structure in which the subpixel 212 is electrically connected to the subpixel 212 in an adjacent pixel 211 which is provided with a color filter transmitting light with the same wavelength band as the subpixel 212, via a switch. FIG. 39B shows a connection example of the subpixels 212: the subpixel 212 in the pixel 211 arranged in an n-th (n is an integer greater than or equal to 1 and less than or equal to p) row and an in-th (in is an integer greater than or equal to 1 and less than or equal to q) column and the subpixel 212 in the adjacent pixel 211 arranged in an (n+1)-th row and the m-th column. In FIG. 39B, the subpixel 212R arranged in the n-th row and the m-th column and the subpixel 212R arranged in the (n+1)-th row and the in-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light with four different wavelength bands are provided in one pixel 211, the reproducibility of colors of an obtained image can be increased.

For example, in FIG. 39A, in regard to the subpixel 212 sensing a red wavelength band, the subpixel 212 sensing a green wavelength band, and the subpixel 212 sensing a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 40A and 40B. With the lens 255, the photoelectric conversion element can receive incident light efficiently. Specifically, as illustrated in FIG. 40A, light 256 enters a photoelectric conversion element 220 through the lens 255, the filter 254 (a filter 254R, a filter 254G, and a filter 254B), a pixel circuit 230, and the like which are provided in the pixel 211.

However, as indicated by a region surrounded by dashed-dotted lines, part of light 256 indicated by arrows might be blocked by some wirings 257. Thus, a preferable structure is that the lens 255 and the filter 254 are provided on the photoelectric conversion element 220 side, so that the photoelectric conversion element 220 can efficiently receive the light 256 as illustrated in FIG. 40B. When the light 256 enters the photoelectric conversion element 220 from the photoelectric conversion element 220 side, the imaging device 200 with high sensitivity can be provided.

Figure 40A:
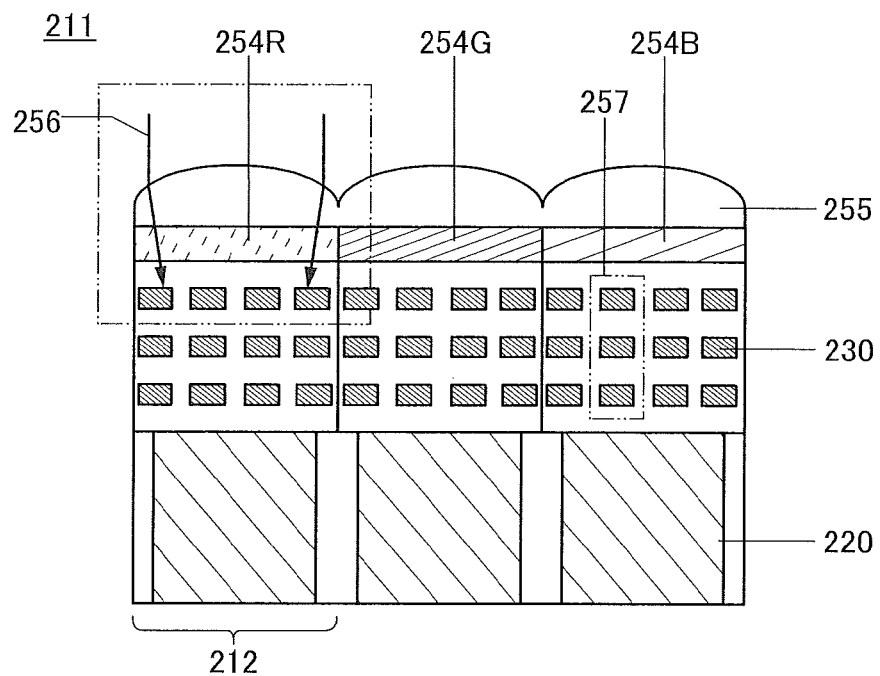
FIGS. 40A and 40B are cross-sectional views illustrating a semiconductor device of one embodiment of the present invention.
Figure 40B:
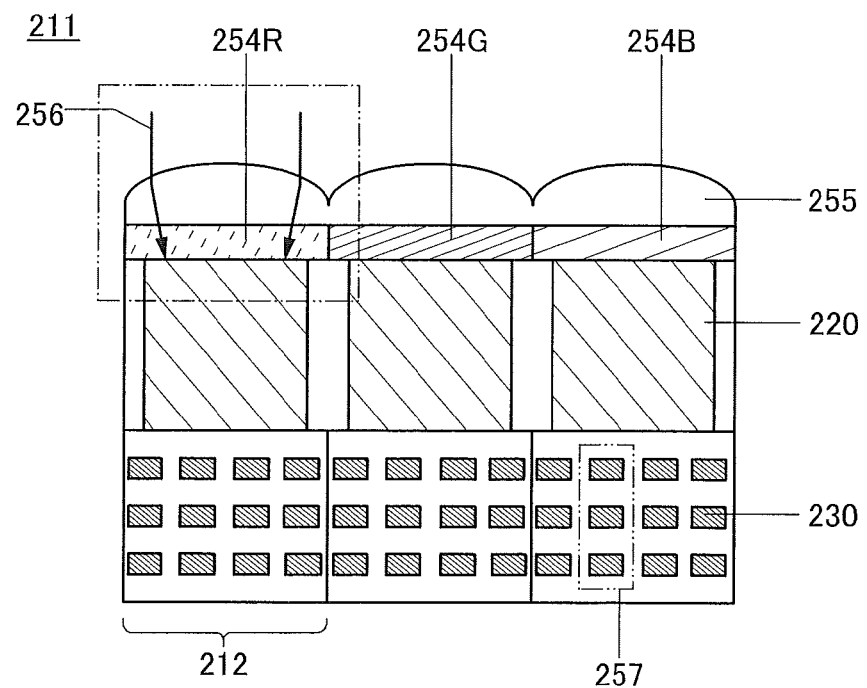

As the photoelectric conversion element 220 illustrated in FIGS. 40A and 40B, a photoelectric conversion element in which a p-n junction or a p-i-n junction is formed may be used.

The photoelectric conversion element 220 may be formed using a substance that has a function of absorbing a radiation and generating charges. Examples of the substance that has a function of absorbing a radiation and generating charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 39A and 39B.

<Configuration Example 2 of Pixel>

An example of a pixel including a transistor using silicon and a transistor using an oxide semiconductor is described below.

Figure 41A:
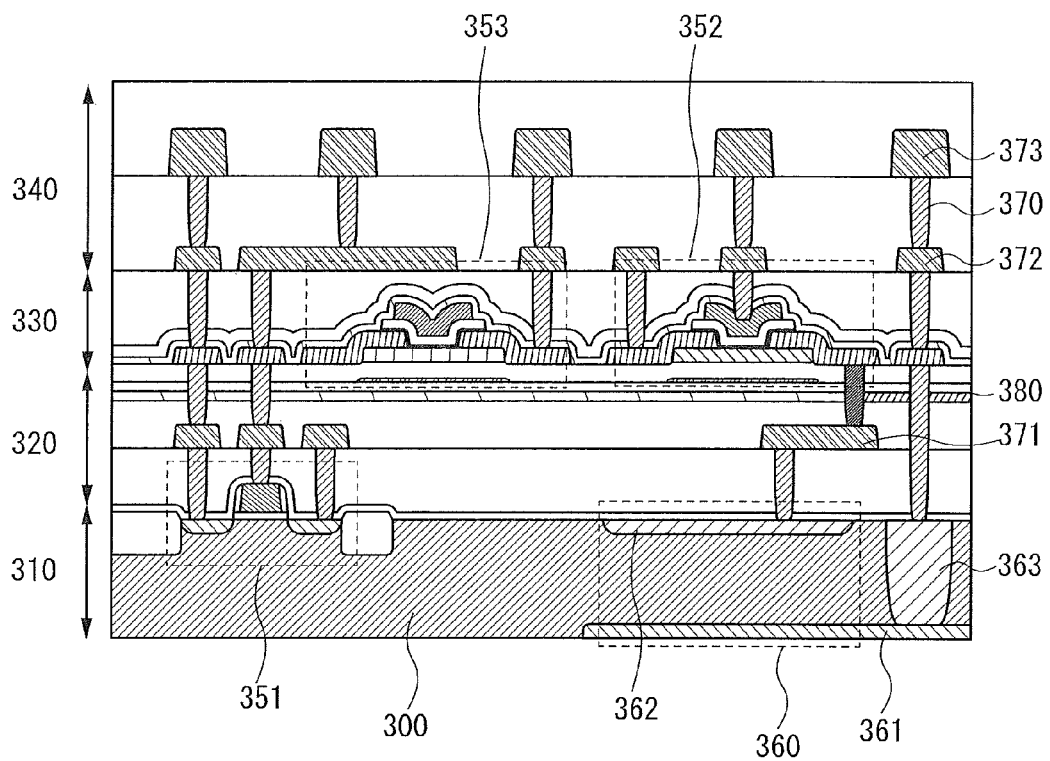
FIGS. 41A and 41B are cross-sectional views illustrating a semiconductor device of one embodiment of the present invention.
Figure 41B:
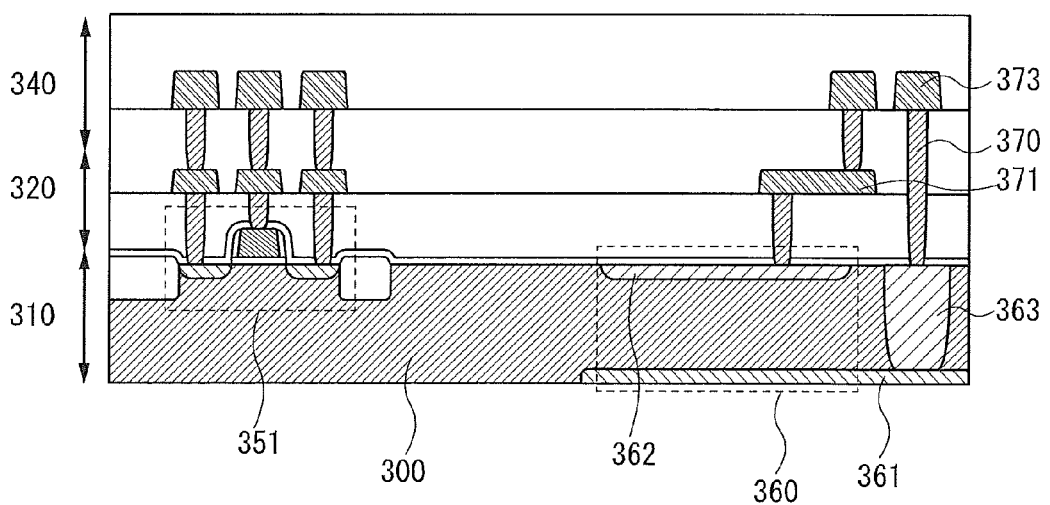

FIGS. 41A and 41B are each a cross-sectional view of an element included in an imaging device. The imaging device illustrated in FIG. 41A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 41A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case of forming a pixel with use of transistors, the layer 310 may include the transistor. Alternatively, the layer 310 may be omitted, and the pixel may include only transistors.

In the case of forming a pixel with use of transistors, the layer 330 may be omitted. An example of a cross-sectional view in which the layer 330 is not provided is shown in FIG. 41B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

For the insulator 380, the description of the insulator 408 is referred to, for example.

In the cross-sectional view in FIG. 41A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 42A1 and FIG. 42B1, part or the whole of the imaging device can be bent. FIG. 42A1 illustrates a state in which the imaging device is bent in the direction of two-dotted chain line X1-X2. FIG. 42A2 is a cross-sectional view illustrating a portion indicated by two-dotted chain line X1-X2 in FIG. 42A1. FIG. 42A3 is a cross-sectional view illustrating a portion indicated by two-dotted chain line Y1-Y2 in FIG. 42A1.

FIG. 42B1 illustrates a state where the imaging device is bent in the direction of two-dotted chain line X3-X4 and the direction of two-dotted chain line Y3-Y4. FIG. 42B2 is a cross-sectional view illustrating a portion indicated by two-dotted chain line X3-X4 in FIG. 42B1. FIG. 42B3 is a cross-sectional view illustrating a portion indicated by two-dotted chain line Y3-Y4 in FIG. 42B1.

The bent imaging device enables the curvature of field and astigmatism to be reduced. Thus, the optical design of lens and the like, which is used in combination of the imaging device, can be facilitated. For example, the number of lens used for aberration correction can be reduced; accordingly, a reduction of size or weight of electronic devices using the imaging device, and the like, can be achieved. In addition, the quality of a captured image can be improved.

At least part of this embodiment can be implemented in combination with any of the other embodiments described in this specification as appropriate.

Embodiment 5

A CPU including a semiconductor device such as any of the above-described transistors or the above-described memory device is described in this embodiment.

<CPU>

Figure 43:
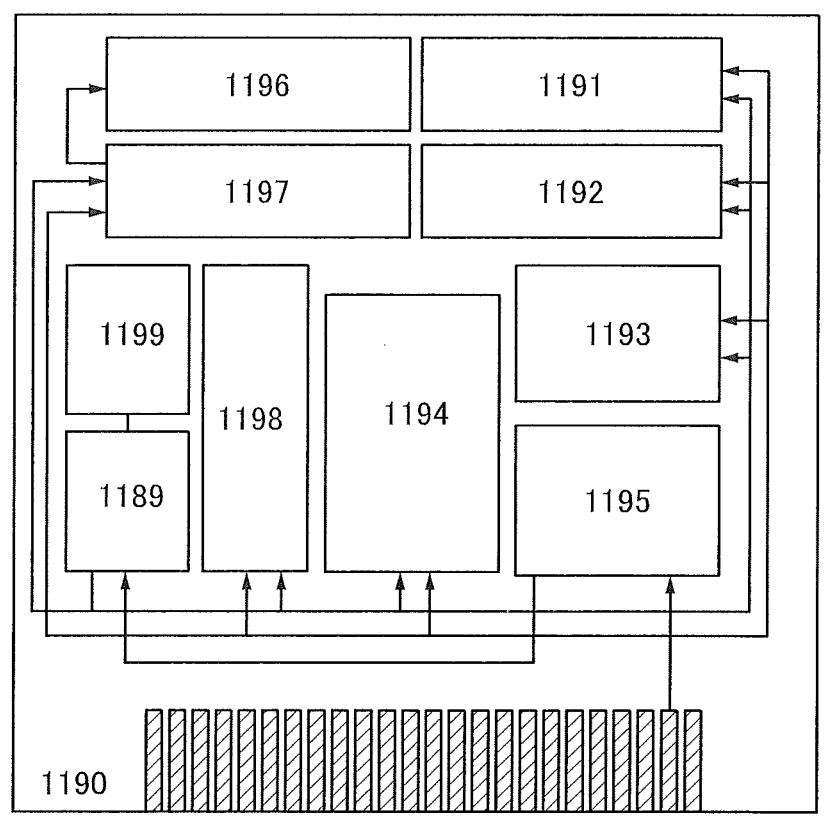
FIG. 43 is a block diagram illustrating a semiconductor device of one embodiment of the present invention.

FIG. 43 is a block diagram illustrating a configuration example of a CPU including any of the above-described transistors as a component.

The CPU illustrated in FIG. 43 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 43 is just an example in which the configuration has been simplified, and an actual CPU may have a variety of configurations depending on the application. For example, the CPU may have the following configuration: a structure including the CPU illustrated in FIG. 43 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 43, a memory cell is provided in the register 1196. For the memory cell of the register 1196, any of the above-described transistors, the above-described memory device, or the like can be used.

In the CPU illustrated in FIG. 43, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 44:
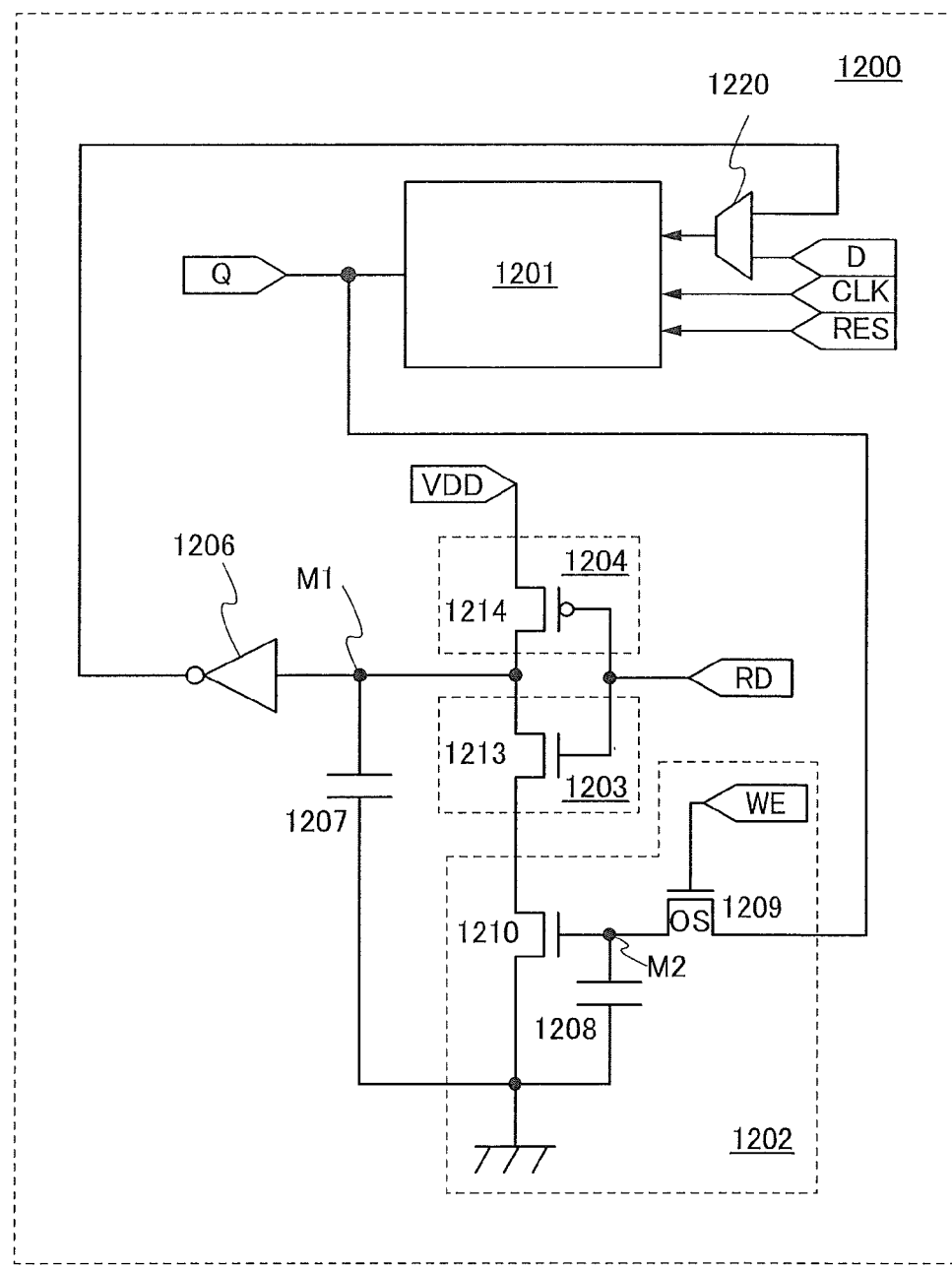
FIG. 44 is a circuit diagram illustrating a semiconductor device of one embodiment of the present invention.

FIG. 44 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 44 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 44, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 44, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 44, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency (RF) device.

At least part of this embodiment can be implemented in combination with any of the other embodiments described in this specification as appropriate.

Embodiment 6

A display device of one embodiment of the present invention is described below with reference to FIGS. 45A to 45C and FIGS. 46A and 46B.

<Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 45A:
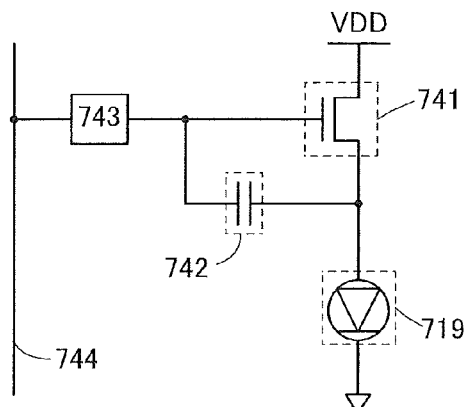
FIGS. 45A to 45C are a circuit diagram, a top view, and a cross-sectional view illustrating a semiconductor device of one embodiment of the present invention.
Figure 45B:
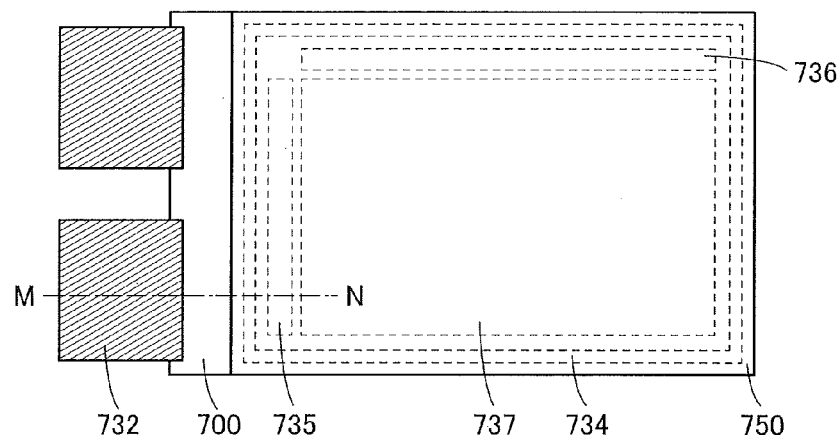
Figure 45C:
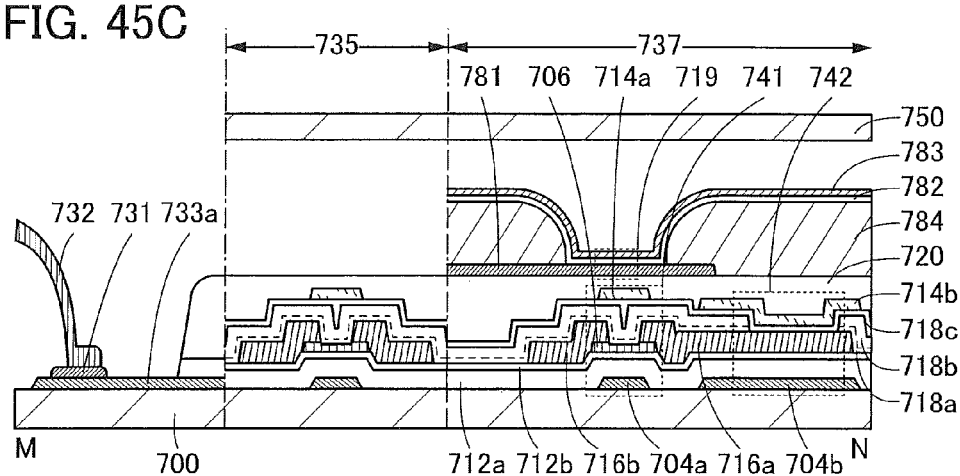

FIGS. 45A to 45C illustrate an example of an EL display device according to one embodiment of the present invention. FIG. 45A is a circuit diagram of a pixel in an EL display device. FIG. 45B is a plan view showing the whole of the EL display device. FIG. 45C is a cross-sectional view taken along part of dashed-dotted line M-N in FIG. 45B.

FIG. 45A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 45A includes a switching element 743, a transistor 741, a capacitor 742, and a light-emitting element 719.

Note that FIG. 45A and the like each illustrate an example of a circuit structure; therefore, a transistor can be provided additionally. In contrast, for each node in FIG. 45A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 45B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 45C is a cross-sectional view of the EL display device taken along part of dashed-dotted line M-N in FIG. 45B.

FIG. 45C illustrates a structure of the transistor 741 including a conductor 704a over the substrate 700; an insulator 712a over the conductor 704a; an insulator 712b over the insulator 712a; a semiconductor 706 that is over the insulator 712b and overlaps with the conductor 704a; a conductor 716a and a conductor 716b in contact with the semiconductor 706; an insulator 718a over the semiconductor 706, the conductor 716a, and the conductor 716b; an insulator 718b over the insulator 718a; an insulator 718c over the insulator 718b; and a conductor 714a that is over the insulator 718c and overlaps with the semiconductor 706. Note that the structure of the transistor 741 is just an example; the transistor 741 may have a structure different from that illustrated in FIG. 45C.

Thus, in the transistor 741 illustrated in FIG. 45C, the conductor 704a serves as a gate electrode, the insulator 712a and the insulator 712b serve as a gate insulator, the conductor 716a serves as a source electrode, the conductor 716b serves as a drain electrode, the insulator 718a, the insulator 718b, and the insulator 718c serve as a gate insulator, and the conductor 714a serves as a gate electrode. Note that in some cases, electrical characteristics of the semiconductor 706 change if light enters the semiconductor 706. To prevent this, it is preferable that one or more of the conductor 704a, the conductor 716a, the conductor 716b, and the conductor 714a have a light-blocking property.

Note that the interface between the insulator 718a and the insulator 718b is indicated by a broken line. This means that the boundary between them is not clear in some cases. For example, in the case where the insulator 718a and the insulator 718b are formed using insulators of the same kind, the insulator 718a and the insulator 718b are not distinguished from each other in some cases depending on an observation method.

FIG. 45C illustrates a structure of the capacitor 742 including a conductor 704b over the substrate; the insulator 712a over the conductor 704b; the insulator 712b over the insulator 712a; the conductor 716a that is over the insulator 712b and overlaps with the conductor 704b; the insulator 718a over the conductor 716a; the insulator 718b over the insulator 718a; the insulator 718c over the insulator 718b; and a conductor 714b that is over the insulator 718c and overlaps with the conductor 716a. In this structure, a part of the insulator 718a and a part of the insulator 718b are removed in a region where the conductor 716a and the conductor 714b overlap with each other.

In the capacitor 742, each of the conductor 704b and the conductor 714b serves as one electrode, and the conductor 716a serves as the other electrode.

Thus, the capacitor 742 can be formed using a film of the transistor 741. The conductor 704a and the conductor 704b are preferably conductors of the same kind, in which case the conductor 704a and the conductor 704b can be formed through the same step. Furthermore, the conductor 714a and the conductor 714b are preferably conductors of the same kind, in which case the conductor 714a and the conductor 714b can be formed through the same step.

The capacitor 742 illustrated in FIG. 45C has a large capacitance per area occupied by the capacitor. Therefore, the EL display device illustrated in FIG. 45C has high display quality. Note that although the capacitor 742 illustrated in FIG. 45C has the structure in which the part of the insulator 718a and the part of the insulator 718b are removed to reduce the thickness of the region where the conductor 716a and the conductor 714b overlap with each other, the structure of the capacitor according to one embodiment of the present invention is not limited to the structure. For example, a structure in which a part of the insulator 718c is removed to reduce the thickness of the region where the conductor 716a and the conductor 714b overlap with each other may be used.

An insulator 720 is provided over the transistor 741 and the capacitor 742. Here, the insulator 720 may have an opening reaching the conductor 716a that serves as the source electrode of the transistor 741. A conductor 781 is provided over the insulator 720. The conductor 781 may be electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 46A:
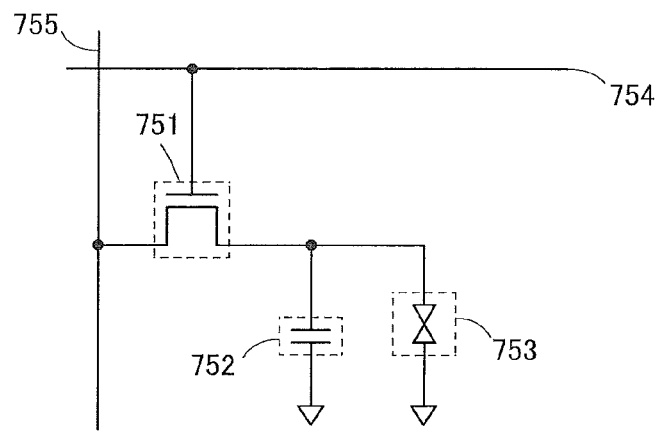
FIGS. 46A and 46B are a circuit diagram and a cross-sectional view illustrating a semiconductor device of one embodiment of the present invention.

FIG. 46A is a circuit diagram illustrating a configuration example of a pixel of a liquid crystal display device. A pixel shown in FIGS. 46A and 46B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 46B:
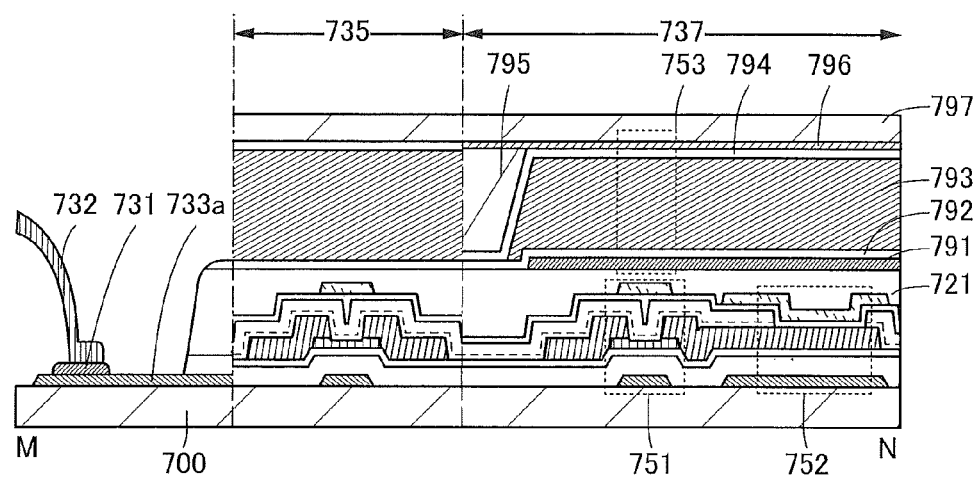

Note that the description of the liquid crystal display device is made on the assumption that the plan view of the liquid crystal display device is similar to that of the EL display device. FIG. 46B is a cross-sectional view of the liquid crystal display device taken along dashed-dotted line M-N in FIG. 45B. In FIG. 46B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 46B corresponds to, but is not limited to, the structure of the capacitor 742 in FIG. 45C.

Note that in the case where an oxide semiconductor is used as the semiconductor of the transistor 751, the off-state current of the transistor 751 can be extremely small. Therefore, a charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device having electronic ink, Electronic Liquid Powder (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by an MOCVD method. Note that when the graphene is provided, the GaN semiconductors included in the LED can also be formed by a sputtering method.

At least part of this embodiment can be implemented in combination with any of the other embodiments described in this specification as appropriate.

Embodiment 7

In this embodiment, an electronic device and the like on each of which a semiconductor device of one embodiment of the present invention is mounted are described.
<Electronic Device>
The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 47A to 47F illustrate specific examples of these electronic devices.

Figure 47A:
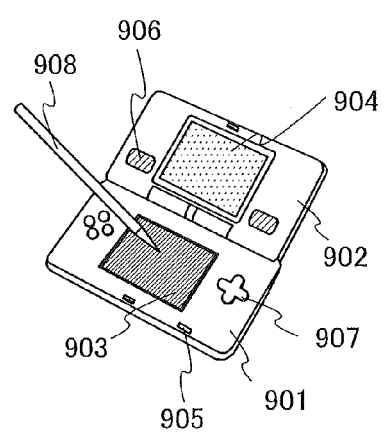
FIGS. 47A to 47F are perspective views each illustrating an electronic device of one embodiment of the present invention.

FIG. 47A illustrates a portable game console including a housing 901, a housing 902, a display portion 903, a display portion 904, a microphone 905, a speaker 906, an operation key 907, a stylus 908, and the like. Although the portable game console in FIG. 47A has the two display portions 903 and 904, the number of display portions included in a portable game console is not limited to this.

Figure 47B:
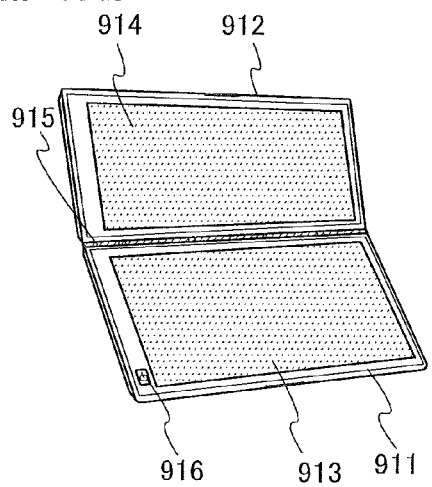

FIG. 47B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 47C:
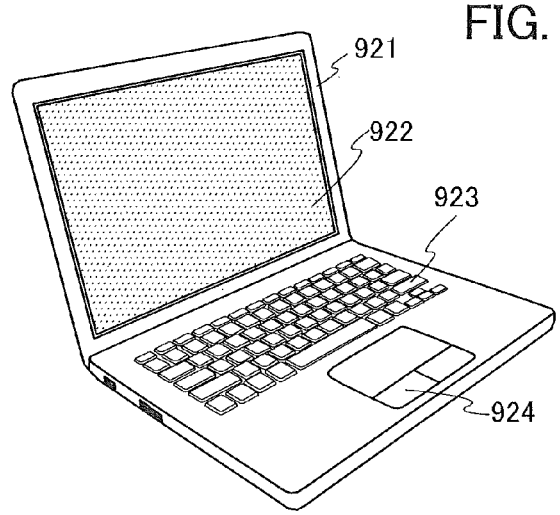

FIG. 47C illustrates a laptop personal computer, which includes a housing 921, a display portion 922, a keyboard 923, a pointing device 924, and the like.

Figure 47D:
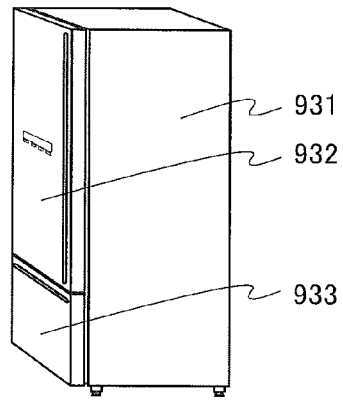

FIG. 47D illustrates the electric refrigerator-freezer including a housing 931, a door for a refrigerator 932, a door for a freezer 933, and the like.

Figure 47E:
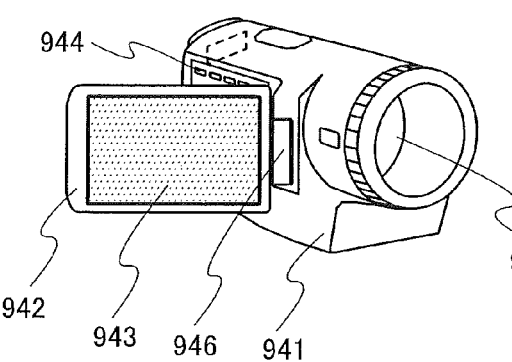

FIG. 47E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 47F:
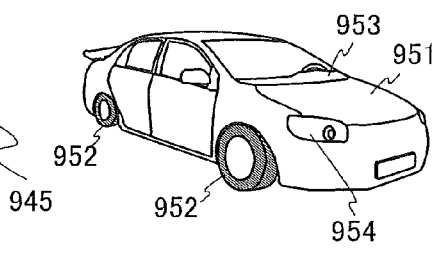

FIG. 47F illustrates an ordinary vehicle including a car body 951, wheels 952, a dashboard 953, lights 954, and the like.

At least part of this embodiment can be implemented in combination with any of the other embodiments described in this specification as appropriate.

Example 1

In this example, the spin densities in oxide semiconductor films were evaluated by ESR.

A method for fabricating samples used in this example is described.

First, a 0.5-mm-thick quartz substrate was prepared as a substrate. Next, as the oxide semiconductor film, a 50-nm-thick In—Ga—Zn oxide film was formed. Next, heat treatment was performed in a nitrogen atmosphere at 450° C. for an hour. Next, heat treatment was performed in an oxygen atmosphere at 450° C. for an hour. Next, a 10-nm-thick silicon oxynitride film was formed over the oxide semiconductor film. Then, plasma treatment was performed. As the plasma treatment, oxygen ($O_2$) plasma treatment or nitrous oxide ($N_2O$) plasma treatment was performed for 90 seconds, 180 seconds, or 300 seconds.

Note that an In—Ga—Zn oxide film was formed by a sputtering method using an In—Ga—Zn oxide target having an atomic ratio of In:Ga:Zn=1:1:1. As a deposition gas, a gas in which argon and oxygen were mixed so that the volume of oxygen was 33% was used. The pressure in the deposition was adjusted to 0.7 Pa with Miniature Gauge MG-2 manufactured by CANON ANELVA CORPORATION. Deposition power of 0.5 kW was used with a DC power source. The substrate temperature was set to 300° C.

The silicon oxynitride film was formed by a PECVD method. As the deposition gas, a gas containing monosilane and nitrous oxide at a volume ratio of 1:800 was used. The pressure in the film formation was adjusted to 200 Pa. The deposition power was set to 150 W with a 60 MHz high-frequency power source. The substrate temperature was set to 350° C.

In the oxygen ($O_2$) plasma treatment, oxygen with a flow rate of 800 sccm was supplied to a reaction chamber of a PECVD apparatus by a PECVD method. The pressure during the supply was adjusted to 200 Pa. The deposition power was set to 150 W with a 60 MHz high-frequency power source. The substrate temperature was set to 350° C.

In the nitrous oxide ($N_2O$) plasma treatment, nitrous oxide with a flow rate of 800 sccm was supplied to a reaction chamber of a PECVD apparatus by a PECVD method. The pressure during the supply was adjusted to 200 Pa. The deposition power was set to 150 W with a 60 MHz high-frequency power source. The substrate temperature was set to 350° C.

Figure 48:
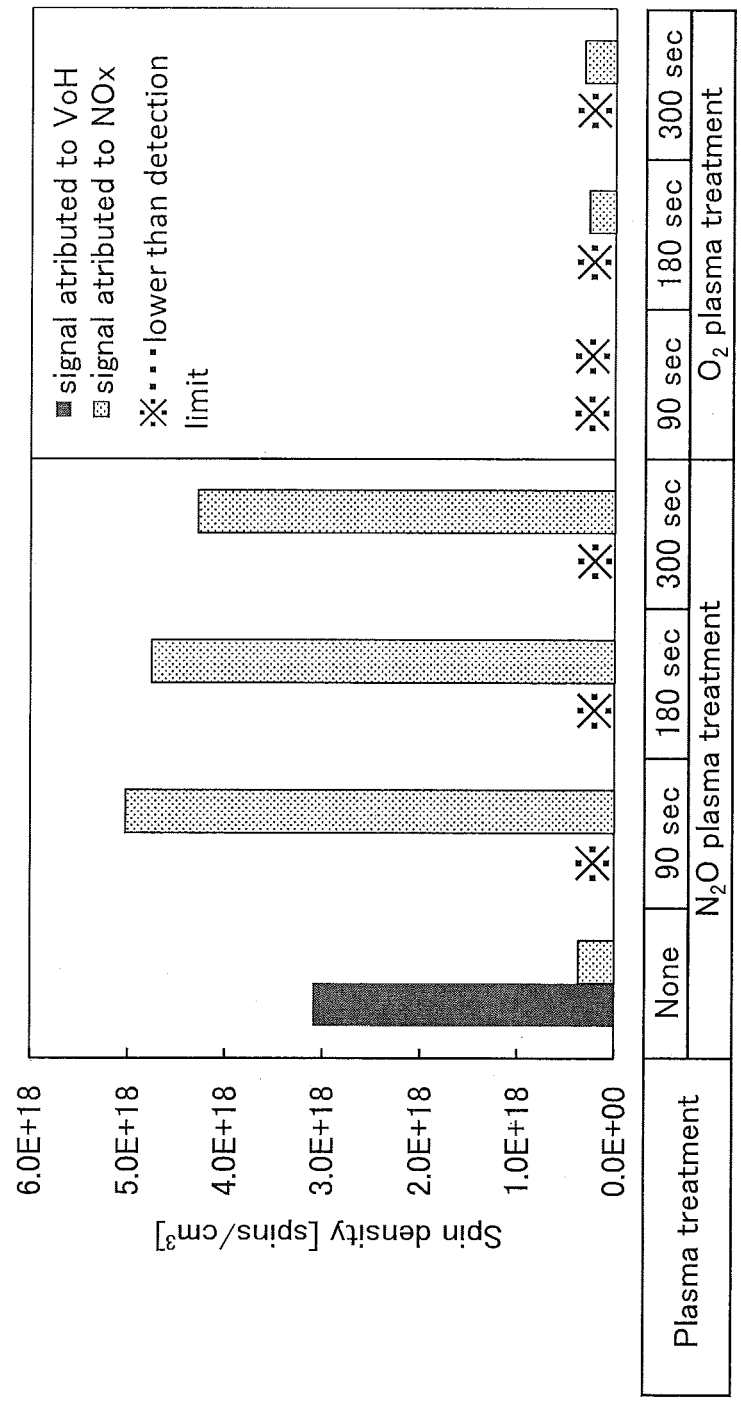
FIG. 48 shows spin densities evaluated by electron spin resonance.

Next, the samples were evaluated by ESR. A sample in which plasma treatment was not performed was also evaluated by ESR. The samples were placed so that a surface of the In—Ga—Zn oxide film was perpendicular to a magnetic field. FIG. 48 shows spin densities of signals that appear when the g-factor is in the vicinity of 1.93 in the oxide semiconductor film (hereinafter, also referred to as "signals attributed to $V_OH$") and spin densities relating to "signals attributed to $NO_x$" in an insulating film. For evaluation by ESR, an electron spin resonance spectrometer JES-FA300 manufactured by JEOL Ltd. was used.

It was confirmed from FIG. 48 that the spin density of a signal attributed to $V_OH$ in the oxide semiconductor film became lower than the detection limit (here, $2.6 \times 10^{17}$ spins/$cm^3$) by plasma treatment. Furthermore, the spin density of a signal attributed to $V_OH$ was reduced as the plasma treatment was performed for a longer time. When the oxygen ($O_2$) plasma treatment was compared with the nitrous oxide ($N_2O$) plasma treatment, the oxygen ($O_2$) plasma treatment was more preferable because the spin density of a signal attributed to No was reduced.

Figure 49:
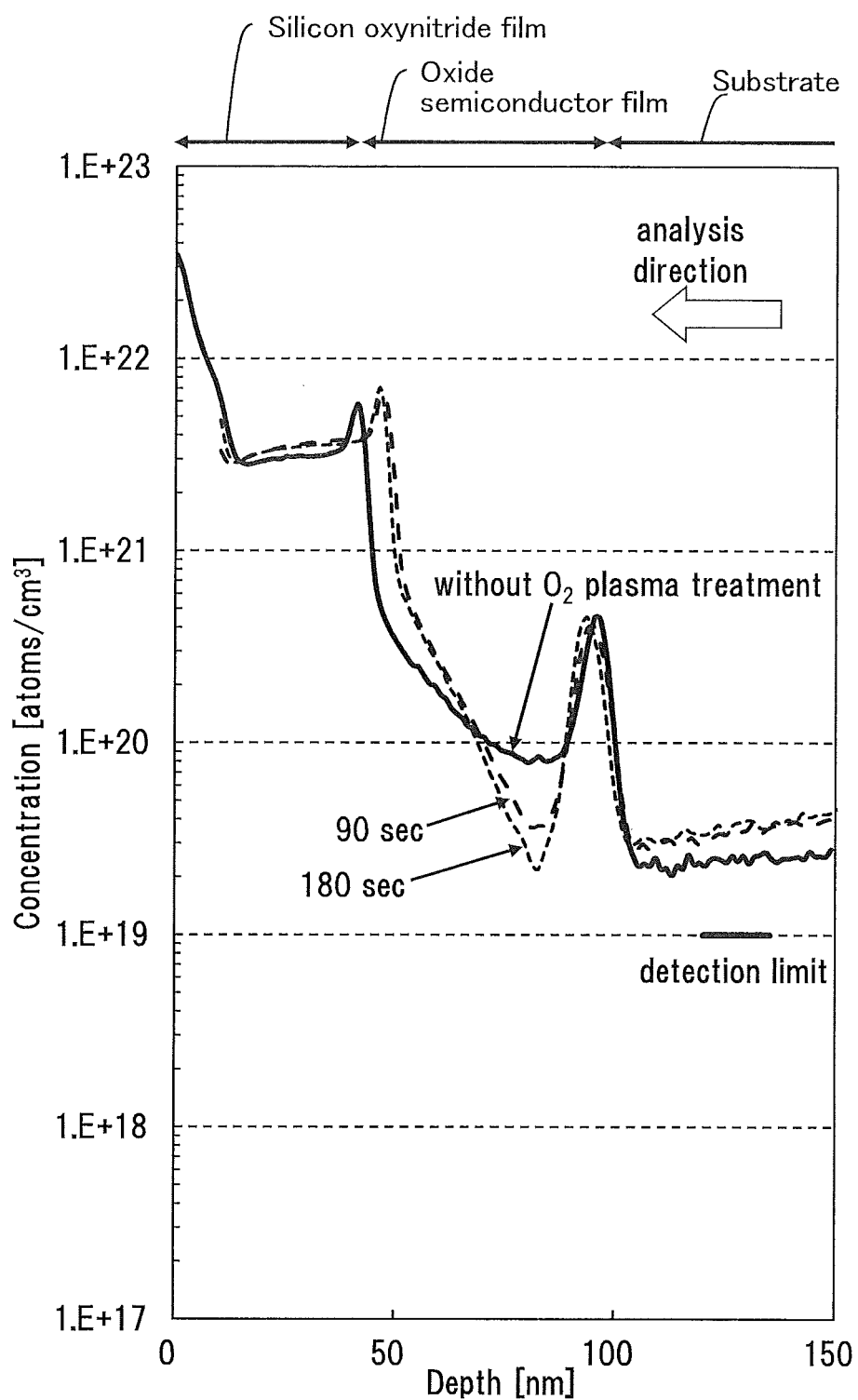
FIG. 49 shows depth profiles of hydrogen concentrations of samples in Example.

Among the above samples, the hydrogen concentrations of the samples in which the oxygen ($O_2$) plasma treatment was performed for 0 seconds (no plasma treatment), 90 seconds, and 180 seconds were evaluated. A SIMS analysis apparatus was used for the evaluation of the hydrogen concentrations. FIG. 49 shows depth profiles of the hydrogen concentrations of the samples. The hydrogen concentration of the sample in which the plasma treatment was performed for 0 seconds is indicated by a solid line, and the hydrogen concentrations of the other samples are indicated by broken lines.

It was confirmed from FIG. 49 that the hydrogen concentration in the oxide semiconductor film was able to be reduced by the oxygen ($O_2$) plasma treatment. Furthermore, it is indicated that by reducing the hydrogen concentration in the oxide semiconductor film, the spin density of a signal attributed to $V_0H$ was able to be reduced.

Example 2

In this example, the spin density in the oxide semiconductor film that has been subjected to plasma treatment in the case where stacked films were formed over the oxide semiconductor film was evaluated.

A method for fabricating samples used in this example is described.

First, a 0.5-mm-thick quartz substrate was prepared as a substrate. Next, as the oxide semiconductor film, a 50-nm-thick In—Ga—Zn oxide film was formed. Next, heat treatment was performed in a nitrogen atmosphere at 450° C. for an hour. Next, heat treatment was performed in an oxygen atmosphere at 450° C. for an hour. Next, a 5-nm-thick metal oxide film was formed as a metal oxide film. Next, a 10-nm-thick silicon oxynitride film was formed over the metal oxide film. Then, oxygen ($O_2$) plasma treatment was performed.

An In—Ga—Zn oxide film used as the oxide semiconductor film was formed by a sputtering method using an In—Ga—Zn oxide target having an atomic ratio of In:Ga:Zn=1:1:1. As a deposition gas, a gas in which argon and oxygen were mixed so that the volume of oxygen was 33% was used. The pressure in the deposition was adjusted to 0.7 Pa with Miniature Gauge MG-2F manufactured by CANON ANELVA CORPORATION. Deposition power of 0.5 kW was used with a DC power source. The distance between the substrate and the target was set to 60 mm, and the substrate temperature was set to 300° C.

For the metal oxide film, a condition 1 and a condition 2 were employed. A sample fabricated under the condition 1 is referred to as a sample A and a sample fabricated under the condition 2 is referred to as a sample B.

Under the condition 1, an In—Ga—Zn oxide film was formed by a sputtering method using an In—Ga—Zn oxide target having an atomic ratio of In:Ga:Zn=1:3:2. As a deposition gas, a gas in which argon and oxygen were mixed so that the volume of oxygen was 33% was used. The pressure in the deposition was adjusted to 0.4 Pa with B-A gauge BRG-1B manufactured by CANON ANELVA CORPORATION. Deposition power of 0.5 kW was used with a DC power source. The distance between the substrate and the target was set to 60 mm, and the substrate temperature was set to 200° C.

Under the condition 2, a gallium oxide film was formed by a sputtering method using a gallium oxide target. As a deposition gas, a gas in which argon and oxygen were mixed so that the volume of oxygen was 33% was used. The pressure in the deposition was adjusted to 0.4 Pa with Miniature Gauge MG-2L manufactured by CANON ANELVA CORPORATION. Deposition power of 0.4 kW was used with an RF power source. The distance between the substrate and the target was set to 130 mm, and the substrate temperature was set to 200° C.

The silicon oxynitride film was formed by a PECVD method. As the deposition gas, a gas containing monosilane and nitrous oxide at a volume ratio of 1:800 was used. The pressure in the film formation was adjusted to 200 Pa. The deposition power was set to 150 W with a 60 MHz high-frequency power source. The substrate temperature was set to 350° C.

In the oxygen ($O_2$) plasma treatment, oxygen with a flow rate of 800 sccm was supplied to a reaction chamber of a PECVD apparatus by a PECVD method. The pressure during the supply was adjusted to 200 Pa. The deposition power was set to 150 W with a 60 MHz high-frequency power source. The substrate temperature was set to 350° C. As for the plasma treatment time, four conditions (0 seconds (no plasma treatment), 90 seconds, 180 seconds, and 300 seconds) were employed for the sample A, and three conditions (0 seconds (no plasma treatment), 90 seconds, and 180 seconds) were employed for the sample B.

Figure 50:
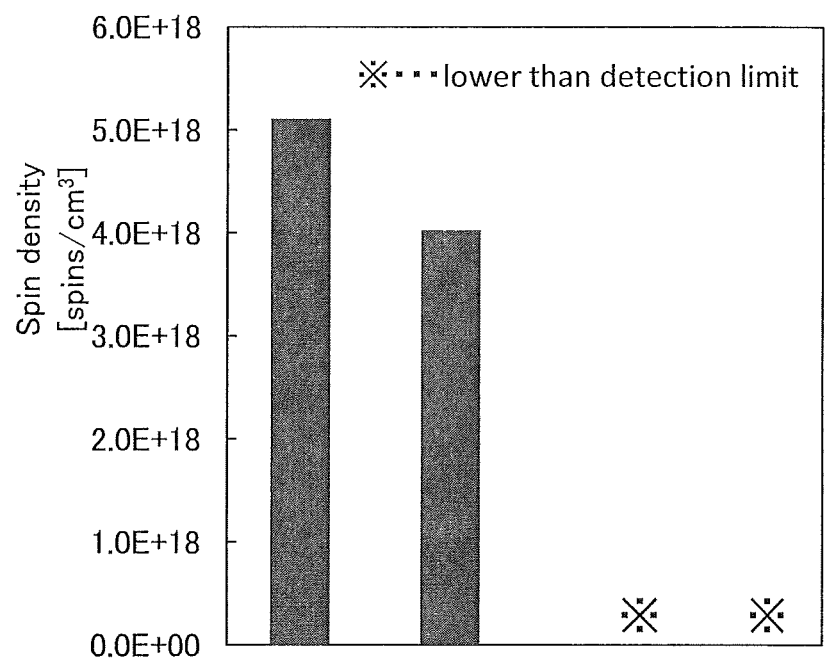
FIG. 50 shows spin densities evaluated by electron spin resonance.

Next, the samples A were evaluated by ESR. The samples were placed so that a surface of the In—Ga—Zn oxide is perpendicular to a magnetic field. FIG. 50 shows spin densities of defect levels (attributed to $V_0H$) relating to signals that appear when the g-factor is in the vicinity of 1.93 in the oxide semiconductor film. For evaluation by ESR, an electron spin resonance spectrometer JES-FA300 manufactured by JEOL Ltd. was used.

It was confirmed from FIG. 50 that the spin density of a signal attributed to $V_0H$ in the oxide semiconductor film can be reduced by the plasma treatment and by performing the plasma treatment for 180 seconds or more, the spin density of a signal attributed to $V_0H$ in the oxide semiconductor film became lower than the detection limit (here, $7.4 \times 10^{17}$ spins/$cm^3$).

Figure 51:
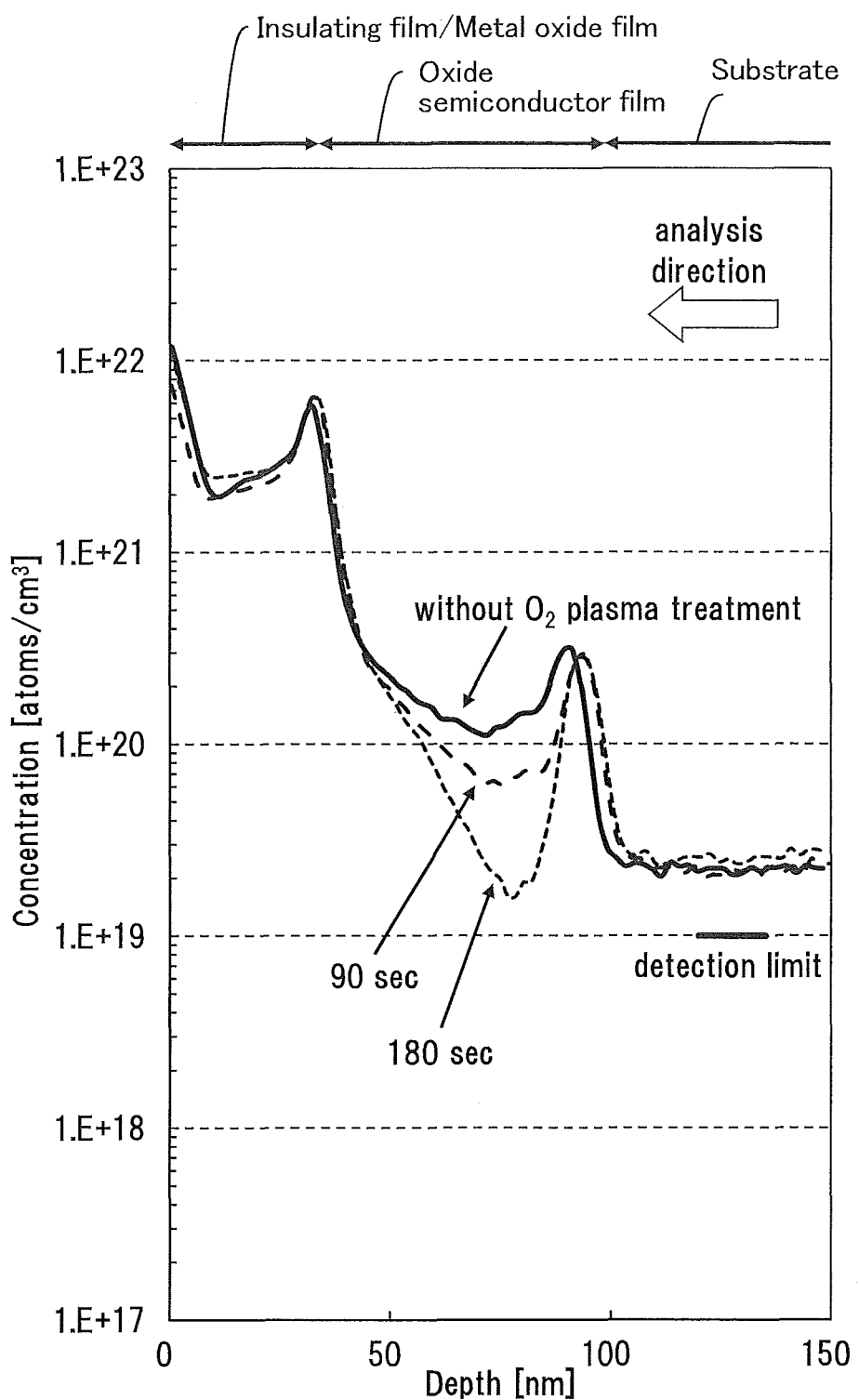
FIG. 51 shows depth profiles of hydrogen concentrations of samples in Example.
Figure 52:
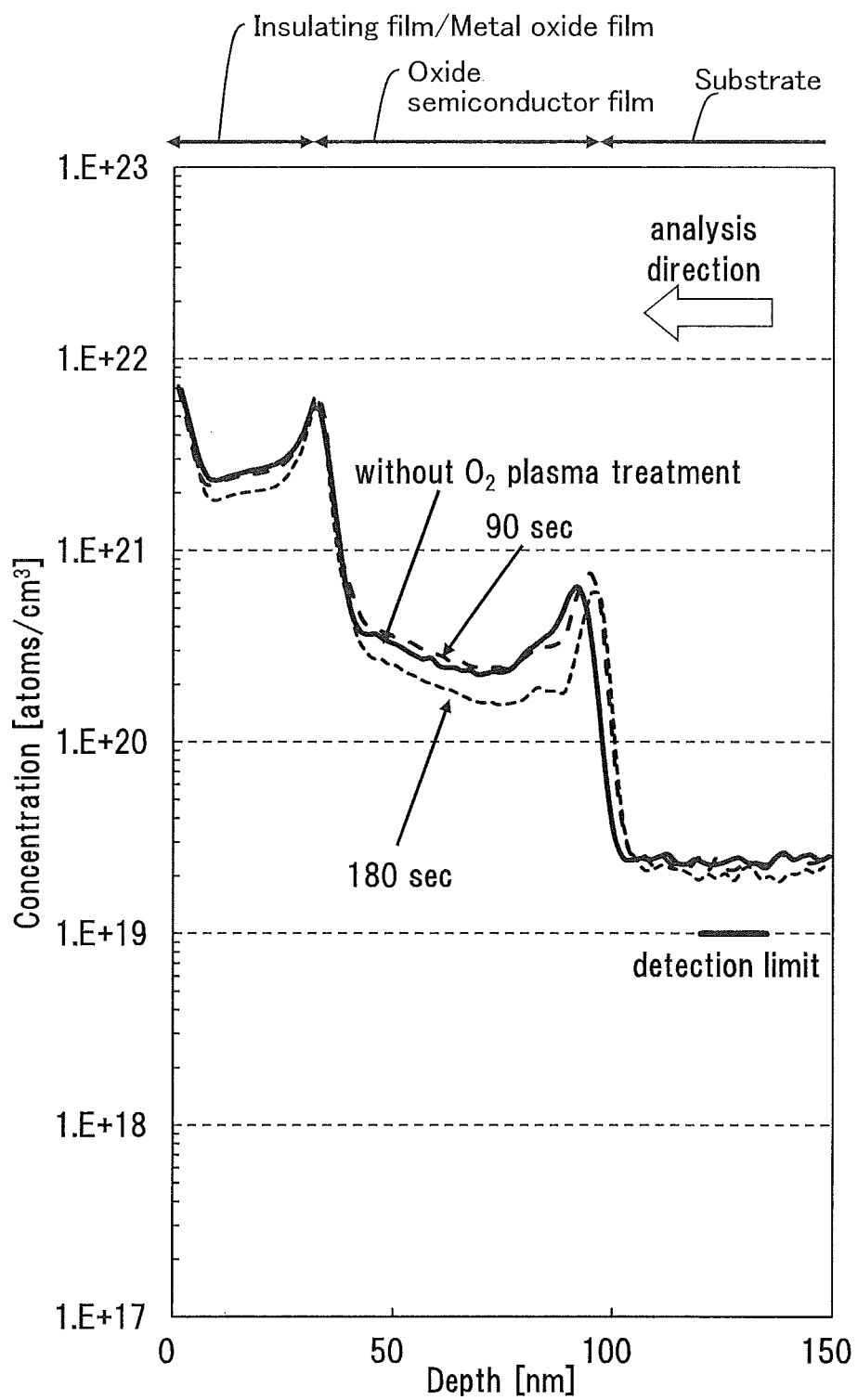
FIG. 52 shows depth profiles of hydrogen concentrations of samples in Example.

The hydrogen concentrations of the samples A in which the oxygen ($O_2$) plasma treatment was performed for 0 seconds (no plasma treatment), 90 seconds, and 180 seconds and the samples B in which the oxygen ($O_2$) plasma treatment was performed for 0 seconds (no plasma treatment), 90 seconds, and 180 seconds were evaluated. A SIMS analysis apparatus was used for the evaluation of the hydrogen concentrations. FIG. 51 shows depth profiles of the hydrogen concentrations of the samples A, and FIG. 52 shows depth profiles of the hydrogen concentrations of the samples B. The hydrogen concentration of the sample in which the plasma treatment was performed for 0 seconds is indicated by a solid line, and the hydrogen concentrations of the other samples are indicated by broken lines.

It was confirmed from FIG. 51 that in the sample A, as the oxygen ($O_2$) plasma treatment time became longer, the hydrogen concentration in a first oxide semiconductor film was able to be reduced. Furthermore, it was confirmed from FIG. 52 that in the sample B, the hydrogen concentration in the first oxide semiconductor film was reduced in the condition where the plasma treatment time was the longest (180 seconds). It was found from these results that by performing oxygen ($O_2$) plasma treatment after the insulating film was formed, the hydrogen concentration in the oxide semiconductor film was able to be reduced. Furthermore, it is indicated that by reducing the hydrogen concentration in the oxide semiconductor film, the spin density of a signal attributed to $V_OH$ can be reduced.

In comparison with the case where gallium oxide is used as the metal oxide, the In—Ga—Zn oxide film formed using an In—Ga—Zn oxide target having an atomic ratio of In:Ga:Zn=1:1:1 transmits hydrogen more easily.

In comparison with the example 1, the hydrogen concentration is reduced more easily in the case where a 10-nm-thick single-layer silicon oxynitride film is formed over the first oxide semiconductor film than the case where a 5-nm-thick second oxide semiconductor film and a 10-nm-thick silicon oxynitride film are stacked over the first oxide semiconductor film. This shows a possibility that the silicon oxynitride film is more likely to transmit hydrogen than the second oxide semiconductor film.

This application is based on Japanese Patent Application serial no. 2014-191293 filed with Japan Patent Office on Sep. 19, 2014, the entire contents of which are hereby incorporated by reference.

What is claimed is:

1. A method for manufacturing a semiconductor device comprising the steps of:
    forming a first oxide semiconductor over a substrate;
    forming a second oxide semiconductor over and in contact with the first oxide semiconductor;
    forming a layer over the second oxide semiconductor;
    performing oxygen plasma treatment after forming the layer;
    removing the layer so as to expose at least part of the second oxide semiconductor after performing the oxygen plasma treatment;
    forming a third oxide semiconductor over and in contact with the second oxide semiconductor;
    forming an insulator over and in contact with the third oxide semiconductor; and
    forming a conductor over the insulator.

2. The method according to claim 1, wherein the layer has a higher hydrogen-transmitting property than at least one of the first oxide semiconductor and the third oxide semiconductor.

3. The method according to claim 1, wherein the layer includes an oxide containing at least one of boron, carbon, fluorine, magnesium, aluminum, silicon, phosphorus, chlorine, argon, titanium, vanadium, chromium, manganese, cobalt, nickel, copper, zinc, gallium, germanium, yttrium, zirconium, niobium, molybdenum, ruthenium, indium, tin, lanthanum, neodymium, hafnium, tantalum, and tungsten.

4. The method according to claim 1,
    wherein the second oxide semiconductor includes indium, an element M, and zinc, and
    wherein the element M is at least one of aluminum, gallium, yttrium, tin, boron, silicon, titanium, iron, nickel, germanium, yttrium, zirconium, molybdenum, lanthanum, cerium, neodymium, hafnium, tantalum, and tungsten.

5. A method for manufacturing an electronic device comprising:
    the method according to claim 1,
    wherein the electronic device includes the semiconductor device, and
    wherein the electronic device includes at least one of a housing, a display portion, a microphone, a speaker, and an operation key.

6. A method for manufacturing a semiconductor device comprising the steps of:
    forming a first oxide semiconductor over a substrate;
    forming a second oxide semiconductor over and in contact with the first oxide semiconductor;
    forming a pair of conductors in contact with a top surface of the second oxide semiconductor;
    forming a layer in contact with a top surface of the pair of conductors and a top surface of the second oxide semiconductor;
    performing oxygen plasma treatment after forming the layer;
    removing the layer so as to expose at least part of the second oxide semiconductor after performing the oxygen plasma treatment;
    forming a third oxide semiconductor in contact with the top surface of the pair of conductors and the top surface of the second oxide semiconductor;
    forming an insulator over and in contact with the third oxide semiconductor; and
    forming a conductor over the insulator.

7. The method according to claim 6, wherein the layer has a higher hydrogen-transmitting property than at least one of the first oxide semiconductor and the third oxide semiconductor.

8. The method according to claim 6, wherein the layer includes an oxide containing at least one of boron, carbon, fluorine, magnesium, aluminum, silicon, phosphorus, chlorine, argon, titanium, vanadium, chromium, manganese, cobalt, nickel, copper, zinc, gallium, germanium, yttrium, zirconium, niobium, molybdenum, ruthenium, indium, tin, lanthanum, neodymium, hafnium, tantalum, and tungsten.

9. The method according to claim 6,
    wherein the second oxide semiconductor includes indium, an element M, and zinc, and
    wherein the element M is at least one of aluminum, gallium, yttrium, tin, boron, silicon, titanium, iron, nickel, germanium, yttrium, zirconium, molybdenum, lanthanum, cerium, neodymium, hafnium, tantalum, and tungsten.

10. A method for manufacturing an electronic device comprising:
    the method according to claim 6,
    wherein the electronic device includes the semiconductor device, and
    wherein the electronic device includes at least one of a housing, a display portion, a microphone, a speaker, and an operation key.

11. A method for manufacturing a semiconductor device comprising the steps of:
   forming a first oxide semiconductor over a substrate;
   forming a second oxide semiconductor over and in contact with the first oxide semiconductor;
   forming a layer in contact with at least part of a top surface of the second oxide semiconductor;
   performing oxygen plasma treatment after forming the layer;
   removing the layer so as to expose at least part of the second oxide semiconductor after performing the oxygen plasma treatment;
   forming a pair of conductors in contact with at least part of the top surface of the second oxide semiconductor;
   forming a third oxide semiconductor in contact with a top surface of the pair of conductors and the top surface of the second oxide semiconductor;
   forming an insulator over and in contact with the third oxide semiconductor; and
   forming a conductor over the insulator.

12. The method according to claim 11, wherein the layer has a higher hydrogen-transmitting property than at least one of the first oxide semiconductor and the third oxide semiconductor.

13. The method according to claim 11, wherein the layer includes an oxide containing at least one of boron, carbon, fluorine, magnesium, aluminum, silicon, phosphorus, chlorine, argon, titanium, vanadium, chromium, manganese, cobalt, nickel, copper, zinc, gallium, germanium, yttrium, zirconium, niobium, molybdenum, ruthenium, indium, tin, lanthanum, neodymium, hafnium, tantalum, and tungsten.

14. The method according to claim 11,
   wherein the second oxide semiconductor includes indium, an element M, and zinc, and
   wherein the element M is at least one of aluminum, gallium, yttrium, tin, boron, silicon, titanium, iron, nickel, germanium, yttrium, zirconium, molybdenum, lanthanum, cerium, neodymium, hafnium, tantalum, and tungsten.

15. A method for manufacturing an electronic device comprising:
   the method according to claim 11,
   wherein the electronic device includes the semiconductor device, and
   wherein the electronic device includes at least one of a housing, a display portion, a microphone, a speaker, and an operation key.

* * * * *